(12) United States Patent
Chou et al.

(10) Patent No.: US 8,198,729 B2
(45) Date of Patent: Jun. 12, 2012

(54) CONNECTION BETWEEN A SEMICONDUCTOR CHIP AND A CIRCUIT COMPONENT WITH A LARGE CONTACT AREA

(75) Inventors: Chiu-Ming Chou, Kao-hsiung (TW); Chien-Kang Chou, Tainan Hsien (TW); Mou-Shiung Lin, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 0 days.

(21) Appl. No.: 11/183,648

(22) Filed: Jul. 18, 2005

(65) Prior Publication Data
US 2006/0012041 A1    Jan. 19, 2006

Related U.S. Application Data

(63) Continuation-in-part of application No. 11/157,186, filed on Jun. 17, 2005, now Pat. No. 8,067,837.

(60) Provisional application No. 60/588,595, filed on Jul. 16, 2004.

(30) Foreign Application Priority Data

Sep. 20, 2004 (TW) .................................. 93128389
Oct. 18, 2004 (TW) .................................. 93131516

(51) Int. Cl.
*H01L 23/48* (2006.01)
(52) U.S. Cl. ......... 257/758; 257/734; 257/777; 257/698
(58) Field of Classification Search .................. 257/734, 257/737–738, 780, 777, 758
See application file for complete search history.

(56) References Cited

U.S. PATENT DOCUMENTS

| | | | |
|---|---|---|---|
| 5,656,858 A * | 8/1997 | Kondo et al. | 257/737 |
| 5,729,896 A * | 3/1998 | Dalal et al. | 29/840 |
| 5,825,080 A * | 10/1998 | Imaoka et al. | 257/659 |
| 5,969,424 A * | 10/1999 | Matsuki et al. | 257/768 |
| 6,022,792 A | 2/2000 | Ishii et al. | |
| 6,107,180 A | 8/2000 | Munroe et al. | |
| 6,181,569 B1 | 1/2001 | Chakravorty | |
| 6,218,302 B1 * | 4/2001 | Braeckelmann et al. | 438/687 |
| 6,251,501 B1 | 6/2001 | Higdon et al. | |
| 6,287,893 B1 | 9/2001 | Elenius et al. | |
| 6,300,250 B1 | 10/2001 | Tsai | |

(Continued)

FOREIGN PATENT DOCUMENTS

JP  02213147  8/1990

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Wael Fahmy
*Assistant Examiner* — Sarah K Salerno
(74) *Attorney, Agent, or Firm* — McDermott Will & Emery LLP

(57) ABSTRACT

A semiconductor chip or wafer includes a passivation layer, a pad and a bump. The pad is exposed by an opening in the passivation layer. The bump is connected to the pad, wherein the area of the connection between the pad and the bump is larger than 30,000 μm².

29 Claims, 64 Drawing Sheets

U.S. PATENT DOCUMENTS

| | | | |
|---|---|---|---|
| 6,323,426 B1* | 11/2001 | Hoshizaki et al. | 174/70 R |
| 6,375,062 B1 | 4/2002 | Higdon et al. | |
| 6,380,061 B1 | 4/2002 | Kobayashi et al. | |
| 6,605,528 B1* | 8/2003 | Lin et al. | 438/618 |
| 6,613,663 B2 | 9/2003 | Furuya | |
| 6,642,136 B1 | 11/2003 | Lee et al. | |
| 7,405,149 B1* | 7/2008 | Lin et al. | 438/622 |
| 2001/0026954 A1 | 10/2001 | Takao | |
| 2002/0079584 A1* | 6/2002 | Matsunaga | 257/758 |
| 2002/0127836 A1* | 9/2002 | Lin et al. | 438/612 |
| 2003/0111711 A1* | 6/2003 | Lin et al. | 257/635 |
| 2003/0127730 A1 | 7/2003 | Weng | |
| 2003/0133055 A1* | 7/2003 | Um et al. | 349/43 |
| 2004/0040855 A1 | 3/2004 | Batinovich | |
| 2004/0070086 A1* | 4/2004 | Lee et al. | 257/784 |

FOREIGN PATENT DOCUMENTS

| | | |
|---|---|---|
| JP | 10107064 | 4/1998 |
| JP | 11274200 | 10/1999 |
| JP | 11354579 | 12/1999 |
| JP | 2000-036515 | 2/2000 |
| JP | 2003-031727 | 1/2003 |
| JP | 2003-229451 | 8/2003 |
| JP | 2004-193301 | 7/2004 |
| TW | 419765 | 1/2001 |
| TW | 483045 | 4/2002 |
| TW | 490803 | 6/2002 |
| TW | 498529 | 8/2002 |
| TW | 506025 | 10/2002 |
| TW | 511243 | 11/2002 |
| TW | 515016 | 12/2002 |
| TW | 517334 | 1/2003 |
| TW | 518700 | 1/2003 |
| TW | 519707 | 2/2003 |
| TW | 584950 | 4/2004 |
| WO | WO8701509 | 3/1987 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Wright, P.; "Integrated Front-End Modules for Cell Phones"; 2005 IEEE Ultrasonics Symposium; pp. 564-572.

\* cited by examiner

CONNECTION BETWEEN A SEMICONDUCTOR CHIP AND A CIRCUIT COMPONENT WITH A LARGE CONTACT AREA

This application claims priority to U.S. Provisional Patent Application Ser. No. 60/588,595, filed on Jul. 16, 2004, which is herein incorporated by reference in its entirety. This application is a continuation-in-part of application Ser. No. 11/157,186, filed on Jun. 17, 2005, now U.S. Pat. No. 8,067,837, which is herein incorporated by reference in its entirety.

BACKGROUND OF THE INVENTION

1. Field of the Invention

This invention relates to a chip package and a related process. More particularly, this invention relates to a chip package with high electrical performance and the related chip package process.

2. Description of the Related Art

Due to the informaction product technological advances, it is no longer difficult to provide the fast access to information that consumers demand. With the evolution of the information industry, the latest generation of IC chips has, overall, a greater number of functions than before. Thanks to improvements in the semi-conductor technology, improvements in the mass production of copper manufacturing procedures and to innovate circuitry designs, the majority of signal transmissions can be made within a single IC chip and the routing of the signal trace can be reduced. Therefore, chips can run with better performance.

After forming a chip, a bump or a wirebond wire can be bonded to the chip to connect the chip to a substrate. However, both the bump and the wirebond wire have a small cross-sectional area, which is adverse against electrical properties.

SUMMARY OF THE INVENTION

The objective of the invention is to provide a chip package with a circuit line or bump that can be connected to an large area of a pad of a semiconductor chip or that can be connected to an large area of a pad of a circuitry component.

In order to reach the objective, the present invention provides a first aspect where a semiconductor chip or wafer including a passivation layer, a pad and a bump. The pad is exposed by an opening in the passivation layer. The bump is connected to the pad, wherein the area of the connection between the pad and the bump is larger than 30,000 $\mu m^2$.

In the first aspect, the area of the connection between the pad and the bump may alternatively be larger than 30,000 $\mu m^2$ or 150,000 $\mu m^2$. The bump may comprise a metal layer having a thickness of between 2 μm and 30 μm and comprising gold with greater than 90 weight percent. Alternatively, the bump may comprise a metal layer having a thickness of greater than 10 μm and comprising a solder material.

In order to reach the objective, the present invention provides a second aspect where a chip package comprises a semiconductor chip, a circuitry component and a bump. The circuitry component comprises a contact point. The bump is between the semiconductor chip and the circuitry component and connected to the contact point, wherein the projection profile of the bump projecting to the contact point has an area of larger than 30,000 $\mu m^2$.

In the second aspect, the projection profile of the bump projecting to the contact point may alternatively have an area of larger than 80,000 $\mu m^2$, or larger than 150,000 $\mu m^2$. The bump may comprise a metal layer having a thickness of between 2 μm and 30 μm and comprising gold with greater than 90 weight percent.

In order to reach the objective, the present invention provides a second aspect where a chip package comprising a semiconductor chip, a circuitry component and a bump. The circuitry component comprises a contact point. The bump is between the semiconductor chip and the circuitry component and connected to the contact point, wherein the area of the connection between the contact point and the bump is larger than 30,000 μm2.

In the first aspect, the area of the connection between the pad and the bump may alternatively be larger than 30,000 μm2 or 150,000 μm2. The bump may comprise a metal layer having a thickness of between 2 μm and 30 μm and comprising gold with greater than 90 weight percent. Alternatively, the bump may comprise a metal layer having a thickness of greater than 110 μm and comprising a solder material.

The accompanying drawings are included to provide a further understanding of the invention, and are incorporated as a part of this specification. The drawings illustrate the embodiments of the invention and, together with the description, serve to explain the principles of the invention.

DESCRIPTION OF THE PREFERRED EMBODIMENTS

To simplify the illustration, the same reference numbers in all drawings represents the same components, and the illustrated content of the components with the same reference numbers once mentioned may be omitted in the latter contents.

First Embodiment

In the first embodiment, the semiconductor chip comprises a thick metal circuit line at the topmost of the semiconductor chip. The thick metal circuit line of the semiconductor chip can be connected to and in touch with the circuit line of the substrate. To match up the drawings, several possible cases are illustrated as follow:

1. Used for Intra-Chip Signal Transmission

Figure 1:
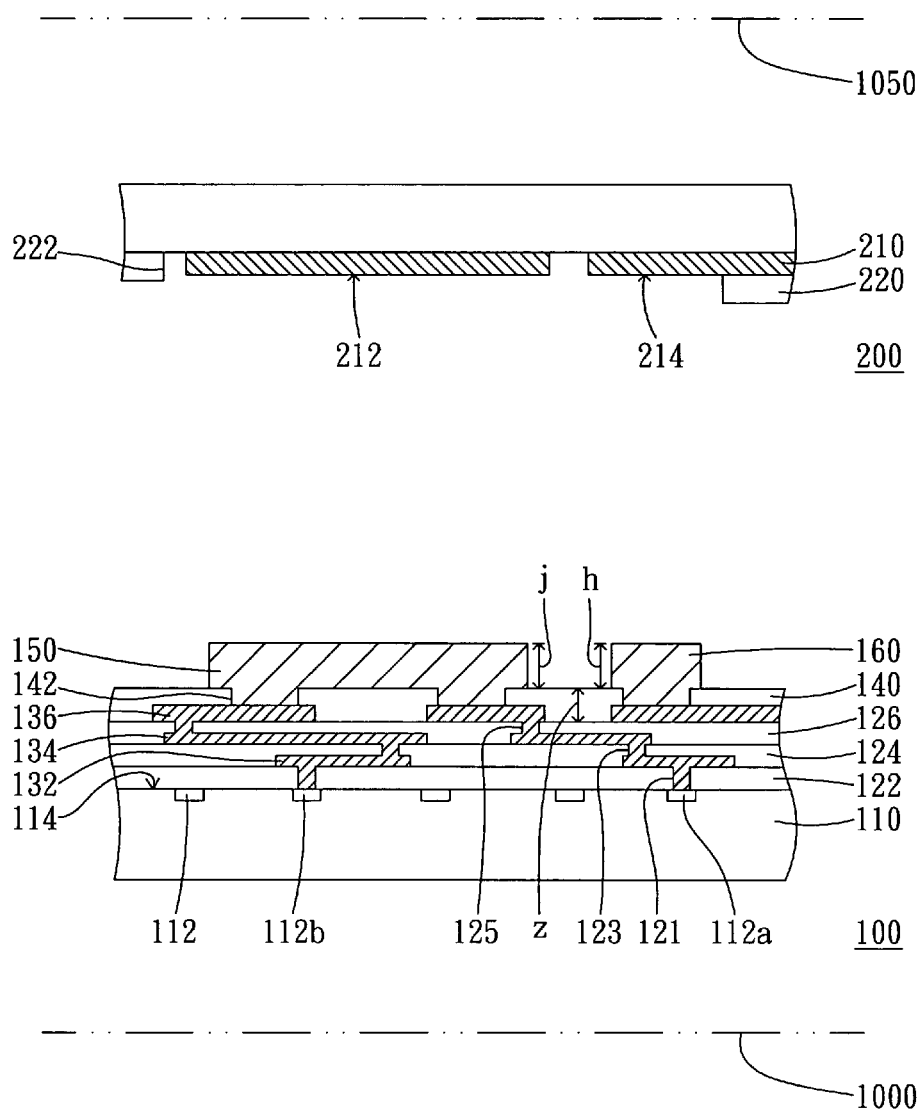
FIG. 1 is a schematic cross-sectional representation showing a chip package before connecting a semiconductor chip and a substrate according to the first embodiment.

FIG. 1 is a schematic cross-sectional drawing showing a semiconductor chip and a substrate before connecting them according to a first embodiment. The cross-section representation of the thick metal circuit line 150 of the semiconductor chip 100 comes from perpendicularly cutting in the direction in which the thick metal circuit line 150 extends. The cross-section representation of the metal circuit line 212 of the substrate 200 comes from perpendicularly cutting in the direction in which the metal circuit line 212 of the substrate 200 extends. The semiconductor chip comprises a semiconductor substrate 110, a plurality of the thin film dielectric layers 122, 124, 126, a plurality of the thin film fine line metal layer 132, 134, 136 and a passivation layer 140.

The semiconductor substrate 110 comprises a plurality of electronic devices 112 formed in or on the semiconductor substrate 110. The semiconductor substrate 110, for example, is a silicon substrate or AsGa substrate. A plurality of electronic devices 112, such as passive devices, transistors or MOS devices, are formed in or on the semiconductor substrate 110 by doping the dopant with either with penta-valence or tri-valence ions, for example, boron ions or phosphorous ions.

The thin film dielectric layers 122, 124 and 126 are formed over an active surface 114 of the semiconductor substrate 100. The thin film dielectric layer is composed of silicon oxide, silicon nitride, or oxynitride, for example. The thin film fine line metal layers 132, 134 and 136 are respectively formed on one of the thin film dielectric layers 122, 124 and 126. The material of the thin film fine line metal layers 132, 134 and 136 is, for example, aluminum, copper, silicon and et cetera. The thin film dielectric layers 122, 124 and 126 comprise a plurality of via holes 121, 123, 125. The thin film fine line metal layers 132, 134 and 136 are connected to each other and to the electronic devices 112 via the via holes 121, 123, 125 in the thin film dielectric layers 122, 124 and 126.

The passivation layer 140 is formed over the thin film dielectric layers 122, 124 and 126 and the thin film fine line metal layers 132, 134 and 136. The passivation layer 140 has a preferred thickness thicker than about 0.3 μm. The passivation layer 140 is composed of the material such as, a silicon-oxide layer, a silicon-nitride layer, a phosphosilicate glass (PSG) layer, or a composite structure comprising the above-mentioned layers. The passivation layer 140 comprises one or more insulating layers, such as silicon-nitride layer or silicon-oxide layer, formed by CVD processes. In a case, a silicon-nitride layer 140a with a thickness of between 0.2 and 1.2 μm is formed over a silicon-oxide layer 140b with a thickness of between 0.1 and 0.8 μm, as shown in FIG. 1C. Generally, the passivation layer 140 comprises a topmost silicon-nitride layer or a topmost silicon-nitride layer in the finished chip structure. The passivation layer 140 comprises a topmost CVD insulating layer in the finished chip structure. A plurality of openings 142 in the passivation layer 140 expose the topmost thin film fine line metal layer 136.

The thick metal circuit layer 150 is formed over the passivation layer 140 and connected to the thin film fine line metal layer 136 through the openings 142 in the passivation 140. The thickness of the thick metal circuit line 150 is thicker than the thickness of the thin film fine line metal layer 132, 134, and 136. The bump is substantially aimed at the opening 142 in the passivation layer and connected to the thin film fine line metal layer 136. The thick metal circuit line 150 and the bump 160 can be formed simultaneously under the same process. Thereby, the metal layer structure of the thick metal circuit line is the same with the bump. The thickness j of the thick metal circuit line 150 is substantially the same as the thickness h of the bump 160. The thickness j of the thick metal circuit layer 150 and the thickness h of the bump 160 are, for example, thicker than 1 μm and, preferably, between 2 μm and 30 μm.

The substrate 200 can be a flexible or hard substrate, for example. The hard substrate, such as four-layer, six-layer or eight-layer substrate, can be formed by laminating multiple circuit layers and multiple insulating polymer layers, and then printing solder mask layers on the topmost and bottommost circuit layers. Alternatively, the hard substrate may comprise ceramic dielectric layers. The flexible substrate is formed by one circuit layer and one insulating layer, the circuit layer being formed on the insulating polymer layer. Due to the flexible substrate having an extremely thinner thickness, the flexible substrate has more flexibility than the hard substrate.

As mentioned above, the substrate 200 can be a flexible substrate or a hard substrate. The substrate 200 comprises, for example, a circuit layer 210 and a solder mask layer 220 placed at the top of the substrate 200, the solder mask layer 220 being on the circuit layer 210 and used to protect the circuit layer 210. An opening 222 in the solder mask layer 220 exposes the bonding pad 214.

The thick metal circuit line 150 can extend in any direction or with various shapes at the top of the semiconductor chip 100, such as in a straight direction, or with a curve shape or a discontinuing crooked shape. The circuit line 212 can extend in any direction or with various shapes at the top of the substrate 200, such as in a straight direction, or with a curve shape or a discontinuing crooked shape. The relationship between the thick metal circuit line 150 of the semiconductor chip 100 and the substrate 200 is presented like a specular reflection. Therefore, the thick metal circuit line 150 of the semiconductor chip 100 can be aligned with the circuit line 212 of the substrate 200 in the process for bonding the semiconductor chip 100 and the substrate 200.

Figure 1A:
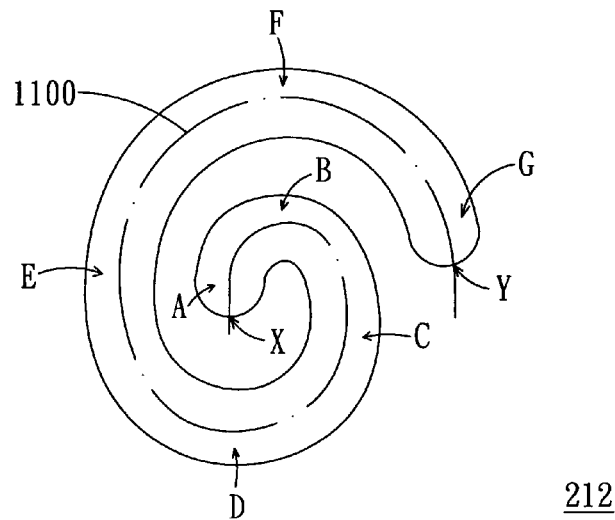
FIG. 1A is a schematic top view showing the projection profile of the circuit line 212 of the substrate 200 shown in FIG. 1 projecting to the plane 1050.
Figure 1B:
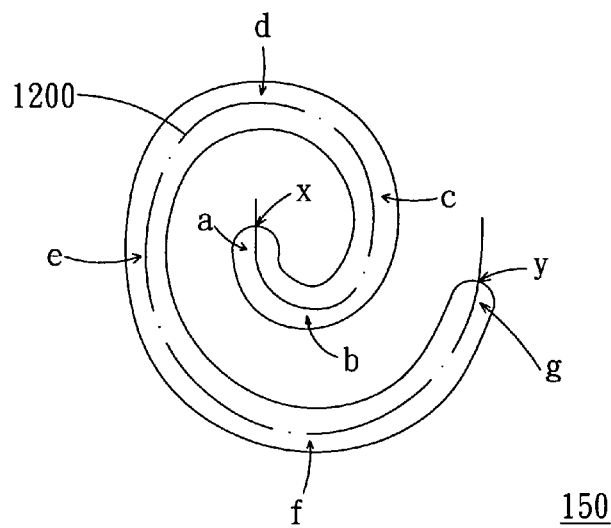
FIG. 1B is a schematic top view showing the projection profile of the thick metal circuit line 150 of the semiconductor chip 100 shown in FIG. 1 projecting to the plane 1000.
Figure 1C:
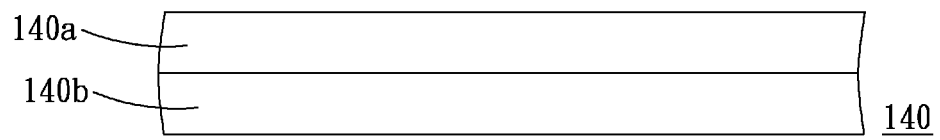
FIG. 1C is a schematic cross-sectional representation of passivation layer 140 shown in FIG. 1, comprising stacked layers of silicon oxide and silicon nitride.

In one embodiment, the thick metal circuit line 150 of the semiconductor chip 100 and the circuit line 212 of the substrate 200 have a spiral shape, for example, as shown in FIGS. 1A and 1B. The thick metal circuit line 150 of the semiconductor chip 100 and the circuit line 212 of the substrate 200 can be inductor devices, for example. FIG. 1A is a top view showing the circuit line 212 of the substrate 200 projected to the plane 1050. FIG. 1B is a top view showing the thick metal circuit line 150 of the semiconductor chip 100 projected to the plane 1000. Referring to FIGS. 1A and 1B, the relationship between the thick spiral circuit line 150 of the semiconductor chip 100 and the spiral circuit line 212 of the substrate 200 is presented like a specular reflection. The spiral circuit line 212 of the substrate 200 can extend in a path 1100, for example, from the point X of the path 1100 to the point Y of the path 1100. The thick spiral circuit line 150 of the semiconductor chip 100 can extend in a path 1200, for example, from the point x of the path 1200 extended to the point y of the path 1200.

Figure 2:
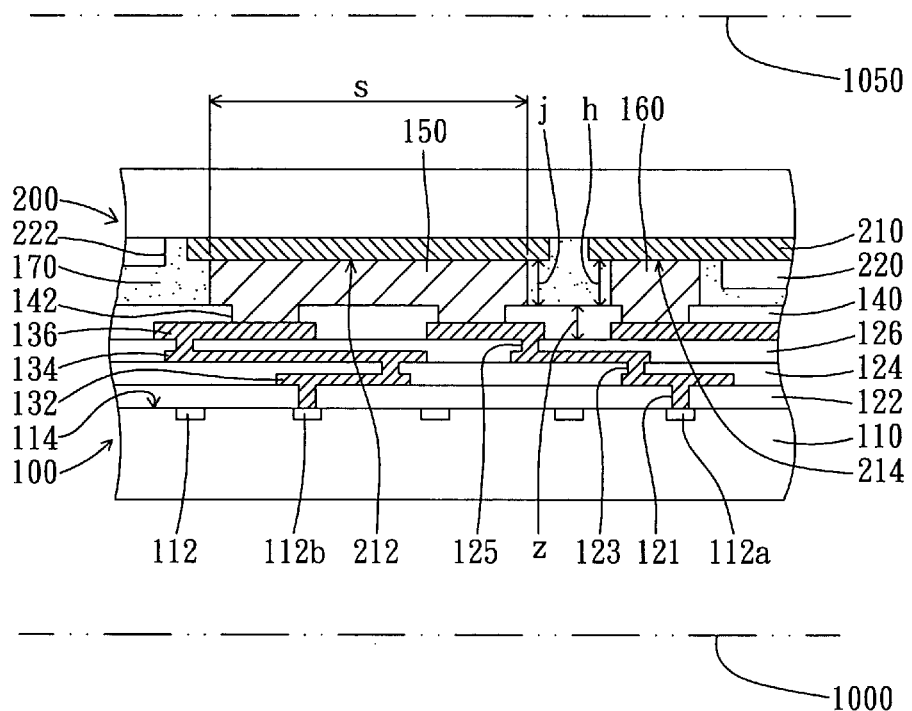
FIGS. 2-15 are schematic cross-sectional representations showing chip packages according to the first embodiment.

FIG. 2 is a schematic cross-sectional drawing showing a chip package after bonding the semiconductor chip 100 and the substrate 200 shown in FIG. 1. Referring to FIG. 2, the thick metal circuit line 150 of the semiconductor chip 100 can be connected to and in touch with the circuit line 212 of the substrate 200. The bump 160 of the semiconductor chip 100 can be connected to and in touch with the bonding pad 214 of the substrate 214. Next, a polymer layer 170 is filled into a gap between the semiconductor chip 100 and the substrate 200 and encloses the thick metal circuit line 150 and the bump 160. The plane 1000 is substantially parallel to an active surface 114 of the semiconductor substrate 110. The projection profile of the connection between the thick metal circuit line 150 and the circuit line 212 projecting to the plane 1000 has an extension length s of larger than 500 μm, 800 μm, or 1200 μm, for example. The projection profile of the connection between the thick metal circuit layer 150 and the circuit line 212 projecting to the plane 1000 has an area of larger than 30,000 μm², 80,000 μm², or 150,000 μm², for example.

Figure 2A:
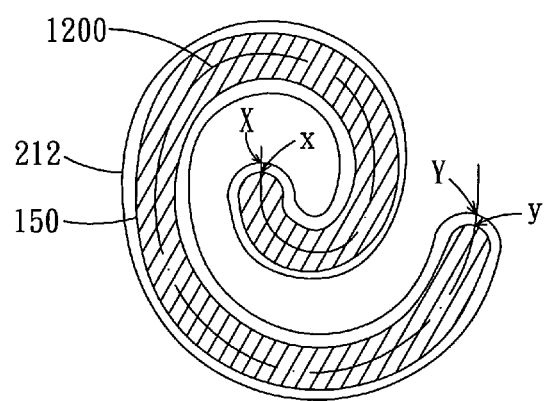
FIG. 2A is a schematic top view showing the projection of the connection between the thick metal circuit line 150 and the circuit line 212 FIGS. 1A and 1B projecting to the plane 1000.

Referring to FIGS. 1A and 1B, the regions A, B, C, D, E, F and G of the spiral circuit line 212 of the substrate 200 can be respectively connected to and in touch with the regions a, b, c, d, e, f and g of the thick spiral metal circuit line 150 of the semiconductor chip 100 during bonding the semiconductor chip 100 and the substrate 200. FIG. 2A is a top view showing the projection profile of the connection between the thick spiral metal circuit line 150 and the spiral circuit line 212 projecting to the plane 1000. Shown the enclosure with oblique lines in FIG. 2A, the projection profile of the connection between the thick spiral metal circuit line 150 and the spiral circuit line 212 projecting to the plane 1000 may have an extension length, which is the length of the path 1200 from point x to point y, and may be larger than 500 μm, 800 μm, or 1200 μm, for example. Shown the enclosure with oblique lines in FIG. 2A, the projection profile of the connection between the thick spiral metal circuit layer 150 and the spiral circuit line 212 projecting to the plane 1000 may have an area of larger than 30,000 μm², 80,000 μm², or 150,000 μm², for example.

Referring to FIG. 2, a signal may be transmitted from one of the electronic devices, such as 112a, to the thick spiral metal circuit line 150 and the spiral circuit line 212 sequentially through the thin film fine line metal layers 132, 134 and 136 and then through the opening 142 in the passivation layer 140. Next, the signal may be transmitted from the thick spiral metal circuit line 150 and the spiral circuit line 212 to the other one of the electronic devices, such as 1112b, through the opening 142 in the passivation layer 140 and then sequentially through the thin film fine line metal layers 136, 134 and 132. The thick metal circuit line 150 of the semiconductor chip 100 and the circuit line 212 of the substrate can be used for signal transmission in the semiconductor chip 100. The signal transmitted from the electrical device 112a to the thick metal circuit line 150 and the circuit line 212 can also be transmitted to the inside of the substrate 200. The thick metal circuit line 150 of the semiconductor chip 100 and the circuit line 212 of the substrate 200 can be used for signal transmission between the semiconductor chip 100 and the substrate 200.

Considering the electrical transmission in the bump 160, the semiconductor chip 100 can also transmit or receive a signal to or from the substrate 200 via the bump 160.

As mentioned above, the thick metal circuit line 150 of the semiconductor chip 100 and the circuit line 212 of the substrate 200 can be used to transmit the signal in a lateral direction and also in a vertical direction between the semiconductor chip 100 and the substrate 200. The thick metal circuit line 150 of the semiconductor chip 100 may have a large area connected to a large area of the circuit line 212 of the substrate 200. Therefore, the chip package can significantly improve its electrical performance and can reduce its noise occurrence.

As for the above-mentioned transmission of the signal, the thick metal circuit line 150 of the semiconductor chip 100 and the circuit line 212 of the substrate 200 are used for intra-chip signal transmission for the semiconductor chip 100 and for signal transmission between the semiconductor chip 100 and the substrate 200. Alternatively, the thick metal circuit line 150 of the semiconductor chip 100 and the circuit line 212 of the substrate 200 can be used only for intra-chip signal transmission for the semiconductor chip 100, but not between the semiconductor chip 100 and the substrate 200. In this situation, the circuit line 212 of the substrate 200 is disconnected from the circuitry in the substrate 200.

In another embodiment, the substrate 200 also can be used to transmit a signal to the circuit line 212 of the substrate 200 and the thick metal circuit line 150. Next, the signal can pass through the opening 142 in the passivation layer 140 of the semiconductor chip 100, and then transmitted to one or more electrical devices, such as 112a and 112b, via the thin film fine line metal layers 136, 134, and 132.

Figure 3:
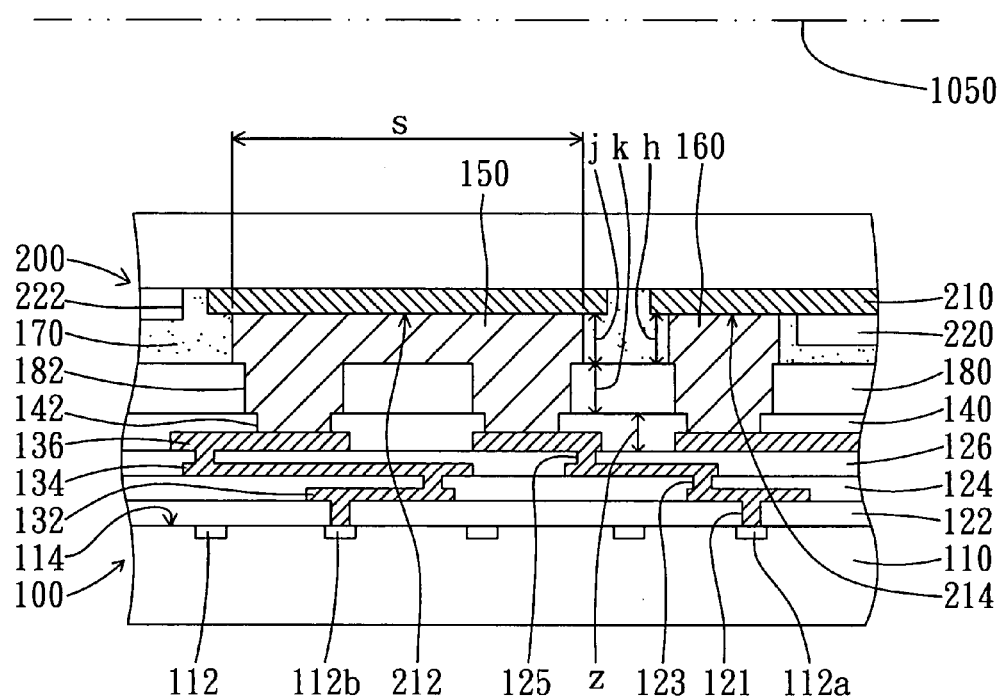

In FIGS. 1 and 2, the thick metal circuit line 150 is formed over and in touch with the passivation layer 140. The thick metal circuit line 150 can also be formed upon the polymer layer 180 over the passivation layer 140, as shown in FIG. 3. FIG. 3 is a schematic cross-section view showing another kind of chip package according to a first embodiment. Referring to FIG. 3, a polymer layer 180 is formed over the passivation layer 140. A plurality of the openings 182 in the polymer layer 180 aim at the openings 142 in the passivation layer 140. The thick metal circuit layer 150 is formed over the polymer layer 180 and connects to the thin film fine line metal layer 136 via the openings 182 in the polymer layer 180 and the openings 142 in the passivation layer 140. The thickness h of the bump 160 bulging over the openings 182 in the polymer layer 180 is substantially the same with the thickness j of the thick metal circuit line 150 formed over the polymer layer 180. The thick metal circuit line 150 has the same metal structure with the bump 160. The thickness h of the bump 160 bulging over the openings 182 in the polymer layer 180 and the thickness j of the thick metal circuit line 150 formed over the polymer layer 180 are, for example, thicker than 1 μm, and, preferably, between 2 μm and 30 μm. The polymer layer 180 can be made of polyimide (PI), benzocyclobutene (BCB), parylene, porous insulating material, or elastomer, for example.

Figure 4:
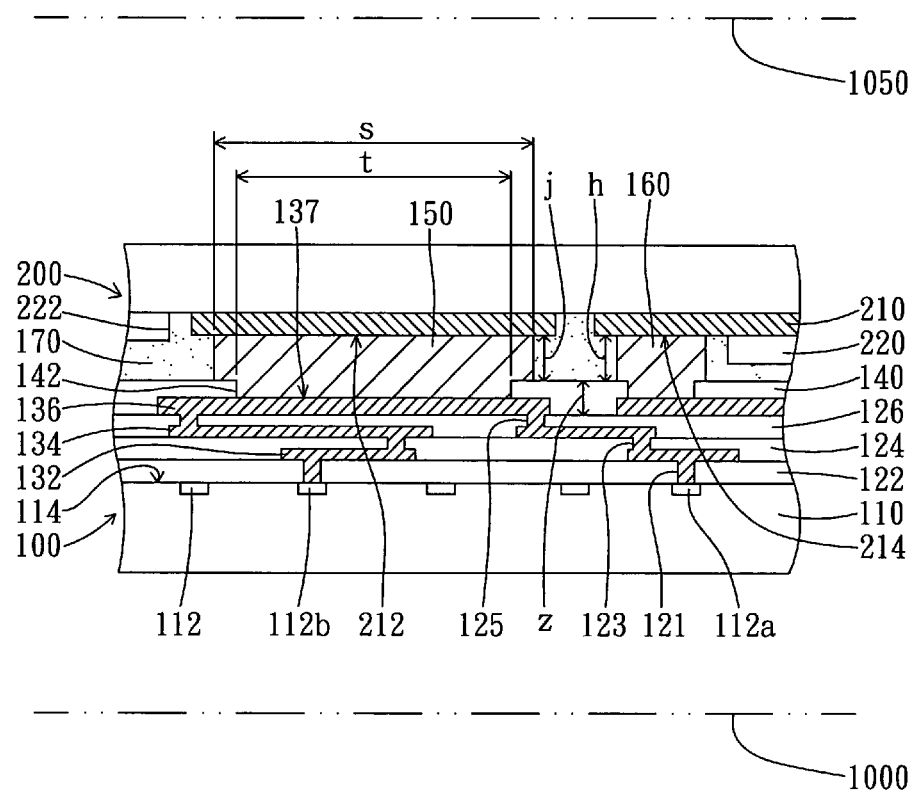
Figure 5:
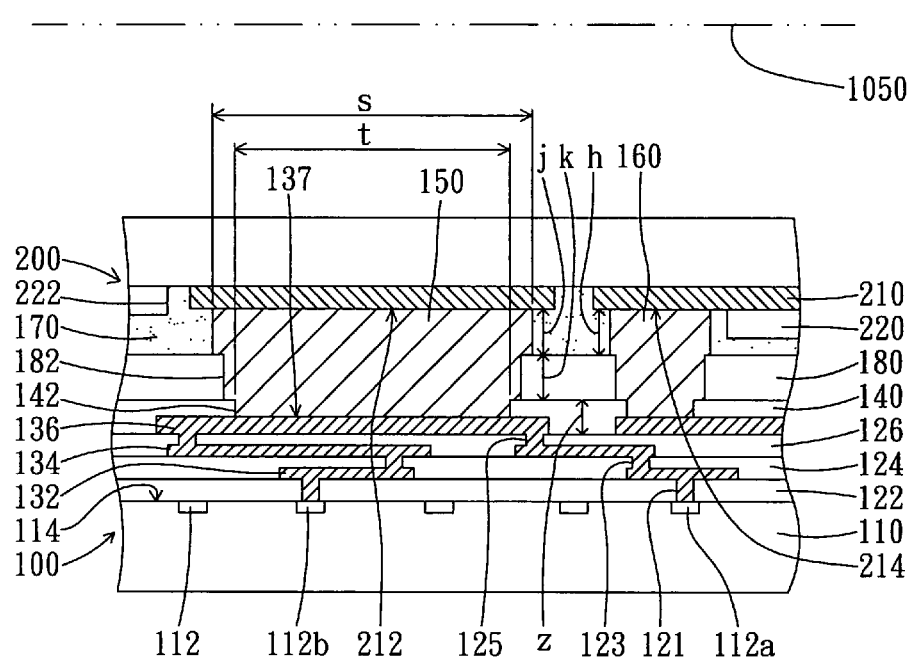

In FIGS. 1-3, the thick metal circuit line 150 is connected to multiple small areas of the topmost thin film fine line metal layer 136 via the small openings 142 in the passivation layer 140. Alternatively, the thick metal circuit line 150 can be connected to a large area of the topmost thin film fine line metal layer 136 via a large opening 142 in the passivation layer 140, as shown in FIGS. 4 and 5. FIGS. 4 and 5 are schematic cross-section representations showing another kind of chip package according to a first embodiment. The topmost thin film fine line metal layer 136 comprises a thin film fine line 137. The large opening 142 in the passivation 140 exposes the thin film fine line 137. The thick metal circuit line 150 connects to an large area of the thin film fine line 137 exposed by the large opening 142 in the passivation layer 140. The details about the connection between the thick metal circuit line 150 and the thin film fine line 137 will be stated as follows.

Referring to FIGS. 4 and 5, the plane 1000 is substantially parallel to an active surface 114 of the semiconductor substrate 110. The ratio of the projection profile of the connection between the thick metal circuit line 150 and the thin film fine line metal line 137 projecting to the plane 1000 to that of the thin film fine line 137 projecting to the plane 1000 is, for example, large than 0.5, or 0.8, or even substantially equal to 1.0. The thin film fine line metal 137 has an area exposed by the large opening 142 in the passivation layer 140 that is, for example, larger than 30,000 $\mu m^2$, or larger than 80,000 $\mu m^2$, or even larger than 150,000 $\mu m^2$. The projection profile of the connection between the thick metal circuit line 150 and the thin film fine line metal layer 136 projecting to the plane 1000 has an extension length t of larger than 500 $\mu m$, or larger than 800 $\mu m$, or even larger than 1,200 $\mu m$, for example.

Figure 5A:
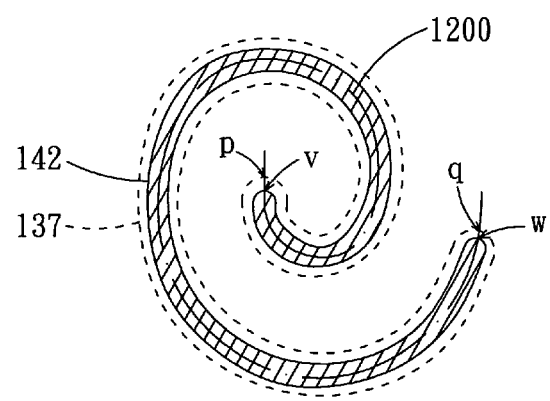

In one embodiment, the thick metal circuit line 150 may have a spiral shape, serving as an inductor, for example, and the thin film fine line 137 may correspondingly have a spiral shape, serving as an inductor, for example, as shown in FIG. 5A. FIG. 5A is a top view showing the projection profile of the connection between the thick spiral metal circuit line 150 and the spiral thin film fine line 137 shown in FIGS. 4 and 5 projected to the plane 1000. The thick metal circuit line and the thin film fine line metal line are pattered like a spiral shape, serving as an inductor device, for example. The thin film fine line 137, used for an inductor device, may extend in the path 1200 from the point p to the point q, for example.

Referring to FIG. 5A, the ratio of the projection profile of the connection between the thick metal circuit line 150 and the thin film fine line metal line 137 projecting to the plane 1000, shown an enclosure with oblique lines in FIG. 5A, to that of the thin film fine line 137 projecting to the plane 1000, shown an enclosure by a dotted line in FIG. 5A, is, for example, large than 0.5, or 0.8, or even substantially equal to 1.0. The thin film fine line metal 137 has an area exposed by the large opening 142 in the passivation layer 140, shown an enclosure with oblique lines in FIG. 5A, that is, for example, larger than 30,000 $\mu m^2$, or larger than 80,000 $\mu m^2$, or even larger than 150,000 $\mu m^2$. The projection profile of the connection between the thick metal circuit line 150 and the thin film fine line metal layer 136 projecting to the plane 1000, shown an enclosure with oblique lines in FIG. 5A, has an extension length, which is the length extending in the path 1200 from point v to point w, of larger than 500 $\mu m$, or larger than 800 $\mu m$, or even larger than 1,200 $\mu m$, for example.

Referring to FIGS. 4 and 5, a signal may be transmitted from one of the electronic devices, such as 112a, to the thin film fine line 137, the thick metal circuit layer 150 and the circuit line 212 sequentially through the thin film fine line metal layers 132 and 134. Next, the signal may be transmitted from the thin film fine line 137, the thick metal circuit layer 150 and the circuit line 212 to the other one of the electronic devices, such as 112b, sequentially through the thin film fine line metal layers 134 and 132. The thin film fine line 137 and the thick metal circuit line 150 of the semiconductor chip 100 and the circuit line 212 of the substrate can be used for intra-chip signal transmission. The signal transmitted from the electrical device 112a to the thin film fine line 137, the thick metal circuit line 150 and the circuit line 212 can also be transmitted to the inside of the substrate 200. The thin film fine line 137 and the thick metal circuit line 150 of the semiconductor chip 100 and the circuit line 212 of the substrate 200 can be used for signal transmission between the semiconductor chip 100 and the substrate 200. Alternatively, a signal may be transmitted from the substrate 200 to the circuit line 212, the thick metal circuit line 150 and the thin film fine line 137. Next, the signal may be transmitted from the circuit line 212, the thick metal circuit line 150 and the thin film fine line 137 to other one or more of the electronic devices, such as 112a and 112b, through the opening 142 in the passivation layer 140 and then sequentially through the thin film fine line metal layers 134 and 132.

Considering the electrical transmission of the bump 160, the semiconductor chip 100 can also transmit or receive a signal to or from the substrate 200 via the bump 160.

As mentioned above, the thin film fine line metal line 137 and the thick metal circuit line 150 of the semiconductor chip 100 and the circuit line 212 of the substrate 200 can be used to transmit the signal in a lateral direction and also in a vertical direction between the semiconductor chip 100 and the substrate 200. The thick metal circuit line 150 of the semiconductor chip 100 may have a large area connected to the circuit line 212 of the substrate 200. The thin film fine line 137 may have a large area connected to the thick metal circuit line 150. Therefore, the above-mentioned chip package can improve its electrical performance and can reduce its noise occurrence.

The difference between FIGS. 4 and 5 is whether the polymer layer is formed over the passivation layer 140. Referring to FIG. 4, there is no polymer layer formed on the passivation layer 140 when the thick metal circuit line 150 and the bump are simultaneously formed on the thin film fine line metal layer 136. The thickness h of the bump 160 is substantially the same with the thickness j of the thick metal circuit line 150. The thick metal circuit line 150 has substantially the same metal structure with the bump 160. The thickness h of the bump 160 and the thickness j of the thick metal circuit line 150 are thicker than 1 $\mu m$ and, preferably, between 2 $\mu m$ and 30 $\mu m$.

Referring to FIG. 5, a patterned polymer layer 180 is formed over the passivation layer 140. The thickness k of the polymer layer is, for example, thicker than 1 m and, preferably, between 2 $\mu m$ and 30 $\mu m$. The polymer layer 180 can be made of polyimide (PI), benzocyclobutene (BCB), parylene, porous dielectric material, or elastomer, for example. The opening 182 in the polymer layer 180 exposes the thin film fine line 137.

After forming the patterned polymer layer 180, the thick metal circuit line 150 and the bump 160 are formed on the thin film fine line metal layer 136. The thickness h of the bump 160 bulging over the opening 182 in the polymer layer 180 is substantially the same as the thickness j of the thick metal circuit line 150 bulging over the opening 182 in the polymer layer 180. The metal structure of the bump 160 is substantially the same as that of the thick metal circuit line 150. The thickness h of the bump 160 bulging over the opening 182 in the polymer layer 180 and the thickness j of the thick metal circuit line 150 bulging over the opening 182 in the polymer layer 180 are, for example, thicker than 1 $\mu m$, and, preferably, between 2 $\mu m$ and 30 $\mu m$.

Referring to FIGS. 4 and 5, an assembly process can be performed after forming the thick metal circuit line 150 and the bump 160. The thick metal circuit line 150 of the semiconductor chip 100 can be connected to and in touch with the circuit line 212 of the substrate 200 and the bump 160 of the semiconductor chip 100 can be connected to and in touch with the bonding pad 214 of the substrate 214. Next, a polymer layer 170 can be filled into the gap between the semiconductor chip 100 and the substrate 200. The polymer layer 170 covers the thick metal circuit line 150 and the bump 160.

2. Used for Signal Transmission Between Semiconductor Chip and Substrate

FIGS. 6-9 are schematic cross-section representations showing another type of the chip packages according to a first embodiment. The semiconductor chip 100 in FIGS. 6-9 is similar to the semiconductor chip 100 in FIGS. 1-5 and the substrate 200 in FIGS. 6-9 is similar to the substrate 200 in FIGS. 1-5. The difference is that the thick metal circuit line 150 of the semiconductor chip 100 and the circuit line 212 of the substrate 200 are only used for signal transmission between the semiconductor chip 100 and the substrate 200, not for intra-chip signal transmission.

Figure 6:
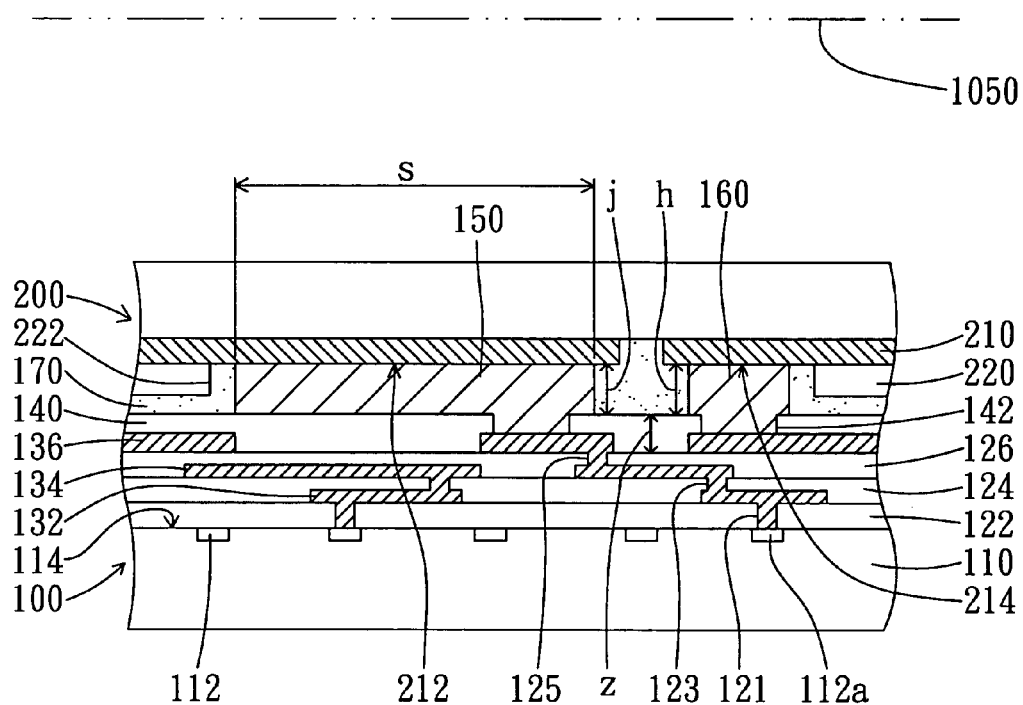
Figure 7:
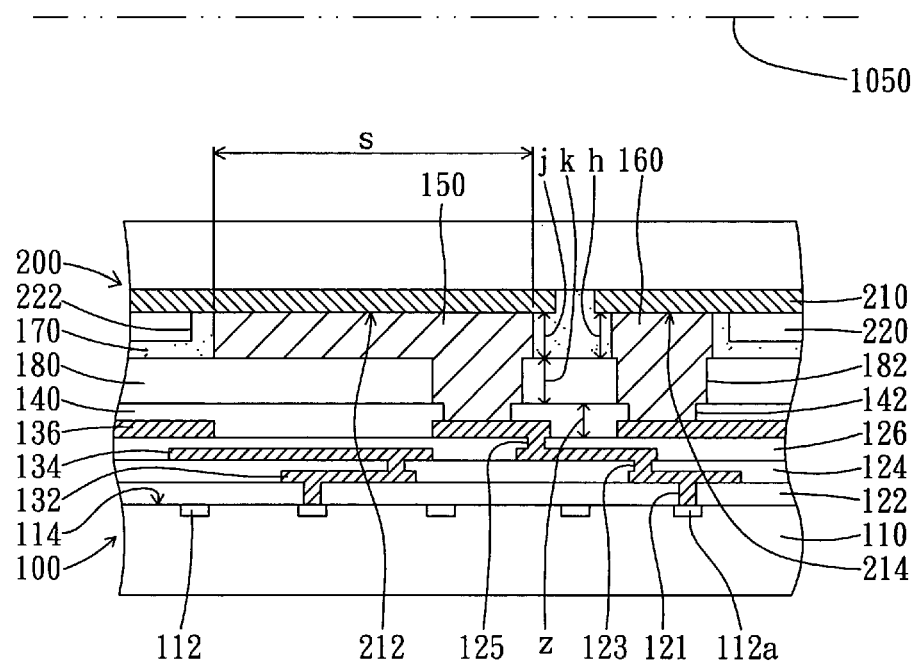

Referring to FIGS. 6-7, a signal may be transmitted from one of the electronic devices, such as 112a, to the thick metal circuit layer 150 and the circuit line 212 sequentially through the thin film fine line metal layers 132, 134 and 136 and then through the opening 142 in the passivation layer 140. Next, the signal may be transmitted from the thick metal circuit layer 150 and the circuit line 212 to the internal circuitry of the substrate 200. The thick metal circuit line 150 of the semiconductor chip 100 and the circuit line 212 of the substrate 200 can be used for signal transmission between the semiconductor chip 100 and the substrate 200.

Considering other application conditions, the substrate 200 can also transmit a signal to the circuit line 212 of the substrate 200 and the thick metal circuit line 150 of the semiconductor chip 100. Next, the signal can be transmitted to one of the electrical device, such as 112a, through the opening 142 in the passivation layer 140, and then sequentially through the thin film fine line metal layers 136, 134, and 132.

Figure 8:
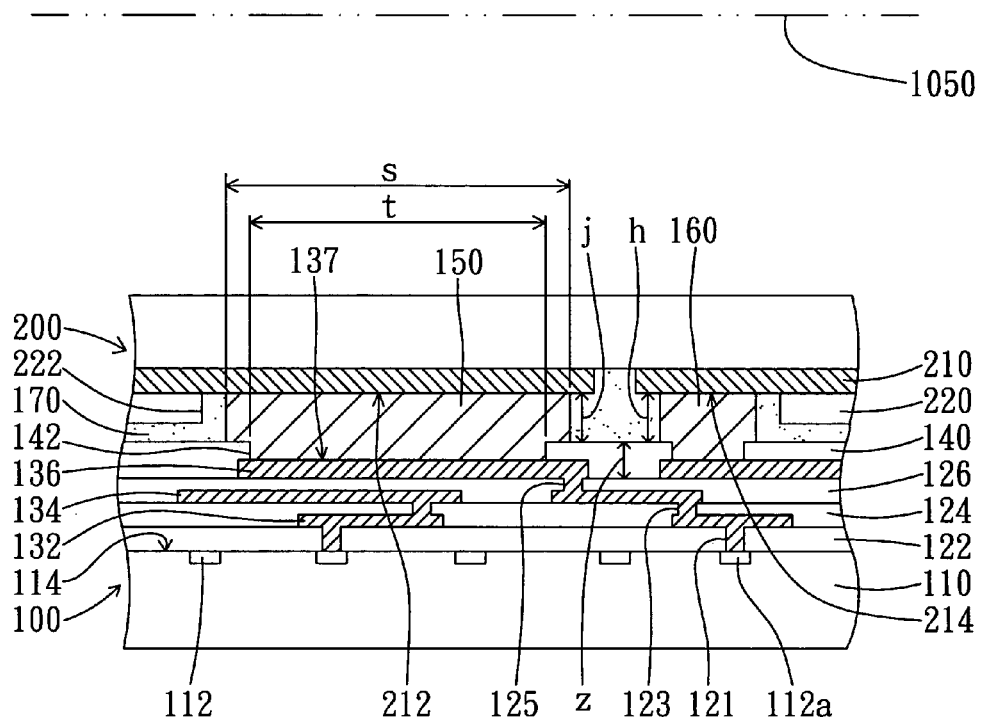
Figure 9:
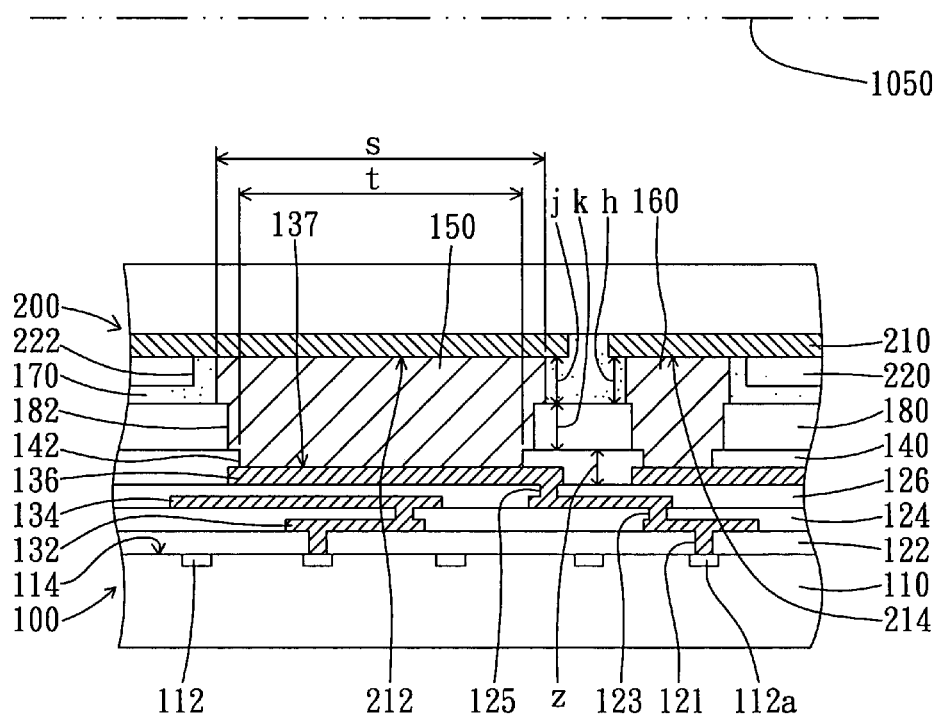
Figure 10:
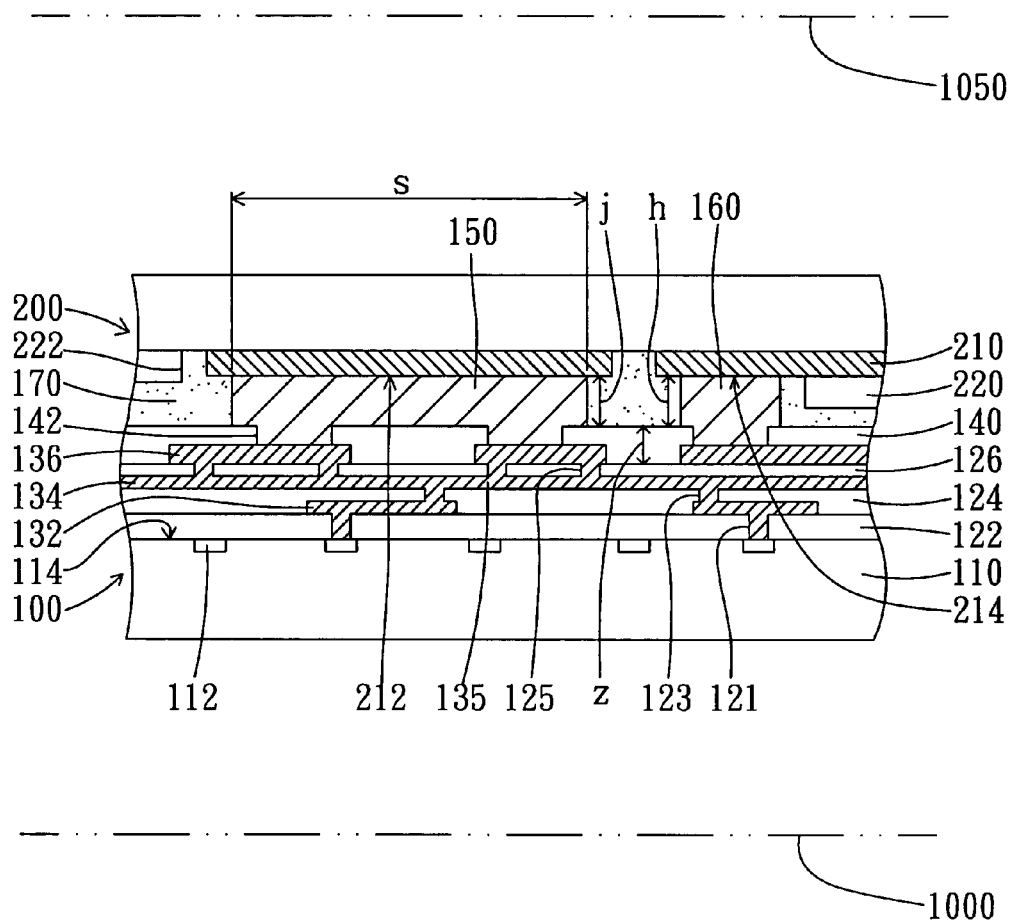
Figure 11:
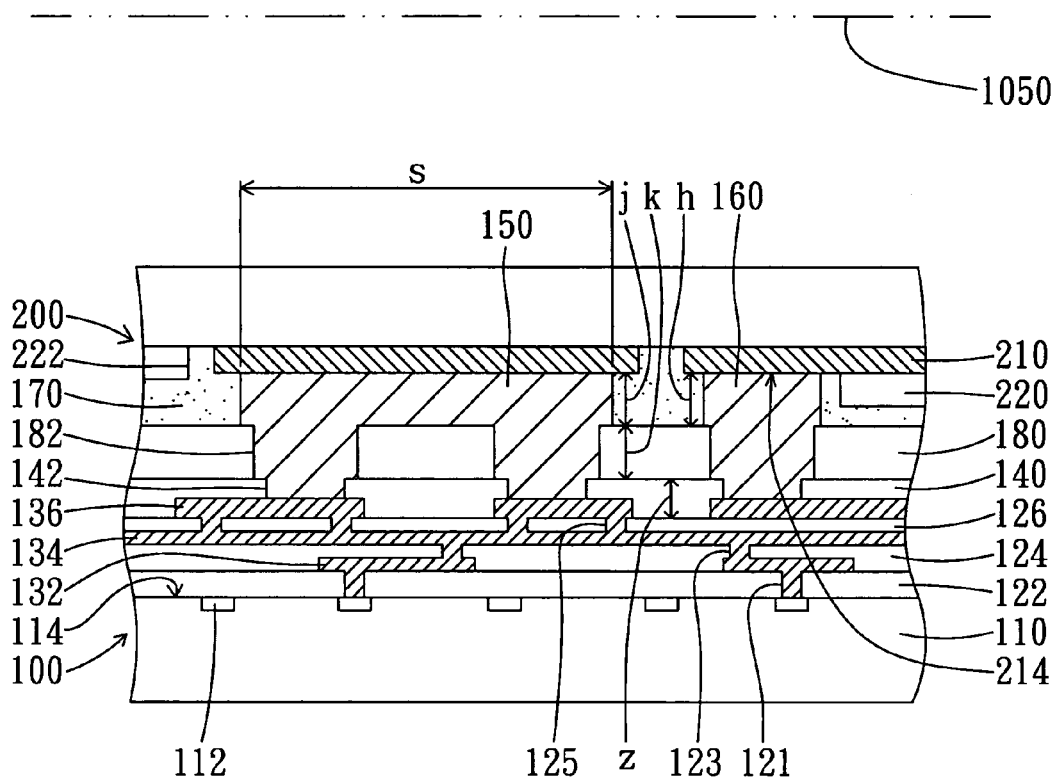

Referring to FIGS. 8 and 9, a signal may be transmitted from one of the electronic devices, such as 112a, to the thin film fine line 137, the thick metal circuit layer 150 and the circuit line 212 sequentially through the thin film fine line metal layers 132 and 134. Next, the signal may be transmitted from the thin film fine line 137, the thick metal circuit layer 150 and the circuit line 212 to the internal circuitry of the substrate 200. The thin film fine line 137, the thick metal circuit line 150 of the semiconductor chip 100 and the circuit line 212 of the substrate 200 can be used for signal transmission between the semiconductor chip 100 and the substrate 200.

In other application conditions, the substrate 200 also can transmit a signal to the circuit line 212, the thick metal circuit line 150 and the thin film fine line 137. Next, the signal can be transmitted to at least one electrical device, such as 112a, sequentially through the thin film fine line metal layers 134 and 132.

Referring to FIGS. 6-9, considering the electrical transmission of the bump 160, the semiconductor chip 100 can also transmit or receive a signal to or from the substrate 200 via the bump 160.

As mentioned above, the thick metal circuit line 150 of the semiconductor chip 100 and the circuit line 212 of the substrate 200 can be used to transmit the signal in a lateral direction and also in a vertical direction between the semiconductor chip 100 and the substrate 200. The thick metal circuit line 150 of the semiconductor chip 100 may have a large area connected to a large area of the circuit line 212 of the substrate 200, as shown in FIGS. 6-9. Optionally, the thin film fine line 137 may have a large area connected to the thick metal circuit line 150, as shown in FIGS. 8 and 9. Therefore, the above-mentioned chip package can improve its electrical performance and can reduce its noise occurrence.

3. Used for Power Bus or Plane or Ground Bus or Plane

FIGS. 10-13 are schematic cross-section representations showing another type of chip packages according to a first embodiment. The semiconductor chip in FIGS. 10-13 is similar to that in FIGS. 1-5 and the substrate 200 in FIGS. 10-13 is similar to that in FIGS. 1-5. The difference is that the thick metal circuit line 150 of the semiconductor chip 100 and the circuit line 212 of the substrate 200 are used for a power bus or plane or a ground bus or plane that can provide a stable power voltage or a stable ground voltage for the semiconductor chip 100 and the substrate 200.

Figure 12:
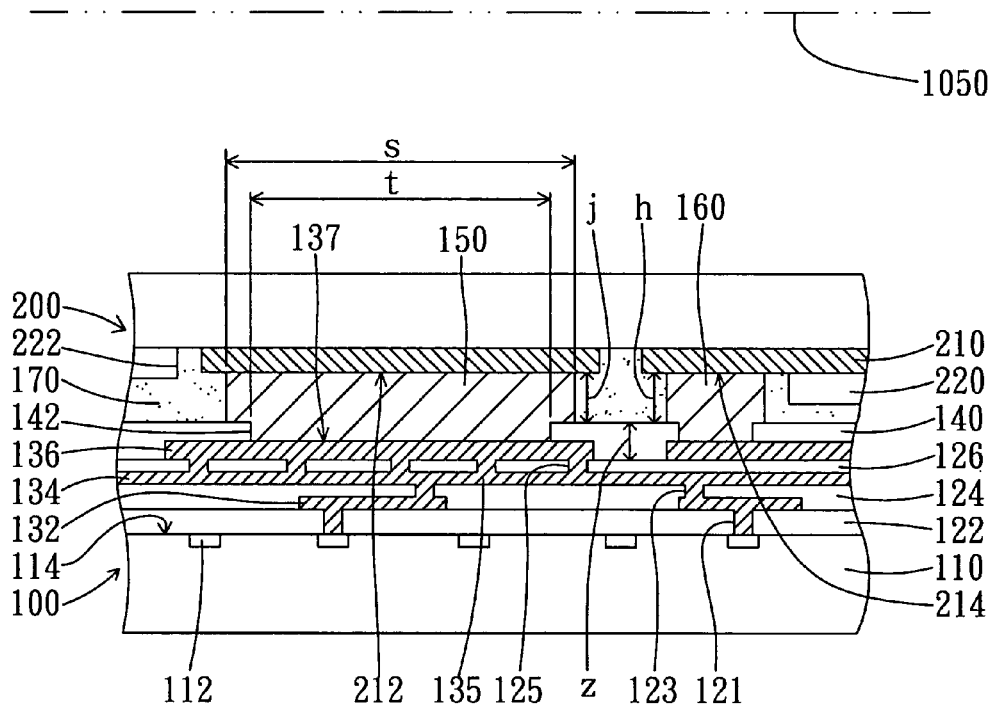
Figure 13:
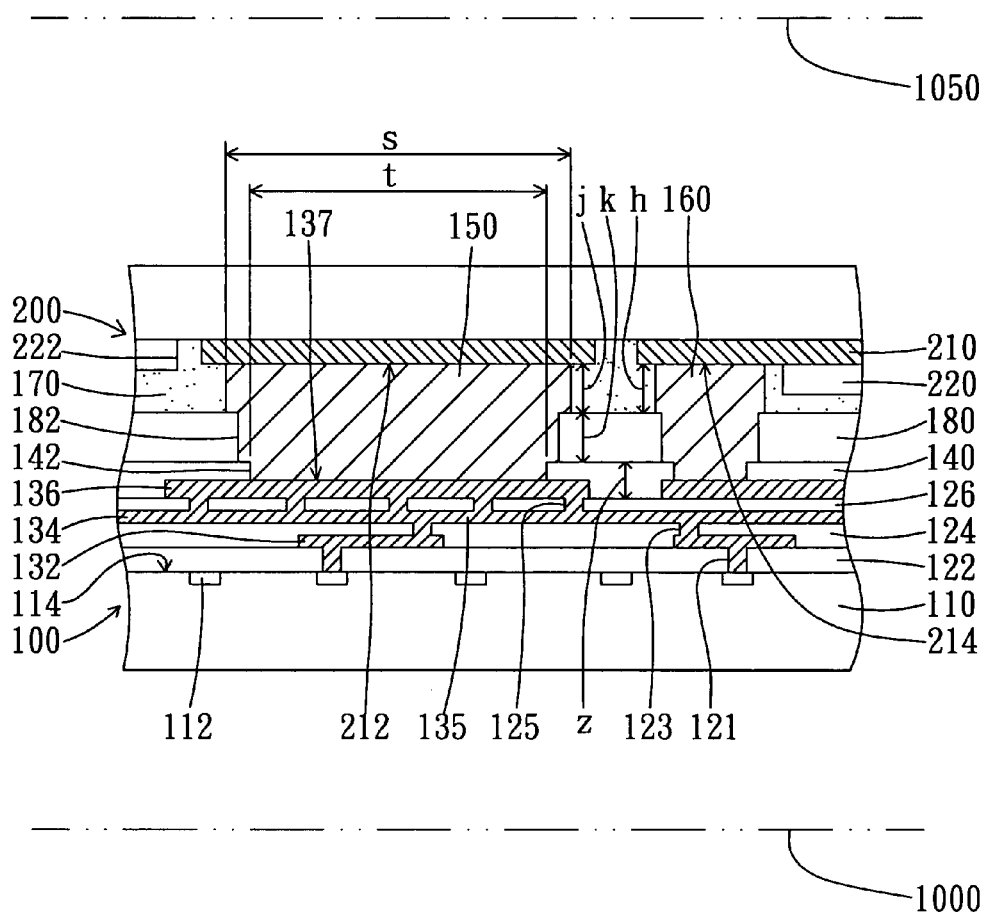

Referring to FIGS. 10-13, in the case of the thick metal circuit line 150 of the semiconductor chip 100 and the circuit line 212 of the substrate 200 serving as a power bus or plane, they can be electrically connected to a power bus or plane 135 of the thin film metal layer 134 and to a power bus or plane of the substrate 200. The thick metal circuit line 150 of the semiconductor chip 100 may have a large area connected to a large area of the circuit line 212 of the substrate 200, as shown in FIGS. 10-13. Optionally, the thin film fine line 137 may have a large area connected to the thick metal circuit line 150, as shown in FIGS. 12 and 13. Therefore, the above-mentioned chip package can provide a stable power voltage.

In another condition, the thick metal circuit line 150 of the semiconductor chip 100 and the circuit line 212 of the substrate 200 can be electrically connected to the power bus or plane 135 of the thin film metal layer 134, but can be disconnected from other circuitry in the substrate 200.

Referring to FIGS. 10-13, in the case of the thick metal circuit line 150 of the semiconductor chip 100 and the circuit line 212 of the substrate 200 serving as a ground bus or plane, they can be electrically connected to a ground bus or plane 135 of the thin film metal layer 134 and to a ground bus or plane of the substrate 200. The thick metal circuit line 150 of the semiconductor chip 100 may have a large area connected to the circuit line 212 of the substrate 200, as shown in FIGS. 10-13. Optionally, the thin film fine line 137 may have a large area connected to the thick metal circuit line 150, as shown in FIGS. 12 and 13. Therefore, the above-mentioned chip package can provide a stable ground voltage. Alternatively, the thick metal circuit line 150 of the semiconductor chip 100 and the circuit line 212 of the substrate 200 can be electrically connected to the ground bus or plane 135 of the thin film metal layer 134, but be disconnected from the circuitry in the substrate 200.

In another condition, the thick metal circuit line 150 of the semiconductor chip 100 and the circuit line 212 of the substrate 200 can be electrically connected to the ground bus or plane 135 of the thin film metal layer 134, but can be disconnected from other circuitry of the substrate 200.

Figure 14:
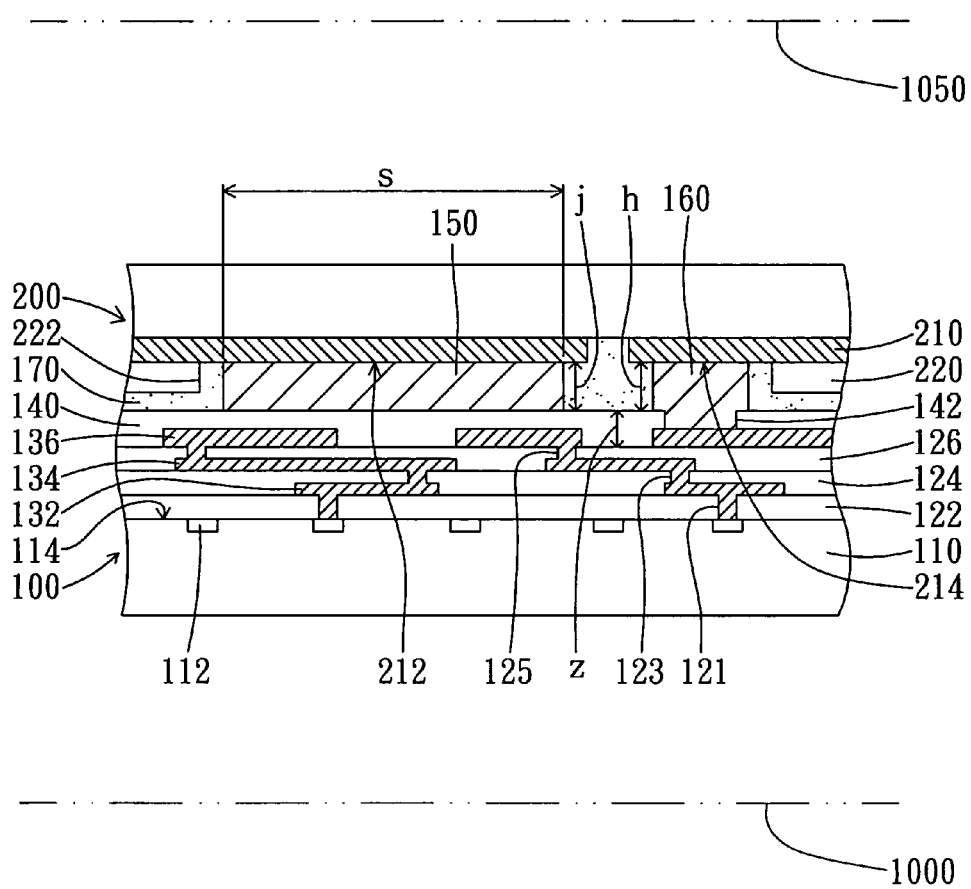
Figure 15:
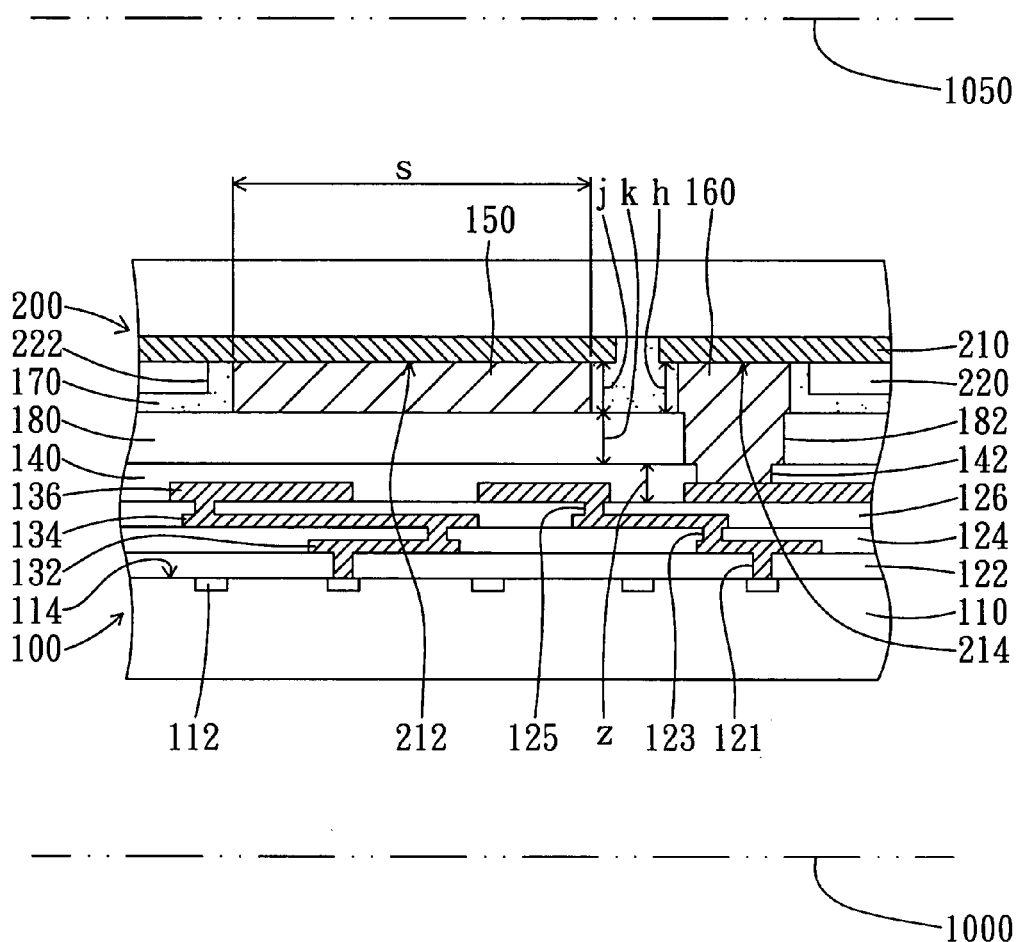

4. Used for Signal Transmission Power Bus or Plane or Ground Bus or Plane for Substrate FIGS. 14-15 are schematic cross-section representations showing another type of chip packages according to a first embodiment. The semiconductor chip 100 in FIGS. 14-15 is similar to the semiconductor chip 100 in FIGS. 1-5; the substrate 200 in FIGS. 14-15 is similar to the substrate in FIGS. 1-5. The difference is that the thick metal circuit line 150 of the semiconductor chip 100 is disconnected from the thin film fine line metal layers 132, 134, and 136. The thick metal circuit line 150 of the semiconductor chip 100 and the circuit line 212 of the substrate 200 are used for signal transmission, or power bus or plane or ground bus or plane only for the substrate 200.

Referring to FIGS. 14-15, a signal can be transmitted from a circuitry of the substrate 200 to the circuit line 212 of the substrate 200 and the thick metal circuit line 150 of the semiconductor chip 100. Next, the signal can be transmitted from the circuit line 212 and the thick metal circuit line 150 back to the substrate 200. The signal is not transmitted to the inside of the semiconductor chip 100 through the circuit line 212 of the substrate 200 and the thick metal circuit line 150 of the semiconductor chip 100. The thick metal circuit line 150 formed on the passivation layer 140 is disconnected from other circuitry of the semiconductor chip 100.

As mentioned above, the thick metal circuit line 150 of the semiconductor chip 100 and the circuit line 212 of the substrate 200 can only be used for the signal transmission for the substrate 200, not for the intra-chip signal transmission for the semiconductor chip 100 or for the signal transmission between the semiconductor chip 100 and the substrate 200. The thick metal circuit line 150 of the semiconductor chip 100 may have a large area connected to the circuit line 212 of the substrate 200, as shown in FIGS. 14 and 15. Therefore, the above-mentioned chip package can improve the electric properties of the chip package.

Alternatively, referring to FIGS. 14-15, the thick metal circuit line 150 of the semiconductor chip 100 and the circuit line 212 of the substrate 200 may be used for a power bus or plane that can provide a stable power voltage only for the substrate 200. The thick metal circuit line 150 of the semiconductor chip 100 and the circuit line 212 of the substrate 200 may be electrically connected to a power bus or plane in the substrate 200. The thick metal circuit line 150 of the semiconductor chip 100 is disconnected from the power bus or plane under the passivation layer 140. The thick metal circuit line 150 of the semiconductor chip 100 may have a large area connected to the circuit line 212 of the substrate 200, as shown in FIGS. 14 and 15. Therefore, the substrate 200 can supply more stable power voltage.

Alternatively, referring to FIGS. 14-15, the thick metal circuit line 150 of the semiconductor chip 100 and the circuit line 212 of the substrate 200 may be used for a ground bus or plane that can provide a stable ground voltage only for the substrate 200. The thick metal circuit line 150 of the semiconductor chip 100 and the circuit line 212 of the substrate 200 may be electrically connected to the ground bus or plane in the substrate 200. The thick metal circuit line 150 of the semiconductor chip 100 is disconnected from the ground bus or plane under the passivation layer. The thick metal circuit line 150 of the semiconductor chip 100 may have a large area connected to the circuit line 212 of the substrate 200, as shown in FIGS. 14 and 15. Therefore, the substrate 200 can supply more stable ground voltage.

5. The Metal Structure of the Thick Metal Circuit Line of the Semiconductor Chip and the Circuit Line of the Substrate.

Figure 16:
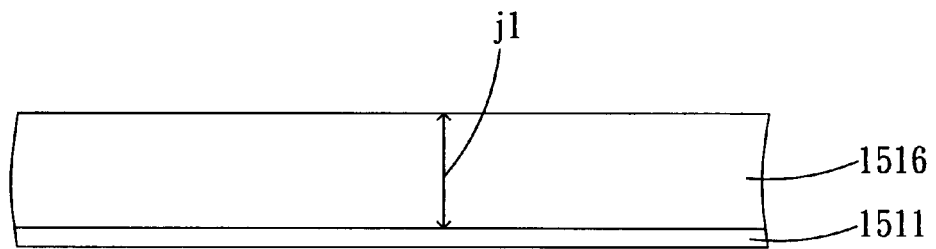
FIGS. 16-17A are schematic cross-sectional representations showing metal layers of the thick metal circuit line of the semiconductor chip in the first embodiment of the present invention.

FIG. 16 is a schematic cross-section representation showing one type of the detail metal layers of the thick metal circuit line of the semiconductor chip according to a first embodiment of the present invention. The above-mentioned thick metal circuit line 150 of the semiconductor chip may comprise an adhesion/barrier layer 1511 and a bulk metal layer 1516, for example. The adhesion/barrier metal layer 1511 and the bulk metal layer 1516 may be formed on the passivation layer 140, as shown in FIGS. 1, 2, 6, 10 and 14, or on the polymer layer 180, as shown in FIGS. 3, 7, 11 and 15), or on the topmost thin film fine line 137, as shown in FIGS. 4, 5, 8, 9, 12 and 13. The bulk metal layer 1516 is formed upon the adhesion/barrier layer 1511. The bump 160 of the semiconductor chip 100 can have the same deposited metal layers of the thick metal circuit line 150 as shown in FIG. 16.

In a case, the adhesion/barrier layer 1511 may comprise chromium, a chromium- copper alloy, titanium, a titanium-tungsten alloy, titanium nitride, tantalum or tantalum nitride, for example. The bulk metal layer 1516 may be a single metal layer and may have a thickness a1 thicker than 1 μm (1 micrometer), and preferably between 2 μm (2 micrometers) and 30 μm (30 micrometers), wherein the bulk metal layer 1516 may comprise gold with greater than 90 weight percent, and, preferably, greater than 97 weight percent. Alternatively, a seed layer (unshown), such as gold, can be sputtered on the adhesion/barrier layer 1511, preferably comprising a titanium-tungsten alloy, and then the bulk metal layer 1516 is electroplated on the seed layer.

In another case, the adhesion/barrier layer 1511 may comprise chromium, a chromium-copper alloy, titanium, a titanium-tungsten alloy, titanium nitride, tantalum or tantalum nitride, for example. The bulk metal layer 1516 may be a single metal layer and may have a thickness a1 thicker than 1 μm (1 micrometer), and preferably between 1 μm (2 micrometers) and 30 μm (30 micrometers), wherein the bulk metal layer 1516 may comprise silver with greater than 90 weight percent, and, preferably, greater than 97 weight percent. Alternatively, a seed layer (unshown), such as silver, can be sputtered on the adhesion/barrier layer 1511, preferably comprising a titanium-tungsten alloy, and then the bulk metal layer 1516 is electroplated on the seed layer.

In another case, the adhesion/barrier layer 1511 may comprise chromium, a chromium-copper alloy, titanium, a titanium-tungsten alloy, titanium nitride, tantalum or tantalum nitride, for example. Alternatively, the adhesion/barrier layer 1511 may be formed by sputtering a chromium layer and then sputtering a chromium-copper layer on the chromium layer. The bulk metal layer 1516 may be a single metal layer and may have a thickness a1 thicker than 1 μm (1 micrometer), and preferably between 2 μm (2 micrometers) and 30 μm (30 micrometers), wherein the bulk metal layer 1516 may comprise copper with greater than 90 weight percent, and, preferably, greater than 97 weight percent. Alternatively, a seed layer (unshown), such as copper, can be sputtered on the adhesion/barrier layer 1511, preferably comprising a titanium-tungsten alloy, and then the bulk metal layer 1516 is electroplated on the seed layer.

In another case, the adhesion/barrier layer 1511 may comprise chromium, a chromium-copper alloy, titanium, a titanium-tungsten alloy, titanium nitride, tantalum or tantalum nitride, for example. The bulk metal layer 1516 may be a single metal layer and may have a thickness a1 thicker than 1 μm (1 micrometer), and preferably between 1 μm (2 micrometers) and 30 μm (30 micrometers), wherein the bulk metal layer 1516 may comprise platinum with greater than 90 weight percent, and, preferably, greater than 97 weight percent. Alternatively, a seed layer (unshown), such as platinum, can be sputtered on the adhesion/barrier layer 1511, preferably comprising a titanium-tungsten alloy, and then the bulk metal layer 1516 is electroplated on the seed layer.

In another case, the adhesion/barrier layer 1511 may comprise chromium, a chromium-copper alloy, titanium, a titanium-tungsten alloy, titanium nitride, tantalum or tantalum nitride, for example. The bulk metal layer 1516 may be a single metal layer and may have a thickness a1 thicker than 1 μm (1 micrometer), and preferably between 2 μm (2 micrometers) and 30 μm (30 micrometers), wherein the bulk metal layer 1516 may comprise palladium with greater than 90 weight percent, and, preferably, greater than 97 weight percent. Alternatively, a seed layer (unshown), such as palladium, can be sputtered on the adhesion/barrier layer 1511, preferably comprising a titanium-tungsten alloy, and then the bulk metal layer 1516 is electroplated on the seed layer.

In another case, the adhesion/barrier layer 1511 may comprise chromium, a chromium-copper alloy, titanium, a titanium-tungsten alloy, titanium nitride, tantalum or tantalum nitride, for example. The bulk metal layer 1516 may be a single metal layer and may have a thickness a1 thicker than 1 µm (1 micrometer), and preferably between 1 µm (2 micrometers) and 30 µm (30 micrometers), wherein the bulk metal layer 1516 may comprise rhodium with greater than 90 weight percent, and, preferably, greater than 97 weight percent. Alternatively, a seed layer (unshown), such as rhodium, can be sputtered on the adhesion/barrier layer 1511, preferably comprising a titanium-tungsten alloy, and then the bulk metal layer 1516 is electroplated on the seed layer.

In another case, the adhesion/barrier layer 1511 may comprise chromium, a chromium-copper alloy, titanium, a titanium-tungsten alloy, titanium nitride, tantalum or tantalum nitride, for example. The bulk metal layer 1516 may be a single metal layer and may have a thickness a1 thicker than 1 µm (1 micrometer), and preferably between 2 µm (2 micrometers) and 30 µm (30 micrometers), wherein the bulk metal layer 1516 may comprise ruthenium with greater than 90 weight percent, and, preferably, greater than 97 weight percent. Alternatively, a seed layer (unshown), such as ruthenium, can be sputtered on the adhesion/barrier layer 1511, preferably comprising a titanium-tungsten alloy, and then the bulk metal layer 1516 is electroplated on the seed layer.

In another case, the adhesion/barrier layer 1511 may comprise chromium, a chromium-copper alloy, titanium, a titanium-tungsten alloy, titanium nitride, tantalum or tantalum nitride, for example. The bulk metal layer 1516 may be a single metal layer and may have a thickness a 1 thicker than 1 µm (1 micrometer), and preferably between 2 µm (2 micrometers) and 30 µm (30 micrometers), wherein the bulk metal layer 312b may comprise ruthenium with greater than 90 weight percent, and, preferably, greater than 97 weight percent. Alternatively, a seed layer (unshown), such as ruthenium, can be sputtered on the adhesion/barrier layer 1511, preferably comprising a titanium-tungsten alloy, and then the bulk metal layer 1516 is electroplated on the seed layer.

In another case, the adhesion/barrier layer 1511 may comprise titanium, a titanium-tungsten alloy, titanium nitride, tantalum or tantalum nitride, for example. Alternatively, the adhesion/barrier layer 1511 may be formed by sputtering a chromium layer and then sputtering a chromium-copper layer on the chromium layer. The bulk metal layer 1516 may be multiple metal layers, such as first and second metal layers, the second metal layer being on the first metal layer. The first metal layer may have a thickness a2 thicker than 1 µm (1 micrometer), and preferably between 2 µm (2 micrometers) and 30 µm (30 micrometers), wherein the first metal layer may comprise copper with greater than 90 weight percent, and, preferably, greater than 97 weight percent. The second metal layer may comprise nickel, for example, and may have a thickness thicker than 1 µm (1 micrometer), and preferably between 1 µm (1 micrometer) and 5 µm (5 micrometers). Alternatively, a seed layer (unshown), such as copper, can be sputtered on the adhesion/barrier layer 1511, then the first metal layer is electroplated on the seed layer, and then the second metal layer is electroplated on the first metal layer.

In another case, the adhesion/barrier layer 1511 may comprise titanium, a titanium-tungsten alloy, titanium nitride, tantalum or tantalum nitride, for example. Alternatively, the adhesion/barrier layer 1511 may be formed by sputtering a chromium layer and then sputtering a chromium-copper layer on the chromium layer. The bulk metal layer 1516 may include multiple metal layers, such as a first metal layer, a second metal layer and a third metal layer, the first metal layer being over the adhesion/barrier layer, the second metal layer being on the first metal layer, and the third metal layer being on the second metal layer. The first metal layer may have a thickness thicker than 1 µm, and preferably between 2 µm and 30 µm, wherein the first metal layer may comprise copper with greater than 90 weight percent, and, preferably, greater than 97 weight percent. The second metal layer may have a thickness thicker than 1 µm, and preferably between 2 µm and 5 µm, and may comprise nickel with greater than 90 weight percent, and, preferably, greater than 97 weight percent. The third metal layer may have a thickness thicker than 100 angstroms, and preferably between 1000 angstroms and 1 µm, and may comprise gold with greater than 90 weight percent, and, preferably, greater than 97 weight percent. Alternatively, the third metal layer may have a thickness thicker than 100 angstroms, and preferably between 1000 angstroms and 1 µm, and may comprise silver with greater than 90 weight percent, and, preferably, greater than 97 weight percent. Alternatively, the third metal layer may have a thickness thicker than 100 angstroms, and preferably between 1000 angstroms and 1 µm, and may comprise copper with greater than 90 weight percent, and, preferably, greater than 97 weight percent. Alternatively, the third metal layer may have a thickness thicker than 100 angstroms, and preferably between 1000 angstroms and 1 µm, and may comprise platinum with greater than 90 weight percent, and, preferably, greater than 97 weight percent. Alternatively, the third metal layer may have a thickness thicker than 100 angstroms, and preferably between 1000 angstroms and 1 µm, and may comprise palladium with greater than 90 weight percent, and, preferably, greater than 97 weight percent. Alternatively, the third metal layer may have a thickness thicker than 100 angstroms, and preferably between 1000 angstroms and 1 µm, and may comprise rhodium with greater than 90 weight percent, and, preferably, greater than 97 weight percent. Alternatively, the third metal layer may have a thickness thicker than 100 angstroms, and preferably between 1000 angstroms and 1 µm, and may comprise ruthenium with greater than 90 weight percent, and, preferably, greater than 97 weight percent. Alternatively, a seed layer (unshown), such as copper, can be sputtered on the adhesion/barrier layer 1511, then the first metal layer is electroplated on the seed layer, then the second metal layer is electroplated on the first metal layer, and then the third metal layer is electroplated on the second metal layer.

Figure 17:
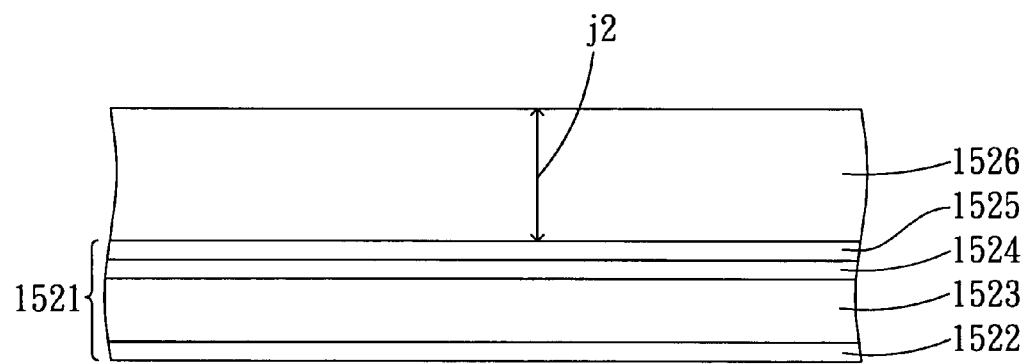
Figure 17A:
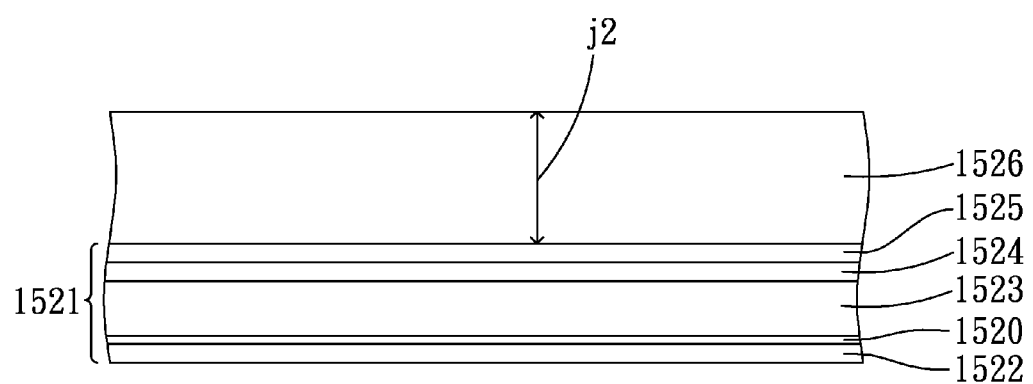

FIG. 17 is a schematic cross-section representation showing one type of the detail metal layers of the thick metal circuit line of the semiconductor chip according to a first embodiment of the present invention. The above-mentioned thick metal circuit line 150 of the semiconductor chip may comprise a UBM metal layer 1521 and a bulk metal layer 1526. The bulk metal layer 1526 is placed upon the UBM metal layer 1521. The UBM layer 1521 may be formed on the passivation layer, as shown in FIGS. 1, 2, 6, 10 and 14, or on the polymer layer 180, as shown in FIGS. 3, 7, 11 and 15, or on the topmost thin film fine line 137, as shown in FIGS. 4, 5, 8, 9, 12 and 13. The UBM metal layer 1521 may be multiple metal layers, such as a first metal layer 1522, a second metal layer 1523, a third metal layer 1524 and a fourth metal layer 1525, the second metal layer 1523 being on the first metal layer 1522, the third metal layer 1524 being on the second metal layer 1523, and the fourth metal layer 1525 being on the third metal layer 1524. The first metal layer 1522 may comprise titanium, a titanium-tungsten alloy, titanium nitride, tantalum or tantalum nitride, for example. Alternatively, the first layer 1522 may be formed by sputtering a chromium layer and then sputtering a chromium-copper layer on the chromium layer. The second metal layer 1523 may have a thickness thicker than 1 μm (1 micrometer), and preferably between 2 μm (2 micrometers) and 10 μm (10 micrometers), wherein the second metal layer 1523 may comprise copper with greater than 90 weight percent, and, preferably, greater than 97 weight percent. The third metal layer 1524 may comprise nickel, for example, and may have a thickness thicker than 1 μm (1 micrometer), and preferably between 1 μm (1 micrometer) and 5 μm (5 micrometers). The fourth metal layer 1525 may have a thickness thicker than 100 angstroms, and preferably between 1000 angstroms and 1 μm, and may comprise gold with greater than 90 weight percent, and, preferably, greater than 97 weight percent. Alternatively, the fourth metal layer 1525 may have a thickness thicker than 100 angstroms, and preferably between 1000 angstroms and 1 μm, and may comprise silver with greater than 90 weight percent, and, preferably, greater than 97 weight percent. Alternatively, the fourth metal layer 1525 may have a thickness thicker than 100 angstroms, and preferably between 1000 angstroms and 1 μm, and may comprise copper with greater than 90 weight percent, and, preferably, greater than 97 weight percent. Alternatively, the fourth metal layer 1525 may have a thickness thicker than 100 angstroms, and preferably between 1000 angstroms and 1 μm, and may comprise platinum with greater than 90 weight percent, and, preferably, greater than 97 weight percent. Alternatively, the fourth metal layer 1525 may have a thickness thicker than 100 angstroms, and preferably between 1000 angstroms and 1 μm, and may comprise palladium with greater than 90 weight percent, and, preferably, greater than 97 weight percent. Alternatively, the fourth metal layer 1525 may have a thickness thicker than 100 angstroms, and preferably between 1000 angstroms and 1 μm, and may comprise rhodium with greater than 90 weight percent, and, preferably, greater than 97 weight percent. Alternatively, the fourth metal layer 1525 may have a thickness thicker than 100 angstroms, and preferably between 1000 angstroms and 1 μm, and may comprise ruthenium with greater than 90 weight percent, and, preferably, greater than 97 weight percent. Alternatively, a seed layer 1520, such as copper, can be sputtered on the first layer 1522, then the second metal layer 1523 is electroplated on the seed layer, then the third metal layer 1524 is electroplated on the second metal layer 1523, and then the fourth metal layer 1525 is electroplated on the third metal layer 1524, as shown in FIG. 17A. The bulk metal layer 1526 electroplated on the fourth metal layer 1525 may be a reflowabler or solderable material that is usually reflowed with a certain reflow temperature profile, typically ramping up from a starting temperature to a peak temperature, and then cooled down to a final temperature. The peak temperature is roughly set at the melting temperature of solder, or metals or metal alloys used for reflow or bonding purpose. The bulk metal layer 1526 starts to reflow when temperature reaches the melting temperature of solder, or reflowable metal, or reflowable metal alloys (i.e. is roughly the peak temperature) for over 20 seconds. The peak-temperature period of the whole temperature profile takes over 2 minutes and typically 5 to 45 minutes. In summary, the bulk metal layer 1526 is reflowed at the temperature of between 150 and 350 centigrade degrees for more than 20 seconds or for more than 2 minutes. The bulk metal layer 1526 comprises solder or other metals or alloys with melting point between 150 and 350 centigrade degrees. The bulk metal layer 1526 comprises a lead-containing solder material, such as tin-lead alloy, or a lead-free solder material, such as tin-silver alloy or tin-silver-copper alloy at the topmost of the reflowable bump. Typically, the lead-free material may have a melting point greater than 185 centigrade degrees, or greater than 200 centigrade degrees, or greater than 250 centigrade degrees. Alternatively, the process of depositing the fourth metal layer 1525 can be omitted, and the bulk metal layer 1526 can be formed on the third metal layer 1524 comprising nickel. The bulk metal layer 1526 may have a thickness j2 of greater than 10 μm, and, for example, between 50 μm and 500 μm, or between 100 μm and 300 μm. The bump 160 of the semiconductor chip 100 can also have the same deposited metal layers of the thick metal circuit line 150 as shown in FIG. 17.

Figure 18:
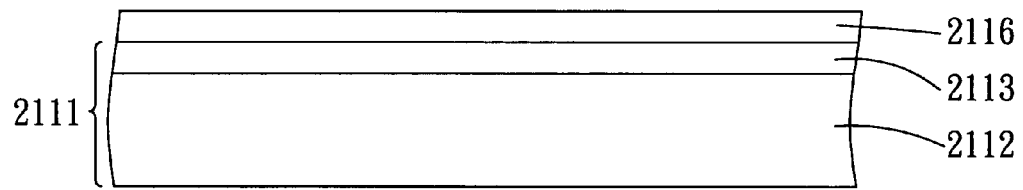
FIGS. 18-20 are schematic cross-sectional representations showing metal layers of the circuit line of the substrate in the first embodiment of the present invention.

FIG. 18 is a schematic cross-section representation showing one type of the detail metal layers of the circuit line of the substrate according to a first embodiment. The above-mentioned circuit line 212 of the substrate 200 may comprise a first metal layer 2112, a second metal layer 2113 and a third metal layer 2116, the first metal layer 2112 being on an insulating layer, such as polymer or ceramic, of the substrate 200, the second metal layer 2113 being on the first metal layer 2112 and the third metal layer 2116 being on the second metal layer 2113. The first metal layer 2112 may have a thickness thicker than 1 μm, and preferably between 2 μm and 30 μm, wherein the first metal layer may comprise copper with greater than 90 weight percent, and, preferably, greater than 97 weight percent. The second metal layer 2113 may have a thickness thicker than 1 μm, and preferably between 2 μm and 5 μm, and may comprise nickel with greater than 90 weight percent, and, preferably, greater than 97 weight percent. The third metal layer 2116 may have a thickness thicker than 100 angstroms, and preferably between 1000 angstroms and 1 μm, and may comprise gold with greater than 90 weight percent, and, preferably, greater than 97 weight percent. Alternatively, the third metal layer 2116 may have a thickness thicker than 100 angstroms, and preferably between 1000 angstroms and 1 μm, and may comprise silver with greater than 90 weight percent, and, preferably, greater than 97 weight percent. Alternatively, the third metal layer 2116 may have a thickness thicker than 100 angstroms, and preferably between 1000 angstroms and 1 μm, and may comprise copper with greater than 90 weight percent, and, preferably, greater than 97 weight percent. Alternatively, the third metal layer 2116 may have a thickness thicker than 100 angstroms, and preferably between 1000 angstroms and 1 μm, and may comprise platinum with greater than 90 weight percent, and, preferably, greater than 97 weight percent. Alternatively, the third metal layer 2116 may have a thickness thicker than 100 angstroms, and preferably between 1000 angstroms and 1 μm, and may comprise palladium with greater than 90 weight percent, and, preferably, greater than 97 weight percent. Alternatively, the third metal layer 2116 may have a thickness thicker than 100 angstroms, and preferably between 1000 angstroms and 1 μm, and may comprise rhodium with greater than 90 weight percent, and, preferably, greater than 97 weight percent. Alternatively, the third metal layer 2116 may have a thickness thicker than 100 angstroms, and preferably between 1000 angstroms and 1 μm, and may comprise ruthenium with greater than 90 weight percent, and, preferably, greater than 97 weight percent. The bonding pad 214 of the substrate 200 can also have the same deposited metal layers of the circuit line 212 of the substrate 200 as shown in FIG. 18.

Figure 19:
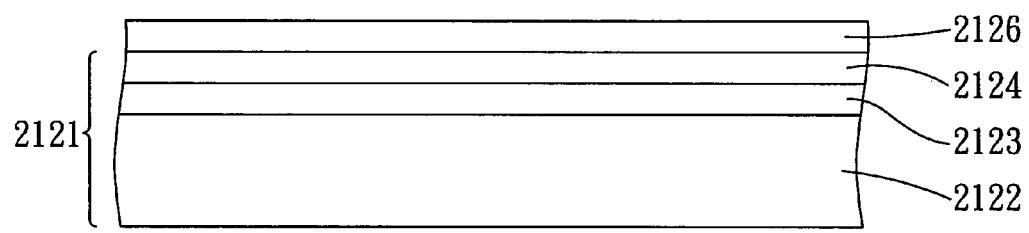

FIG. 19 is a schematic cross-section representation showing one type of the detail metal layers of the circuit line of the substrate according to a first embodiment. The above-mentioned circuit line 212 of the substrate 200 may comprise a first metal layer 2122, a second metal layer 2123, a third metal layer 2124 and a reflowable or soldable layer 2126, the first metal layer 2122 being on an insulating layer, such as polymer or ceramic, of the substrate 200, the second metal layer 2123 being on the first metal layer 2122 and the third metal layer 2124 being on the second metal layer 2123, the reflowable or soldable layer 2126 being on the third metal layer 2124. The first metal layer 2122 may have a thickness thicker than 1 μm, and preferably between 2 μm and 30 μm, wherein the first metal layer 2122 may comprise copper with greater than 90 weight percent, and, preferably, greater than 97 weight percent. The second metal layer 2123 may have a thickness thicker than 1 μm, and preferably between 2 μm and 5 μm, and may comprise nickel with greater than 90 weight percent, and, preferably, greater than 97 weight percent. The third metal layer 2124 may have a thickness thicker than 100 angstroms, and preferably between 1000 angstroms and 1 μm, and may comprise gold with greater than 90 weight percent, and, preferably, greater than 97 weight percent. Alternatively, the third metal layer 2124 may have a thickness thicker than 100 angstroms, and preferably between 1000 angstroms and 1 μm, and may comprise silver with greater than 90 weight percent, and, preferably, greater than 97 weight percent. Alternatively, the third metal layer 2124 may have a thickness thicker than 100 angstroms, and preferably between 1000 angstroms and 1 μm, and may comprise copper with greater than 90 weight percent, and, preferably, greater than 97 weight percent. Alternatively, the third metal layer 2124 may have a thickness thicker than 100 angstroms, and preferably between 1000 angstroms and 1 μm, and may comprise platinum with greater than 90 weight percent, and, preferably, greater than 97 weight percent. Alternatively, the third metal layer 2124 may have a thickness thicker than 100 angstroms, and preferably between 1000 angstroms and 1 μm, and may comprise palladium with greater than 90 weight percent, and, preferably, greater than 97 weight percent. Alternatively, the third metal layer 2124 may have a thickness thicker than 100 angstroms, and preferably between 1000 angstroms and 1 μm, and may comprise rhodium with greater than 90 weight percent, and, preferably, greater than 97 weight percent. Alternatively, the third metal layer 2124 may have a thickness thicker than 100 angstroms, and preferably between 1000 angstroms and 1 μm, and may comprise ruthenium with greater than 90 weight percent, and, preferably, greater than 97 weight percent. The reflowable or solderable metal layer 2126 electroplated on the third metal layer 2124 may be a reflowabler or solderable material that is usually reflowed with a certain reflow temperature profile, typically ramping up from a starting temperature to a peak temperature, and then cooled down to a final temperature. The peak temperature is roughly set at the melting temperature of solder, or metals or metal alloys used for reflow or bonding purpose. The solder metal layer 2126 starts to reflow when temperature reaches the melting temperature of solder, or reflowable metal, or reflowable metal alloys (i.e. is roughly the peak temperature) for over 20 seconds. The peak-temperature period of the whole temperature profile takes over 2 minutes and typically 5 to 45 minutes. In summary, the solder metal layer 2126 is reflowed at the temperature of between 150 and 350 centigrade degrees for more than 20 seconds or for more than 2 minutes. The solder metal layer 2126 comprises solder or other metals or alloys with melting point between 150 and 350 centigrade degrees. The solder metal layer 2126 comprises a lead-containing solder material, such as tin-lead alloy, or a lead-free solder material, such as tin-silver alloy or tin-silver-copper alloy at the topmost of the reflowable bump. Typically, the lead-free material may have a melting point greater than 185 centigrade degrees, or greater than 200 centigrade degrees, or greater than 250 centigrade degrees. Alternatively, the process of depositing the third metal layer 2124 can be omitted, and the solder metal layer 1526 can be formed on the second metal layer 2123 comprising nickel. The bonding pad 214 of the substrate 200 can also have the same deposited metal layers of the circuit line 212 of the substrate 200 as shown in FIG. 19.

The reflowable or solderable metal layer 2126 can be formed by the following methods. The reflowable or solderable metal layer 2126 can be formed on the above-mentioned third metal layer 2124 or on the above-mentioned second meta layer 2123, if the above-mentioned third metal layer 2124 is not formed, using an electroplating process. Thereafter, during the process of bonding the semiconductor chip 100 and the substrate 200, the electroplated solderable metal layer 2126 can joined with various above-mentioned kinds of the thick circuit metal layer 150 and bumps of the semiconductor chip 100. Alternatively, the reflowable or solderable metal layer 2126 can be formed by depositing a solder paste on the above-mentioned third metal layer 2124 or on the above-mentioned second meta layer 2123, if the above-mentioned third metal layer 2124 is not formed, then attaching the thick circuit metal layer 150 and bumps of the semiconductor chip 100 with one of the above-mentioned metal layers onto the solder paste, and then reflowing the solder paste to form the solid solder metal layer 2126 that bonds the thick circuit metal layer 150 and bumps 160 to the circuit line 212 and the pad 214 of the substrate 200.

Figure 20:
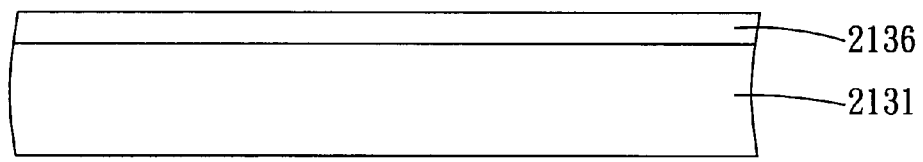

FIG. 20 is a schematic cross-section representation showing one type of the detail metal layers of the circuit line of the substrate according to a first embodiment. The above-mentioned circuit line 212 of the substrate 200 may comprise a bottom metal layer 2131 and a reflowable or soldable metal layer 2136, the bottom metal layer 2131 being on an insulating layer, such as polymer or ceramic, of the substrate 200, the reflowable or soldable metal layer 2136 being on the bottom metal layer 2131. The bottom metal layer 2131 may have a thickness thicker than 1 μm, and preferably between 2 μm and 30 μm, wherein the bottom metal layer 2131 may comprise copper with greater than 90 weight percent, and, preferably, greater than 97 weight percent. The reflowable or solderable metal layer 2136 electroplated on the bottom metal layer 2131 may be a reflowabler or solderable material that is usually reflowed with a certain reflow temperature profile, typically ramping up from a starting temperature to a peak temperature, and then cooled down to a final temperature. The peak temperature is roughly set at the melting temperature of solder, or metals or metal alloys used for reflow or bonding purpose. The solder metal layer 2136 starts to reflow when temperature reaches the melting temperature of solder, or reflowable metal, or reflowable metal alloys (i.e. is roughly the peak temperature) for over 20 seconds. The peak-temperature period of the whole temperature profile takes over 2 minutes and typically 5 to 45 minutes. In summary, the solder metal layer 2136 is reflowed at the temperature of between 150 and 350 centigrade degrees for more than 20 seconds or for more than 2 minutes. The solder metal layer 2136 comprises solder or other metals or alloys with melting point between 150 and 350 centigrade degrees. The solder metal layer 2136 comprises a lead-containing solder material, such as tin-lead alloy, or a lead-free solder material, such as tin-silver alloy or tin-silver-copper alloy at the topmost of the reflowable bump. Typically, the lead-free material may have a melting point greater than 185 centigrade degrees, or greater than 200 centigrade degrees, or greater than 250 centigrade degrees. The bonding pad 214 of the substrate 200 can also have the same deposited metal layers of the circuit line 212 of the substrate 200 as shown in FIG. 20.

The reflowable or solderable metal layer 2136 can be formed by the following methods. The reflowable or solderable metal layer 2136 can be formed on the above-mentioned bottom metal layer 2131 using an electroplating process. Thereafter, during the process of bonding the semiconductor chip 100 and the substrate 200, the electroplated solderable metal layer 2136 can joined with various above-mentioned kinds of the thick circuit metal layer 150 and bumps of the semiconductor chip 100. Alternatively, the reflowable or solderable metal layer 2136 can be formed by depositing a solder paste on the bottom metal layer 2131, then attaching the thick circuit metal layer 150 and bumps of the semiconductor chip 100 with one of the above-mentioned metal layers onto the solder paste, and then reflowing the solder paste to form the solid solder metal layer 2136 that bonds the thick circuit metal layer 150 and bumps 160 to the circuit line 212 and the pad 214 of the substrate 200.

In this present innovation, the bonding between the thick metal circuit line 150 of the semiconductor chip 100 and the circuit line 212 of the substrate 200 can be made based on two mechanisms. The first mechanism is the metal-to-metal euectic bonding process, such as a gold-to-gold euectic bonding process, gold-to-silver euectic bonding process, gold-to-copper euectic bonding process, gold-to-platinum euectic bonding process, gold-to-palladium euectic bonding process, gold-to-rhodium euectic bonding process, gold-to-ruthenium euectic bonding process, silver-to-silver euectic bonding process, silver-to-copper euectic bonding process, silver-to-platinum euectic bonding process, silver-to-palladium euectic bonding process, silver-to-rhodium euectic bonding process, silver-to-ruthenium euectic bonding process, copper-to-copper euectic bonding process, copper-to-platinum euectic bonding process, copper-to-palladium euectic bonding process, copper-to-rhodium euectic bonding process, copper-to-ruthenium euectic bonding process, platinum-to-platinum euectic bonding process, platinum-to-palladium euectic bonding process, platinum-to-rhodium euectic bonding process, platinum-to-ruthenium euectic bonding process, palladium-to-palladium euectic bonding process, palladium-to-rhodium euectic bonding process, palladium-to-ruthenium euectic bonding process, rhodium-to-rhodium euectic bonding process, rhodium-to-ruthenium euectic bonding process, or ruthenium-to-ruthenium euectic bonding process. The top metal layer of the thick metal circuit line 150 and the bump 160 of the semiconductor chip 100 made of gold, silver, copper, platinum, palladium, rhodium, or ruthenium with high purity, as illustrated in FIG. 16 can be bonded to the top metal layer of the circuit line 212 and the bonding pad 214 of the substrate 200, as illustrated in FIG. 18 based on the above-mentioned first mechanism.

The second mechanism is the solder bonding process. The top metal layer of the thick metal circuit line 150 and bump 160 of the semiconductor chip 100 can be a solder material, such as tin, a tin-lead alloy, a tin-silver alloy or a tin-silver-copper alloy, as above illustrated in FIG. 17 and can be bonded to various kinds of the circuit line 212 and bonding pad 214 of the substrate 200 as above illustrated in FIGS. 18-20 using a reflow or heating process. The top metal layer of the thick metal circuit line 150 and bump 160 of the semiconductor chip 100 as above illustrated in FIGS. 16 and 17 can be bonded to an electroplated metal layer or printed solder paste comprising a solder material, such as tin, a tin-lead alloy, a tin-silver alloy or a tin-silver-copper alloy, at the top of the circuit line 212 and bonding pad 214 of the substrate 200 as above illustrated in FIGS. 19 and 20 using a reflow or heating process.

Second Embodiment

The thick metal circuit line 150 of the semiconductor chip 100 is not just used to be connected to and in touch with the circuit line 212 of the substrate 200 as illustrated in the first embodiment. The thick metal circuit line 150 of the semiconductor chip 100 also can be connected to and in touch with another thick metal circuit line 350 of another semiconductor chip 300 as shown in FIG. 23-47. The structure and material of the elements of the semiconductor chip 100 is described in detail in the first embodiment, and can refer to this second embodiment. To match up the drawings, several possible cases are illustrated as follows:

1. Used for Signal Transmission for Two Connected Semiconductor Chips.

Figure 21:
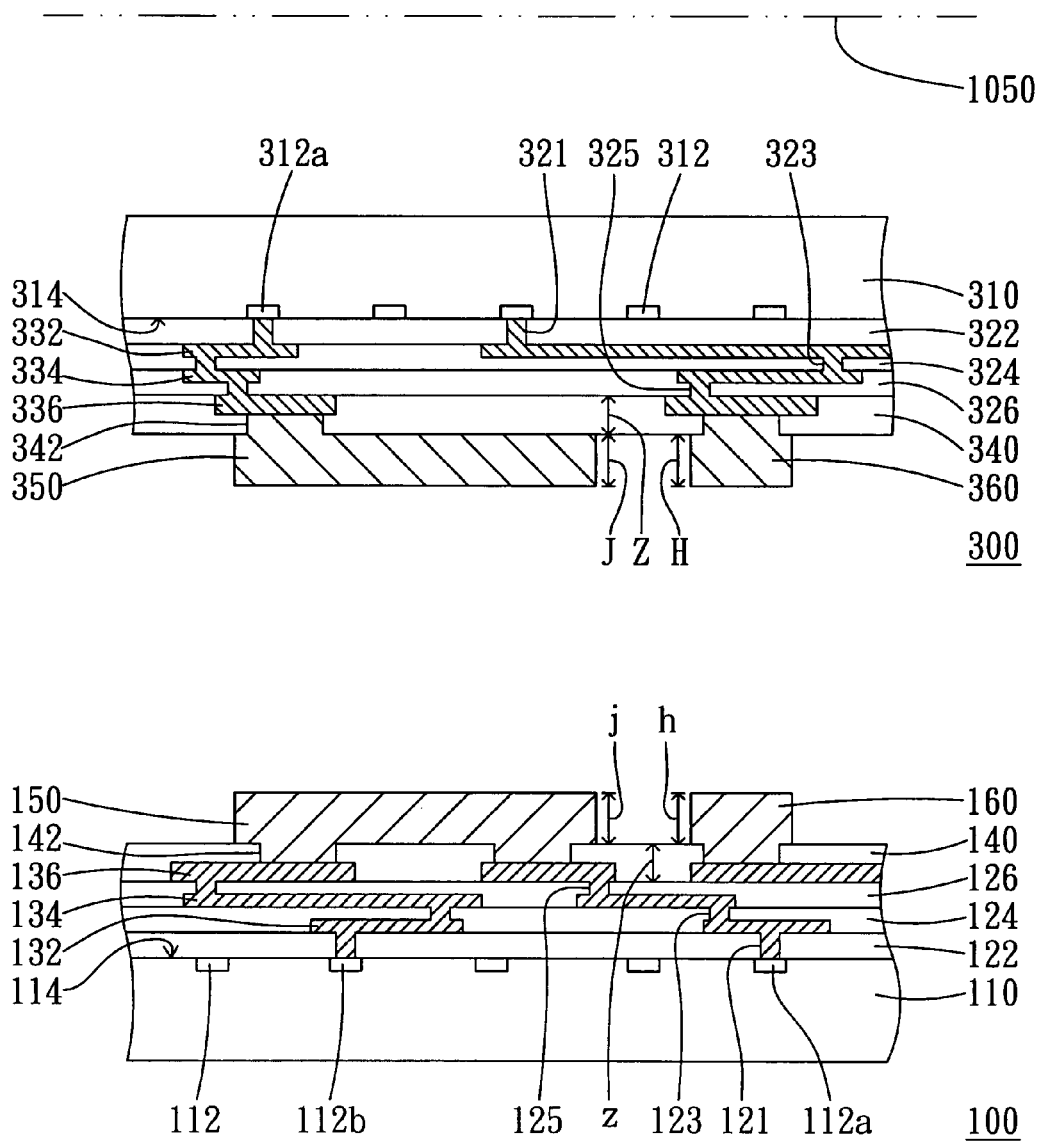
FIG. 21 is a schematic cross-section representation showing a chip package before connecting two semiconductor chips in the second embodiment of the present invention.
Figure 22:
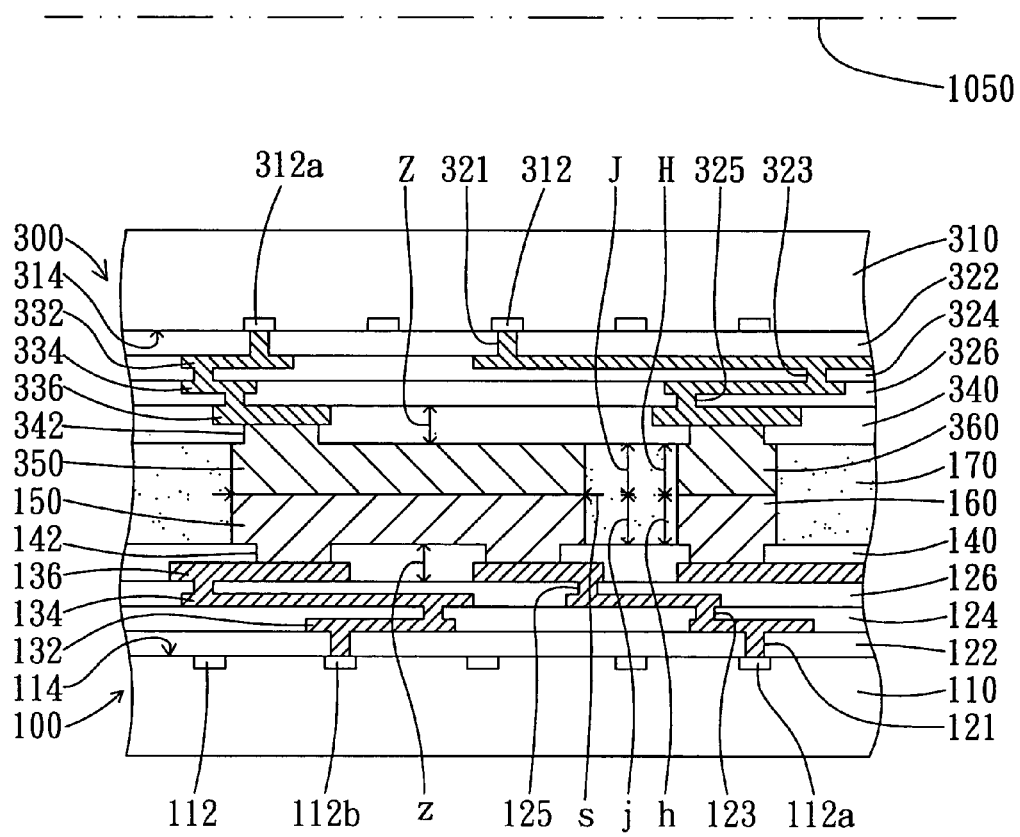
FIGS. 22-47 are schematic cross-section representations showing chip packages in the second embodiment.

FIG. 21 is a schematic cross-sectional drawing showing two semiconductor chips before connecting them according to a second embodiment. The cross-section representation of the thick metal circuit lines 150 and 350 of the semiconductor chips 100 and 300 come from perpendicularly cutting in the direction in which the thick metal circuit line 150 and 350 of the semiconductor chip 100 and 300 extends. FIG. 22 is a schematic cross-sectional drawing showing a chip package after connecting two semiconductor chips according to a second embodiment.

Referring to FIG. 21, the semiconductor chip 300 comprises a semiconductor substrate 310, a plurality of thin film dielectric layer 322, 324, and 326, a plurality of thin film fine line metal layer 332, 334, and 336 and a passivation layer 340. The semiconductor substrate 310 comprises a plurality of electrical device 312 formed in or on the semiconductor substrate 310. The semiconductor substrate is, for example, silicon substrate or AsGa substrate. A plurality of electronic devices 312, such as passive devices, transistors or MOS devices, are formed in or on the semiconductor substrate 310 by doping the dopant with either with penta-valence or tri-valence ions, for example, boron ions or phosphorous ions.

The thin film dielectric layers 322, 324 and 326 are formed over an active surface 314 of the semiconductor substrate 300. The thin film dielectric layer is composed of silicon oxide, silicon nitride, or oxynitride, for example. The thin film fine line metal layers 332, 334 and 336 are respectively formed on one of the thin film dielectric layers 322, 324 and 326. The material of the thin film fine line metal layers 332, 334 and 336 is, for example, aluminum, copper, silicon and et cetera. The thin film dielectric layers 322, 324 and 326 comprise a plurality of via holes 321, 323, 325. The thin film fine line metal layers 332, 334 and 336 are connected to each other and to the electronic devices 312 via the via holes 321, 323, 325 in the thin film dielectric layers 322, 324 and 326.

The passivation layer 340 is formed over the thin film dielectric layers 322, 324 and 326 and the thin film fine line metal layers 332, 334 and 336. The passivation layer 340 has a preferred thickness thicker than about 0.3 um. The passivation layer 340 is composed of the material such as, a silicon-oxide layer, a silicon-nitride layer, a phosphosilicate glass (PSG) layer, or a composite structure comprising the above-mentioned layers. The passivation layer 340 comprises one or more insulating layers, such as silicon-nitride layer or silicon-oxide layer, formed by CVD processes. In a case, a silicon-nitride layer with a thickness of between 0.2 and 1.2 µm is formed over a silicon-oxide layer with a thickness of between 0.1 and 0.8 µm. Generally, the passivation layer 340 comprises a topmost silicon-nitride layer or a topmost silicon-nitride layer in the finished chip structure. The passivation layer 340 comprises a topmost CVD insulating layer in the finished chip structure. A plurality of openings 342 in the passivation layer 340 expose the topmost thin film fine line metal layer 336.

The thick metal circuit layer 350 is formed over the passivation layer 340 and connected to the thin film fine line metal layer 336 through the openings 342 in the passivation 340. The thickness of the thick metal circuit line 350 is thicker than the thickness of the thin film fine line metal layer 332, 334, and 336. The bump is substantially aimed at the opening 342 in the passivation layer and connected to the thin film fine line metal layer 336. The thick metal circuit line 350 and the bump 360 can be formed simultaneously under the same process. Thereby, the metal layer structure of the thick metal circuit line is the same with the bump. The thickness J of the thick metal circuit line 350 is substantially the same as the thickness H of the bump 360. The thickness J of the thick metal circuit layer 350 and the thickness H of the bump 360 are, for example, thicker than 1 μm and, preferably, between 2 μm and 30 μm.

The thick metal circuit lines 150 and 350 can extend in any direction or with various shapes at the top of the semiconductor chips 100 and 300, such as in a straight direction, or with a curve shape or a discontinuing crooked shape. The relationship between the thick metal circuit lines 150 and 350 of the semiconductor chips 100 and 300 is presented like a specular reflection. Therefore, the thick metal circuit lines 150 and 350 of the semiconductor chips 100 and 200 can be aligned with each other in the process for bonding the semiconductor chips 100 and 300.

Referring to FIG. 22, the thick metal circuit line 350 of the semiconductor chip 300 can be connected to and in touch with the thick metal circuit line 150 of the semiconductor chip 100. The bump 360 of the semiconductor chip 300 can be connected to and in touch with the bump 160 of the semiconductor chip 100. Next, a polymer layer 170 is filled into a gap between the semiconductor chips 100 and 300 and encloses the thick metal circuit lines 150 and 350 and the bumps 160 and 360. The plane 1000 is substantially parallel to an active surface 114 of the semiconductor substrate 110. The projection profile of the connection between the thick metal circuit lines 150 and 350 projecting to the plane 1000 has an extension length s of larger than 500 μm, 800 μm, or 1200 μm, for example. The projection profile of the connection between the thick metal circuit lines 150 and 350 projecting to the plane 1000 has an area of larger than 30,000 μm$^2$, 80,000 μm$^2$, or 150,000 μm$^2$, for example.

In the embodiment, the relation of the connection between the thick metal circuit lines 150 and 350 of the semiconductor chips 100 and 300 can refer to the relation of the connection between the thick metal circuit lines 150 of the semiconductor chip 100 and the circuit line 212 of the substrate 200, and particularly the description illustrated in FIGS. 1A, 1B and 2A.

Referring to FIG. 22, a signal may be transmitted from one of the electronic devices, such as 112a, to the thick metal circuit lines 150 and 350 sequentially through the thin film fine line metal layers 132, 134 and 136 and then through the opening 142 in the passivation layer 140. Next, the signal may be transmitted from the thick spiral metal circuit line 150 and the spiral circuit line 212 to the other one of the electronic devices, such as 112b, through the opening 142 in the passivation layer 140 and then sequentially through the thin film fine line metal layers 136, 134 and 132. The thick metal circuit lines 150 and 350 of the semiconductor chips 100 and 300 can be used for signal transmission in the semiconductor chip 100. The signal transmitted from the electrical device 112a to the thick metal circuit line 150 and the circuit line 212 also can be transmitted to the inside of the semiconductor chip 300, and, for example, to an electronic devices, such as 312a, through the opening 342 in the passivation layer 340 and then sequentially through the thin film fine line metal layers 336, 334 and 332. The thick metal circuit lines 150 and 350 of the semiconductor chips 100 and 300 can be used for signal transmission between the semiconductor chips 100 and 300.

Referring to FIG. 22, a signal may also be transmitted from one of the electronic devices, such as 312a, to the thick metal circuit lines 350 and 150 sequentially through the thin film fine line metal layers 332, 334 and 336 and then through the opening 342 in the passivation layer 340. Next, the signal may be transmitted from the thick metal circuit lines 150 and 350 to the electronic devices, such as 112a, 112b, through the opening 142 in the passivation layer 140 and then sequentially through the thin film fine line metal layers 136, 134 and 132.

As mentioned above, the thick metal circuit lines 150 and 350 of the semiconductor chips 100 and 300 can be used to transmit the signal in a lateral direction and also in a vertical direction between the semiconductor chips 100 and. The thick metal circuit lines 150 of the semiconductor chip 100 may have a large area connected to a large area of the thick metal circuit lines 350 of the semiconductor chip 300. Therefore, the chip package can significantly improve its electrical performance and can reduce its noise occurrence.

Referring to FIG. 22, the semiconductor chip 100 can transmit or receive a signal to or from the semiconductor chip 300 via the bumps 160 and 360.

Figure 23:
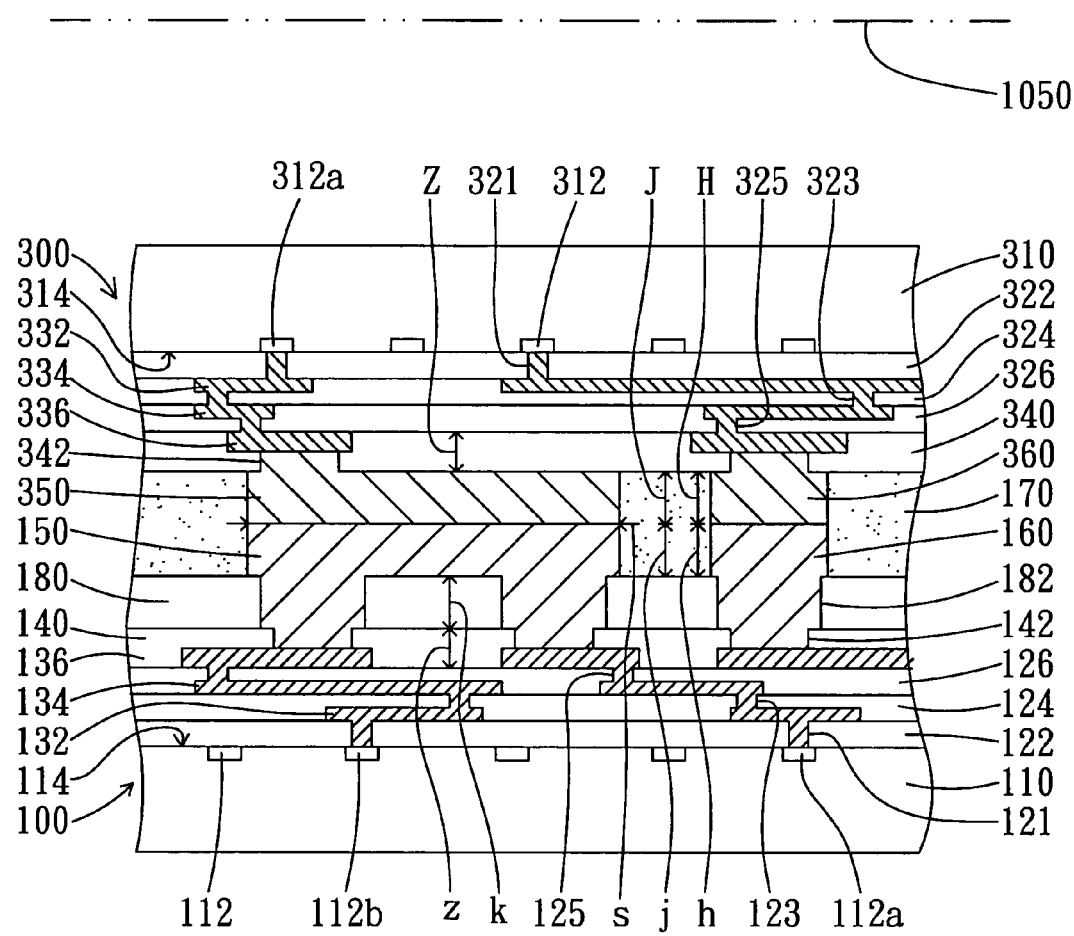

In FIGS. 21 and 22, the thick metal circuit line 150 and 350 are formed over and in touch with the passivation layer 140 and 340. The thick metal circuit line 150 and 350 can also be formed upon the polymer layer formed over the passivation layer 140 and 340. Alternatively, the thick metal circuit line 350 can be formed on a polymer layer formed on the passivation layer 340 and the thick metal circuit line 150 is formed over and in touch with the passivation layer 140. Alternatively, the thick metal circuit line 150 is formed on a polymer layer formed on the passivation layer 140 and the thick metal circuit line 350 is formed on and in touch with the passivation layer 340, as shown in FIG. 23. FIG. 23 is a schematic cross-section view showing another kind of chip package according to a second embodiment. One of the above-mentioned cases of forming a thick metal circuit line on a polymer layer is shown in FIG. 23. The others are not shown but can be understood based on the above description.

Figure 24:
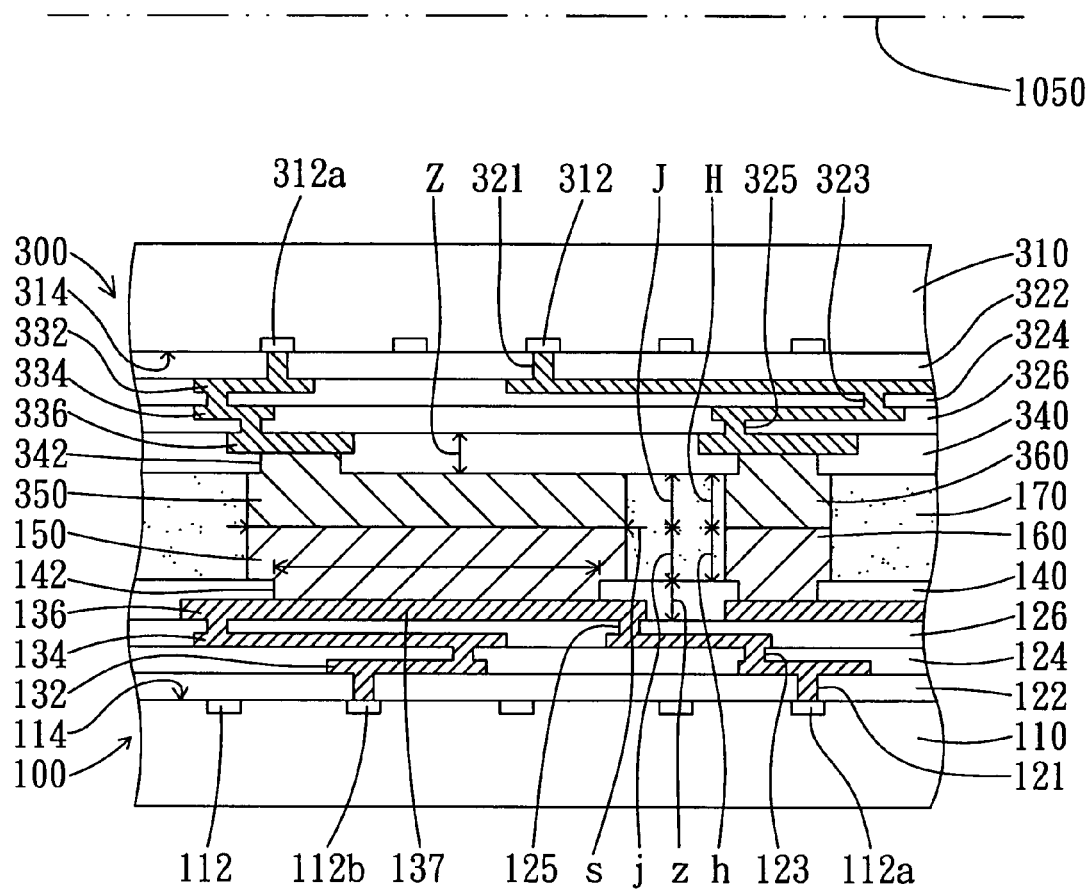
Figure 25:
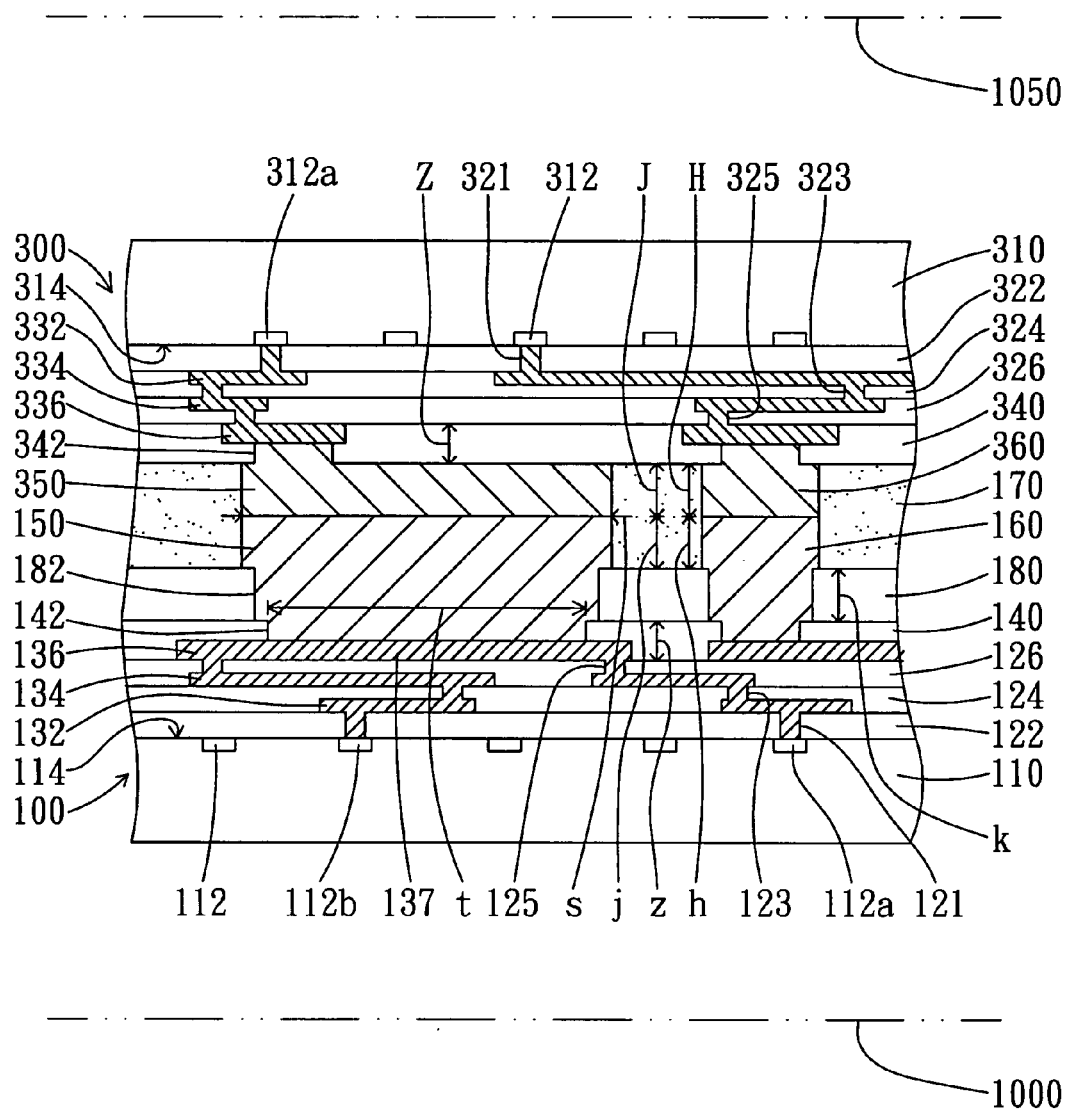
Figure 26:
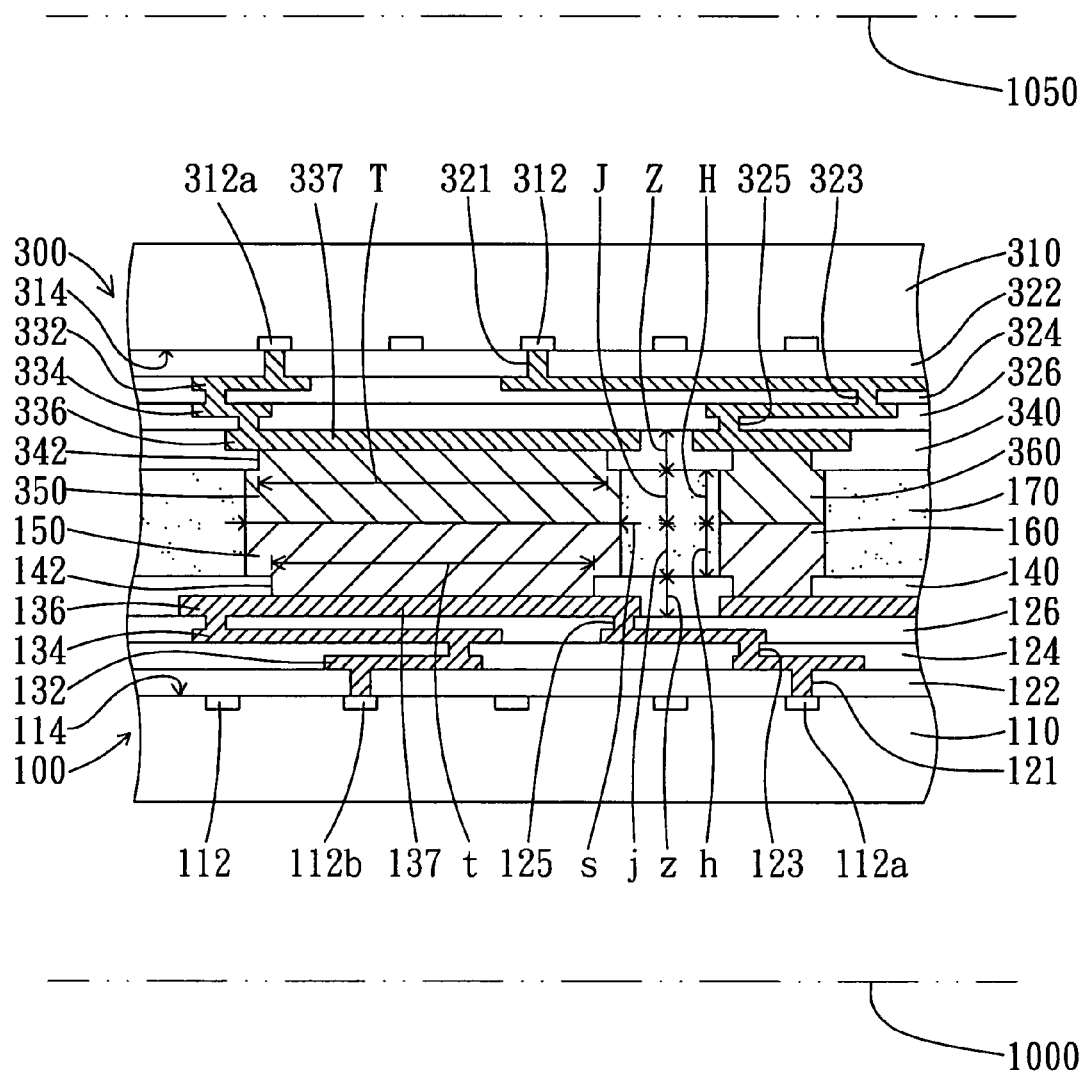
Figure 27:
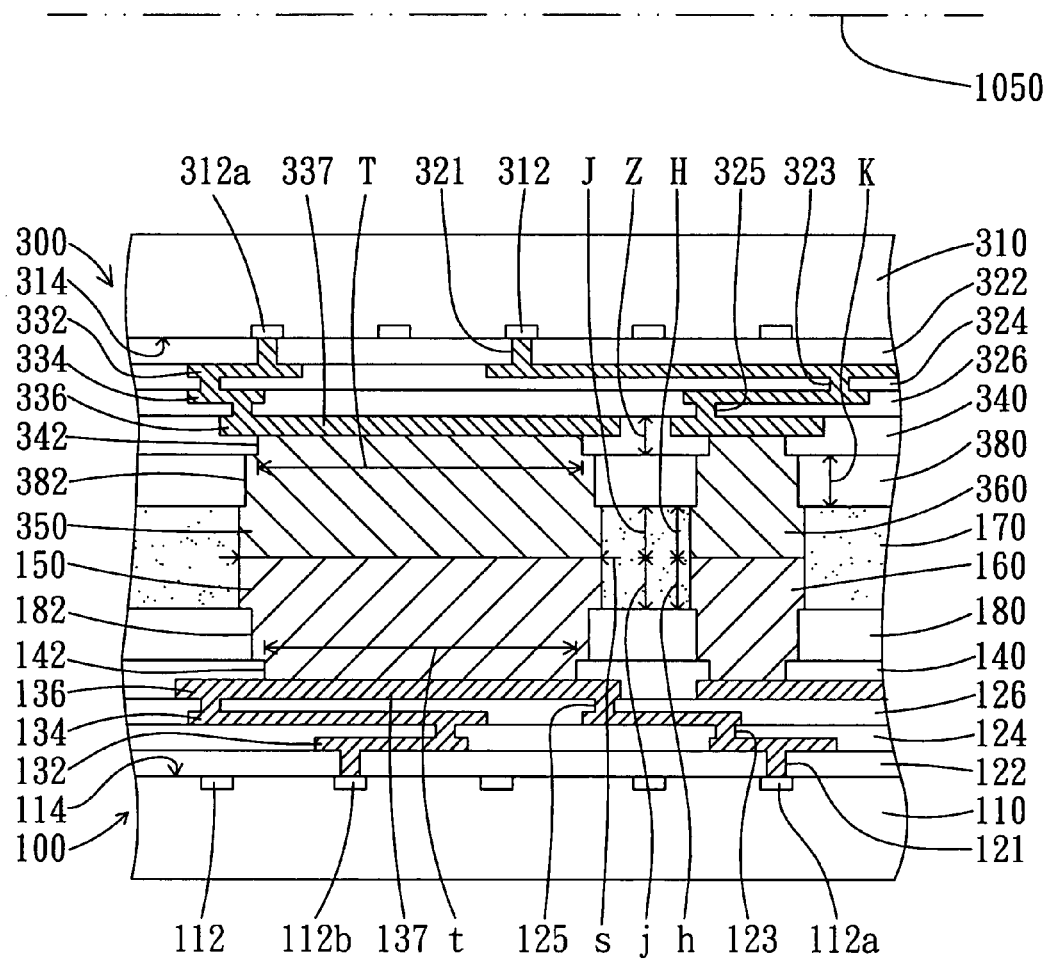

Referring to FIG. 23, a polymer layer 180 is formed over the passivation layer 140. A plurality of the openings 182 in the polymer layer 180 aim at the openings 142 in the passivation layer 140. The thick metal circuit layer 150 is formed over the polymer layer 180 and connects to the thin film fine line metal layer 136 via the openings 182 in the polymer layer 180 and the openings 142 in the passivation layer 140. The thick metal circuit layer 350 is formed over and in touch with the passivation layer 340 and connected to the thin film fine line metal layer 336 via the opening 342 in the passivation layer 340. The thickness h of the bump 160 bulging over the openings 182 in the polymer layer 180 is substantially the same with the thickness j of the thick metal circuit line 150 formed over the polymer layer 180. The thick metal circuit line 150 has the same metal structure with the bump 160. The thickness h of the bump 160 bulging over the openings 182 in the polymer layer 180 and the thickness j of the thick metal circuit line 150 formed over the polymer layer 180 are, for example, thicker than 1 μm, and, preferably, between 2 μm and 30 μm. The polymer layer 180 can be made of polyimide (PI), benzocyclobutene (BCB), parylene, porous insulating material, or elastomer, for example.bulgingbulging In FIGS. 21-23, the thick metal circuit lines 150 and 350 are connected to multiple small areas of the topmost thin film fine line metal layers 136 and 336 via the small openings 142 and 342 in the passivation layers 140 and 340. Alternatively, the thick metal circuit line 150 or 350 can be connected to a large area of the topmost thin film fine line metal layer 136 or 336 via a large opening 142 or 342 in the passivation layer 140 or 340. In a first case, the thick metal circuit line 150 is connected to a small area of the topmost thin film fine line metal layer 136, and the thick metal circuit line 350 is connected to a large area of the topmost thin film fine line metal layer 336. In a second case, the thick metal circuit line 150 is connected to a large area of the topmost thin film fine line metal layer 136, and the thick metal circuit line 350 is connected to a small area of the topmost thin film fine line metal layer 336, as shown in FIGS. 24 and 25. In a third case, the thick metal circuit lines 150 and 350 are respectively connected to large areas of the topmost thin film fine line metal layer 136 and 336, as shown in FIGS. 26 and 27. The first case not shown in a figure, but can be understood based on the above description.

Referring to FIGS. 24-27, the thin film fine line metal layer 136 includes a thin film fine line 137 having a large area exposed by a large opening 142 in the passivation layer 140. The thick metal circuit line 150 can be connected to and in contact with a large area of the thin film fine line 137 exposed in the opening 142 in the passivation layer 140. The plane 1000 is substantially parallel to an active surface 114 of the semiconductor substrate 110. The ratio of the projection profile of the connection between the thick metal circuit line 150 and the thin film fine line metal line 137 projecting to the plane 1000 to that of the thin film fine line 137 projecting to the plane 1000 is, for example, large than 0.5, or 0.8, or even substantially equal to 1.0. The thin film fine line metal 137 has an area exposed by the large opening 142 in the passivation layer 140 that is, for example, larger than 30,000 $\mu m^2$, or larger than 80,000 $\mu m^2$, or even larger than 150,000 $\mu m^2$. The projection profile of the connection between the thick metal circuit line 150 and the thin film fine line metal layer 136 projecting to the plane 1000 has an extension length t of larger than 500 $\mu m$, or larger than 800 $\mu m$, or even larger than 1,200 $\mu m$, for example.

In the embodiment, the relation of the connection between the thick metal circuit line 150 and the thin film fine line 137 can refer to the first embodiment and particularly the description illustrated in FIGS. 4, 5 and 5A.

Alternatively, as shown in FIGS. 26 and 27, the thick metal circuit line 350 may have a bottom large area connected to a large area of the thick metal circuit line 350, and also may have a top large area connected to a large area of a the thick metal circuit line 350. can also be connected to a large area of a thin film fine line 337 of the thin film fine line metal layer 336 exposed by a large opening 342 in the passivation layer 340. The plane 1050 is substantially parallel to an active surface 314 of the semiconductor substrate 310. The ratio of the projection profile of the connection between the thick metal circuit line 350 and the thin film fine line metal line 337 projecting to the plane 1000 to that of the thin film fine line 337 projecting to the plane 1000 is, for example, large than 0.5, or 0.8, or even substantially equal to 1.0. The thin film fine line metal 337 has an area exposed by the large opening 342 in the passivation layer 340 that is, for example, larger than 30,000 $\mu m^2$, or larger than 80,000 $\mu m^2$, or even larger than 150,000 $\mu m^2$. The projection profile of the connection between the thick metal circuit line 350 and the thin fine line metal layer 336 projecting to the plane 1000 has an extension length t of larger than 500 $\mu m$, or larger than 800 $\mu m$, or even larger than 1,200 $\mu m$, for example.

In the embodiment, the relation of the connection between the thick metal circuit line 350 and the thin film fine line 337 can refer to the first embodiment and particularly the description illustrated in FIGS. 4, 5 and 5A.

Referring to FIGS. 24 and 25, a signal may be transmitted from one of the electronic devices, such as 112a, to the thin film fine line 137 and the thick metal circuit layers 150 and 350 sequentially through the thin film fine line metal layers 132 and 134. Next, the signal may be transmitted from the thin film fine line 137 and the thick metal circuit layers 150 and 350 to the other one of the electronic devices, such as 112b, sequentially through the thin film fine line metal layers 134 and 132. The thin film fine line 137 and the thick metal circuit lines 150 and 350 can be used for intra-chip signal transmission. The signal transmitted from the electrical device 112a to the thin film fine line 137 and the thick metal circuit lines 150 and 350 can also be transmitted to the inside of the semiconductor chip 300 and, for example, to the electronic device, such as 312a, through the opening 342 in the passivation layer 340 and sequentially through the thin film fine line metal layers 336, 334 and 332. The thin film fine line 137 and the thick metal circuit lines 150 and 250 can be used for signal transmission between the semiconductor chips 100 and 300.

Alternatively, referring to FIGS. 24 and 25, a signal may be transmitted from one of the electronic devices, such as 312a, to the thick metal circuit lines 350 and 150 and the thin film fine line 137 sequentially through the thin film fine line metal layers 332, 334 and 336 and then through the opening 342 in the passivation layer 340. Next, the signal may be transmitted from the thick metal circuit lines 350, 150 and the thin film fine line metal 137 to the electronic devices, such as 112a and 112b, sequentially through the thin film fine line metal layers 134 and 132.

The difference between FIG. 24 and FIG. 25 is that whether a polymer layer 180 is formed over the passivation layer 140. The structure of the semiconductor chip 100 in FIGS. 24 and 25 is similar to and can refer to that of the semiconductor chip 100 in FIGS. 4 and 5.

Referring to FIGS. 26 and 27, a signal may be transmitted from one of the electronic devices, such as 112a, to the thin film fine line 137, the thick metal circuit layers 150 and 350 and the thin film fine line 337 sequentially through the thin film fine line metal layers 132 and 134. Next, the signal may be transmitted from the thin film fine line 137, the thick metal circuit layers 150 and 350 and the thin film fine line 337 to the other one of the electronic devices, such as 112b, sequentially through the thin film fine line metal layers 134 and 132. The thin film fine line 137, the thick metal circuit lines 150 and 350 and the thin film fine line 337 can be used for intra-chip signal transmission. The signal transmitted from the electrical device 112a to the thin film fine line 137, the thick metal circuit lines 150 and 350 and the thin film fine line 337 can also be transmitted to the inside of the semiconductor chip 300 and, for example, to the electronic device, such as 312a, sequentially through the thin film fine line metal layers 334 and 332. The thin film fine line 137, the thick metal circuit lines 150 and 250 and the thin film fine line 337 can be used for signal transmission between the semiconductor chips 100 and 300.

Alternatively, referring to FIGS. 24 and 25, a signal may be transmitted from one of the electronic devices, such as 312a, to the thin film fine line 337, the thick metal circuit lines 350 and 150 and the thin film fine line 137 sequentially through the thin film fine line metal layers 332 and 334. Next, the signal may be transmitted from the thin film fine line 337, the thick metal circuit lines 350, 150 and the thin film fine line metal 137 to the electronic devices, such as 112a and 112b, sequentially through the thin film fine line metal layers 134 and 132.

The difference between FIG. 26 and FIG. 27 is that whether polymer layers 180 and 380 are respectively formed over the passivation layers 140 and 340. The structure of the semiconductor chip 100 in FIGS. 24 and 25 is similar to and can refer to that of the semiconductor chip 100 in FIGS. 4 and 5.

Referring to FIG. 26, there is no polymer layer formed on the passivation layer 340 when the thick metal circuit line 350 and the bump 360 are simultaneously formed on the thin film fine line metal layer 336. The thickness H of the bump 360 is substantially the same as the thickness J of the thick metal circuit line 350. The thick metal circuit line 350 has substantially the same metal structure as the bump 360. The thickness H of the bonding pad 360 and the thickness J of the thick metal circuit line 350 are thicker than 1 μm and, preferably, between 2 μm and 30 μm.

Referring to FIG. 27, a patterned polymer layer 380 is formed over the passivation layer 340. The thickness K of the polymer layer is, for example, thicker than 1 μm and, preferably, between 2 μm and 30 μm. The polymer layer 280 can be made of polyimide (PI), benzocyclobutene (BCB), parylene, porous dielectric material, or elastomer, for example. The opening 382 in the polymer layer 380 exposes the thin film fine line metal line 337.

After forming the patterned polymer layer 380, the thick metal circuit line 350 and the bonding pad 360 are simultaneous formed on the thin film fine line metal layer 336. The thickness H of the bonding pad 360 bulging over the opening 382 in the polymer layer 380 is substantially the same as the thickness J of the thick metal circuit line 350 bulging over the opening 382 in the polymer layer 380. The metal structure of the bonding pad 360 is substantially the same as that of the thick metal circuit line 350. The thickness H of the bonding pad 360 bulging over the opening 382 in the polymer layer 380 and the thickness J of the thick metal circuit line 350 bulging over the opening 382 in the polymer layer 380 are, for example, thicker than 1 μm, and, preferably, between 2 μm and 30 μm.

2. Used for Intra-Chip Signal Transmission Between Two Semiconductor Chips.

FIGS. 28-33 are schematic cross-section representations showing another type of the chip packages according to a second embodiment. The semiconductor chips 100 and 300 in FIGS. 28-33 are similar to the semiconductor chips 100 and 300 in FIGS. 22-27. The difference is that the thick metal circuit lines 150 and 350 of the semiconductor chips 100 and 300 are used for the signal transmission between the semiconductor chips 100 and 300, not for intra-chip signal transmission.

Figure 28:
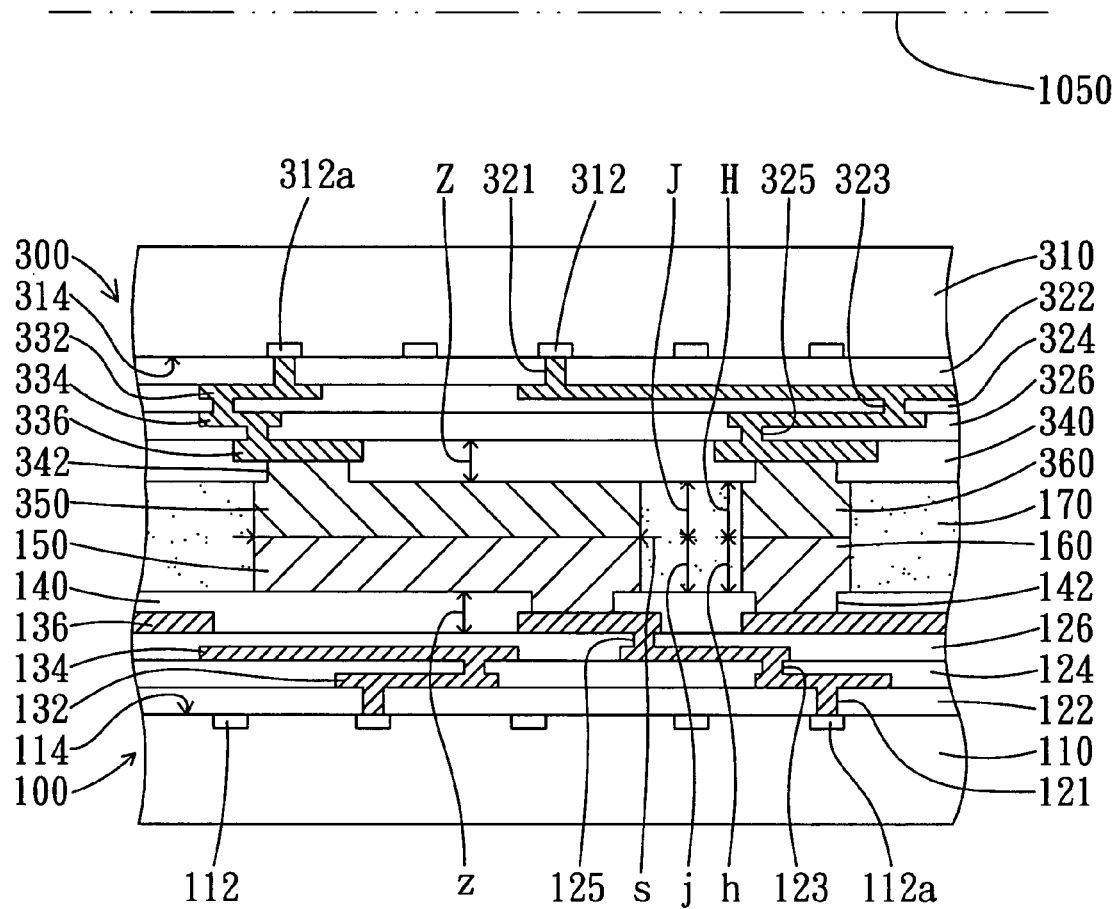
Figure 29:
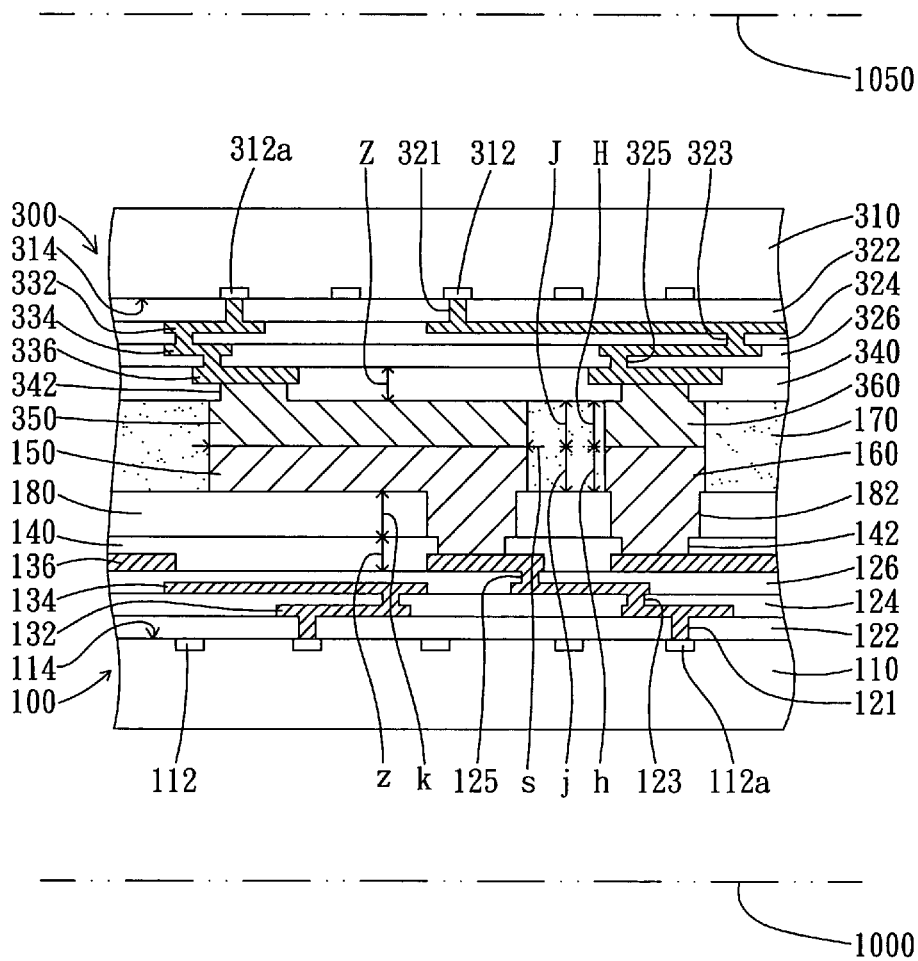

Referring to FIGS. 28 and 29, a signal may be transmitted from one of the electronic devices 112, such as 112a, to the thick metal circuit lines 150 and 350 sequentially through the thin film fine line metal layers 132, 134 and 136 and then through the opening 142 in the passivation layer 140. Next, the signal may be transmitted from the thick metal circuit lines 150 and 350 to the electronic device, such as 312a, through the opening 342 in the passivation layer 340 and then sequentially through the thin film fine line metal layers 336, 334 and 332. Alternatively, a signal may be transmitted from one of the electronic devices, such as 312a, to the thick metal circuit lines 350 and 150 sequentially through the thin film fine line metal layers 332, 334 and 336 and then through the opening 342 in the passivation layer 340. Next, the signal may be transmitted from the thick metal circuit lines 350 and 150 to the electronic device, such as 112a, through the opening 142 in the passivation layer 140 and then sequentially through the thin film fine line metal layers 136, 134 and 132. The thick metal circuit lines 150 and 350 of the semiconductor chips 100 and 300 can be used for signal transmission between the semiconductor chips 100 and 300.

Figure 30:
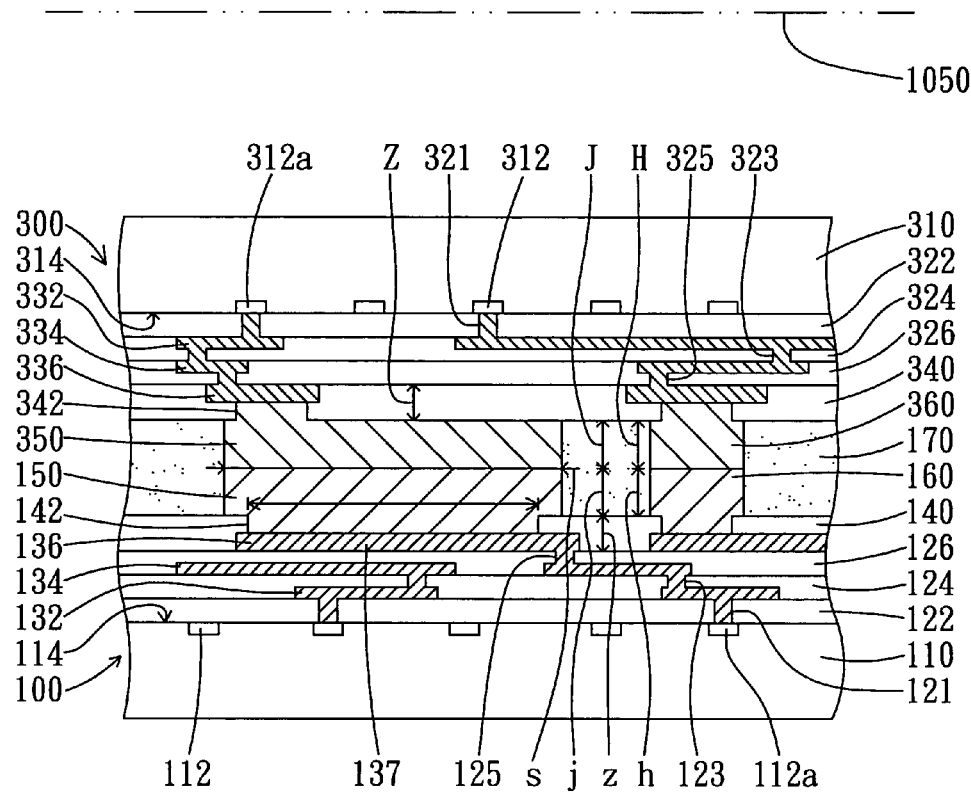
Figure 31:
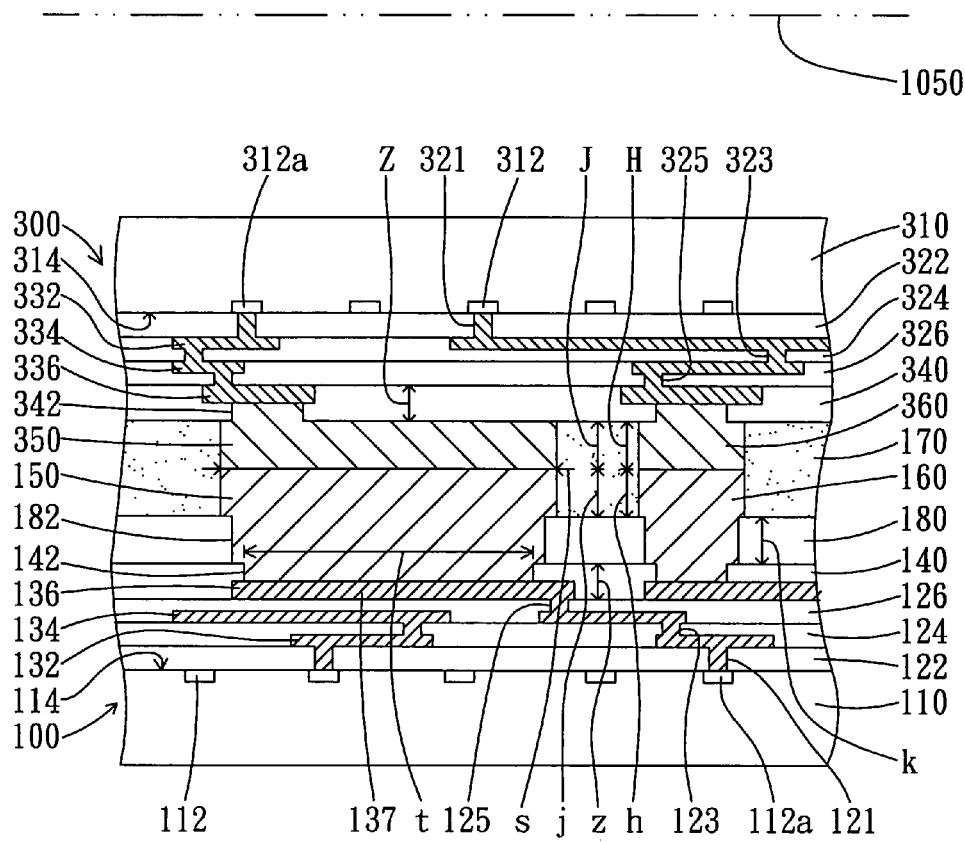

Referring to FIGS. 30 and 31, a signal may be transmitted from one of the electronic devices, such as 112a, to the thin film fine line 137 and the thick metal circuit lines 150 and 350 sequentially through the thin film fine line metal layers 132, 134 and then through the opening 142 in the passivation layer 140. Next, the signal may be transmitted from the thin film fine line 137 and the thick metal circuit line 150 and 350 to the electronic device, such as 312a, sequentially through the opening 342 in the passivation layer 340 and then through the thin film fine line metal layers 336, 334 and 332. Alternatively, a signal may be transmitted from one of the electronic devices, such as 312a, to the thick metal circuit lines 350 and 150 and the thin film fine line 137, sequentially through the thin film fine line metal layers 332, 334 and 336 and then through the opening 342 in the passivation layer 340. Next, the signal may be transmitted from the thick metal circuit line 350 and 150 and the thin film fine line metal 137 to the electronic device, such as 112a, sequentially through the thin film fine line metal layers 134 and 132. The thick metal circuit lines 150 and 350 of the semiconductor chips 100 and 300 can be used for signal transmission between the semiconductor chips 100 and 300.

Figure 32:
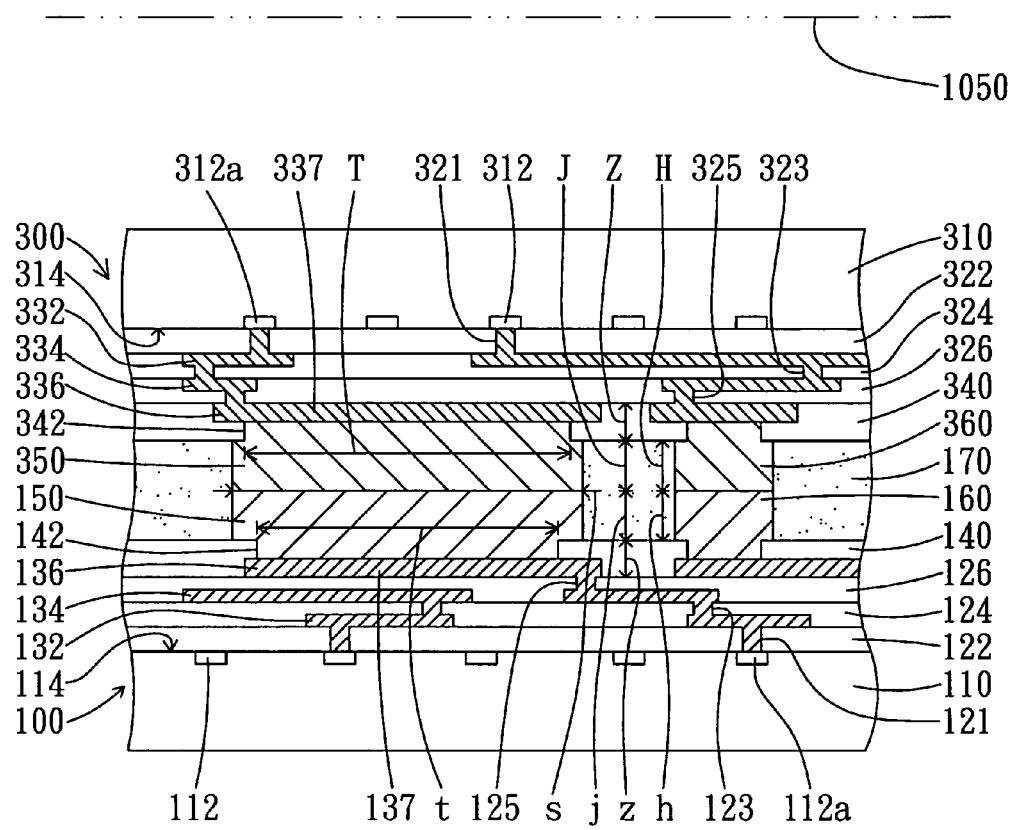
Figure 33:
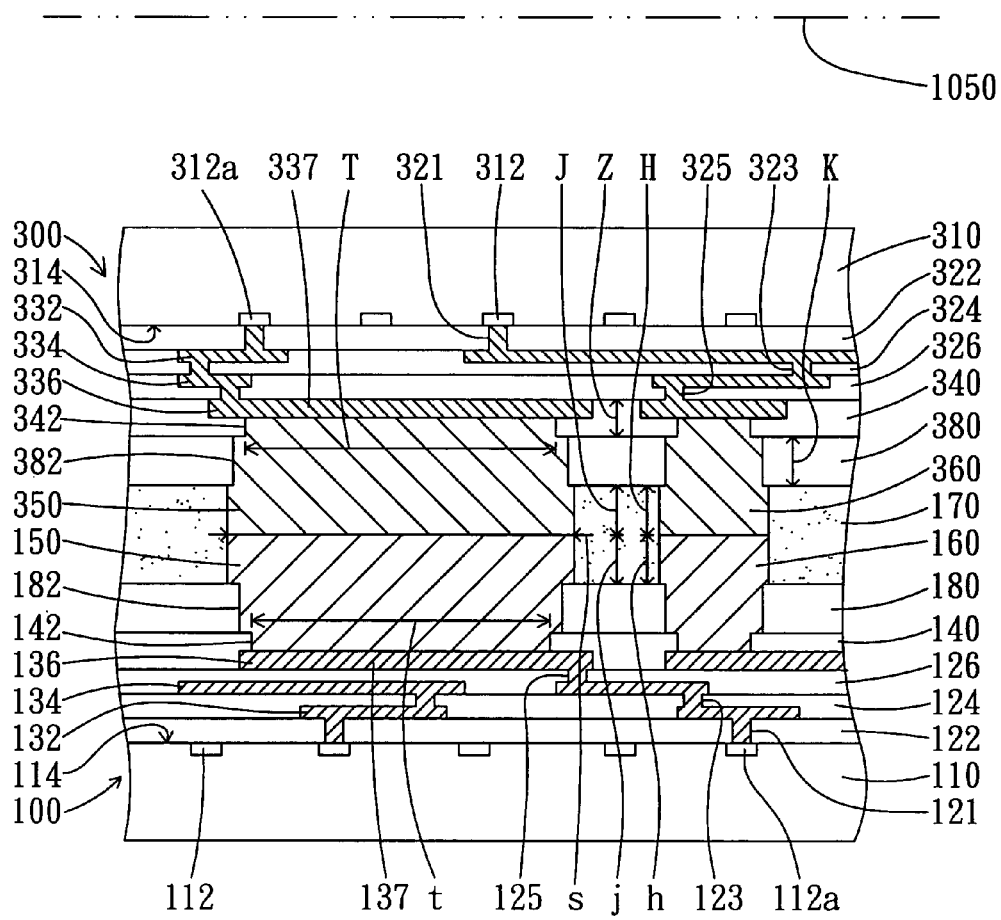
Figure 34:
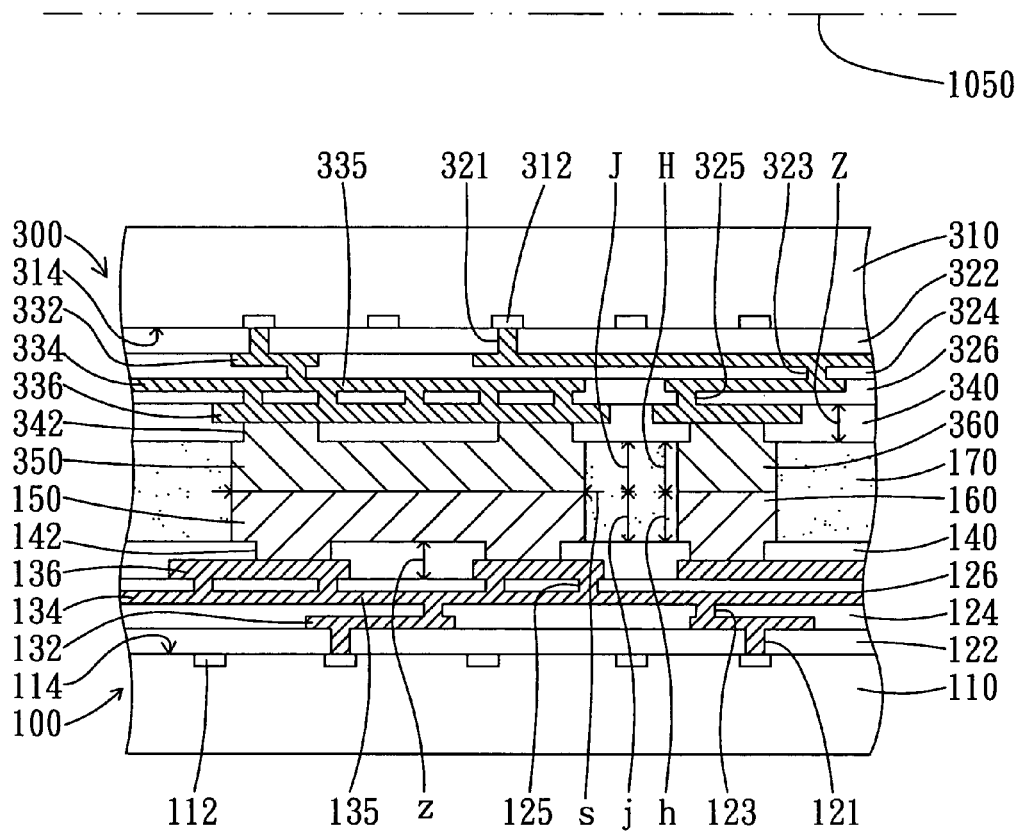
Figure 35:
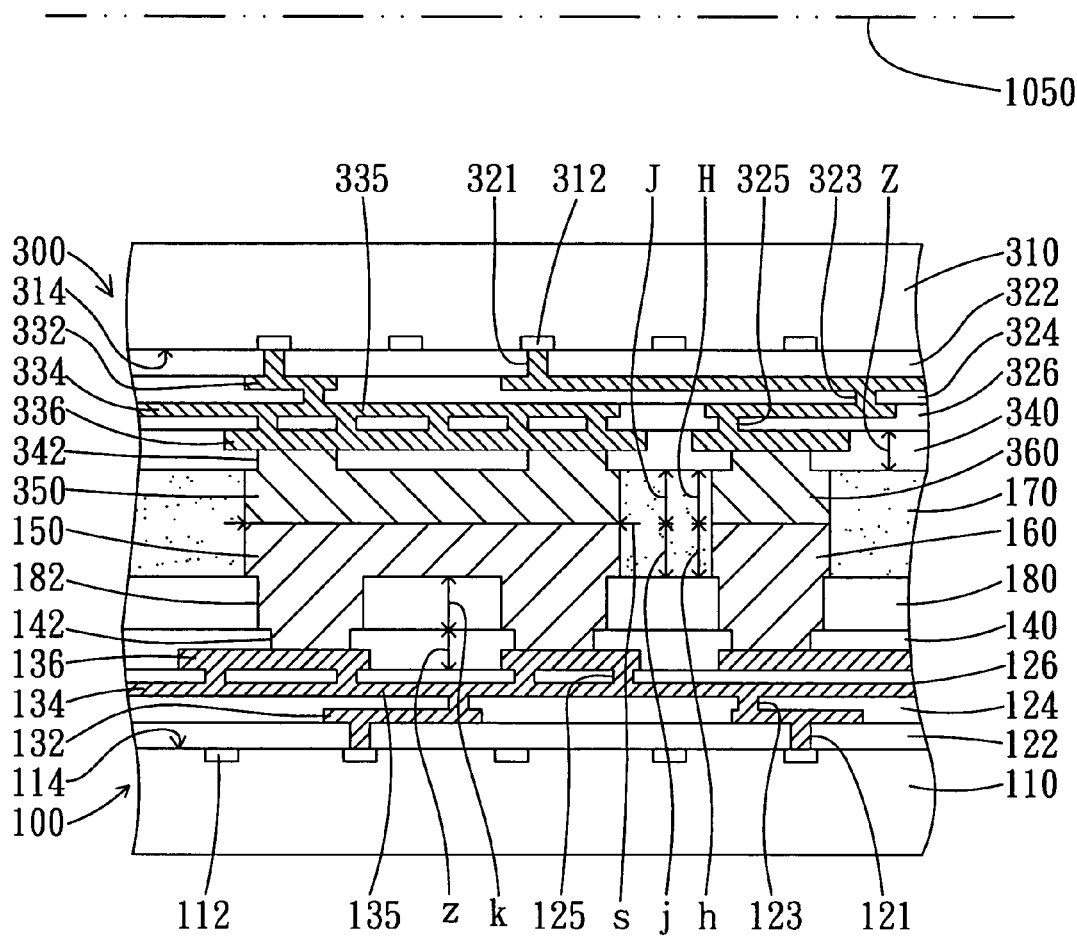
Figure 36:
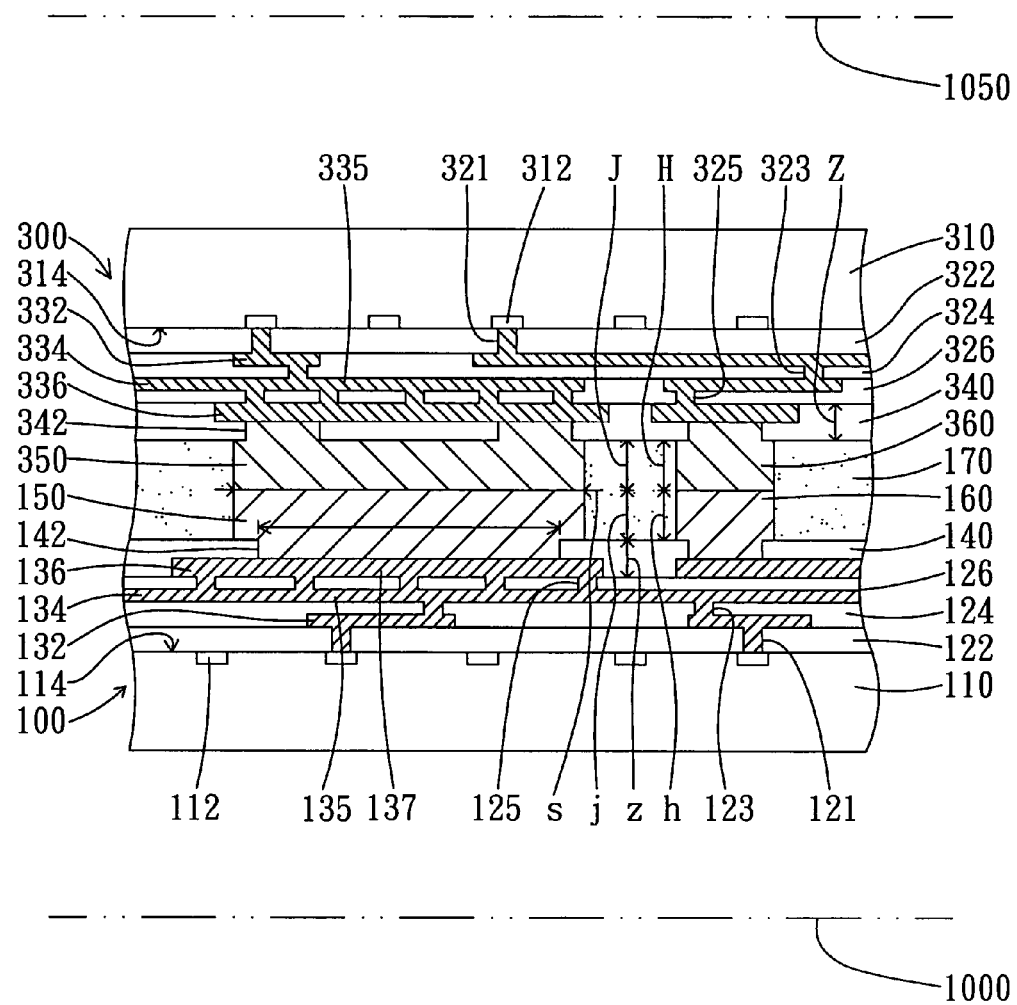
Figure 37:
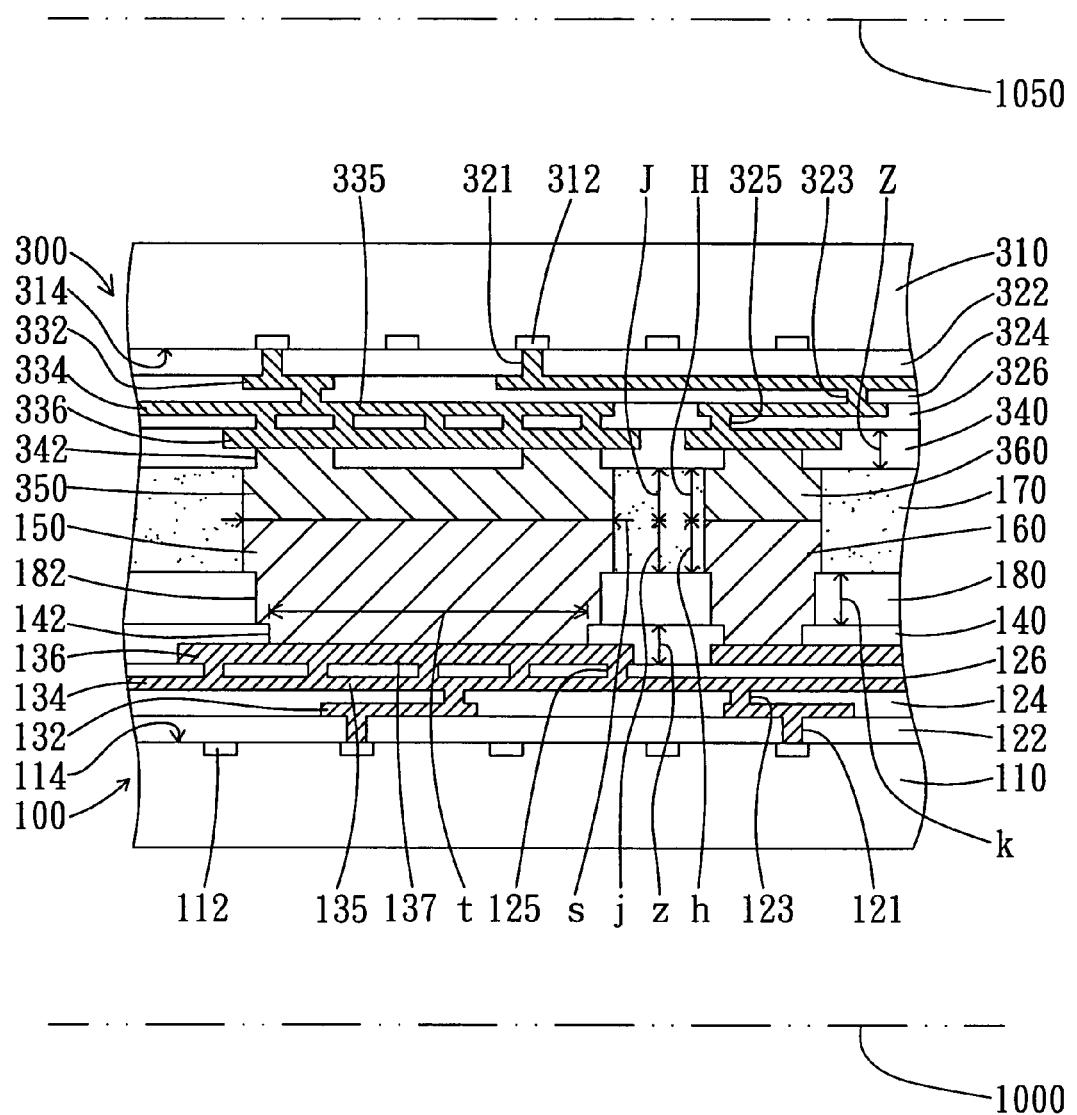

Referring to FIGS. 32 and 33, a signal may be transmitted from one of the electronic devices, such as 112a, to the thin film fine line 137, the thick metal circuit lines 150 and 350, and the thin film fine line 337 sequentially through the thin film fine line metal layers 132 and 134. Next, the signal may be transmitted from the thin film fine line 137, the thick metal circuit lines 150 and 350, and thin film fine line 337 to the electronic device, such as 312a, sequentially through the thin film fine line metal layers 334 and 332. Alternatively, a signal may be transmitted from one of the electronic devices, such as 312a, to the thin film fine line 337, the thick metal circuit lines 350 and 150 and the thin film fine line 137, sequentially through the thin film fine line metal layers 332, 334 and then through the opening 342 in the passivation layer 340. Next, the signal may be transmitted from the thin film fine line 337, the thick metal circuit lines 350 and 150 and the thin film fine line 137 to the electronic device, such as 112a, sequentially through the thin film fine line metal layers 134 and 132. The thick metal circuit lines 150 and 350 of the semiconductor chips 100 and 300 can be used for signal transmission between the semiconductor chips 100 and 300.

As mentioned above, the thick metal circuit lines 150 and 350 of the semiconductor chip 100 and 300 can be used to transmit the signal in a lateral direction and also in a vertical direction between the semiconductor chips 100 and 300. The thick metal circuit line 150 of the semiconductor chip 100 may have a large area connected to a large area of the thick metal circuit line 350 of the semiconductor chip 300, as shown in FIGS. 28-33. Optionally, the thin film fine line 137 may have a large area connected to the thick metal circuit line 150, as shown in FIGS. 30-33. Optionally, the thin film fine line 337 may have a large area connected to the thick metal circuit line 350, as shown in FIGS. 32 and 33. Therefore, the above-mentioned chip package can improve its electrical performance and can reduce its noise occurrence.

Referring to FIGS. 28-33, the semiconductor chip 100 can transmit or receive a signal to or from the semiconductor chip 300 via the bumps 160 and 360.

3. Used for Power Bus or Plane or Ground Bus or Plane.

FIGS. 34-39 are schematic cross-section representation showing another type of chip packages according to a second embodiment. The semiconductor chips 100 and 300 in FIGS. 34-39 are similar to and can refer to the semiconductor chips 100 and 300 in FIGS. 22-27. The difference is that the thick metal circuit lines 150 and 350 of the semiconductor chips 100 and 300 are used for a power bus or plane or ground bus or plane that can provide a stable power voltage or a stable ground voltage for the semiconductor chips 100 and 300.

Figure 38:
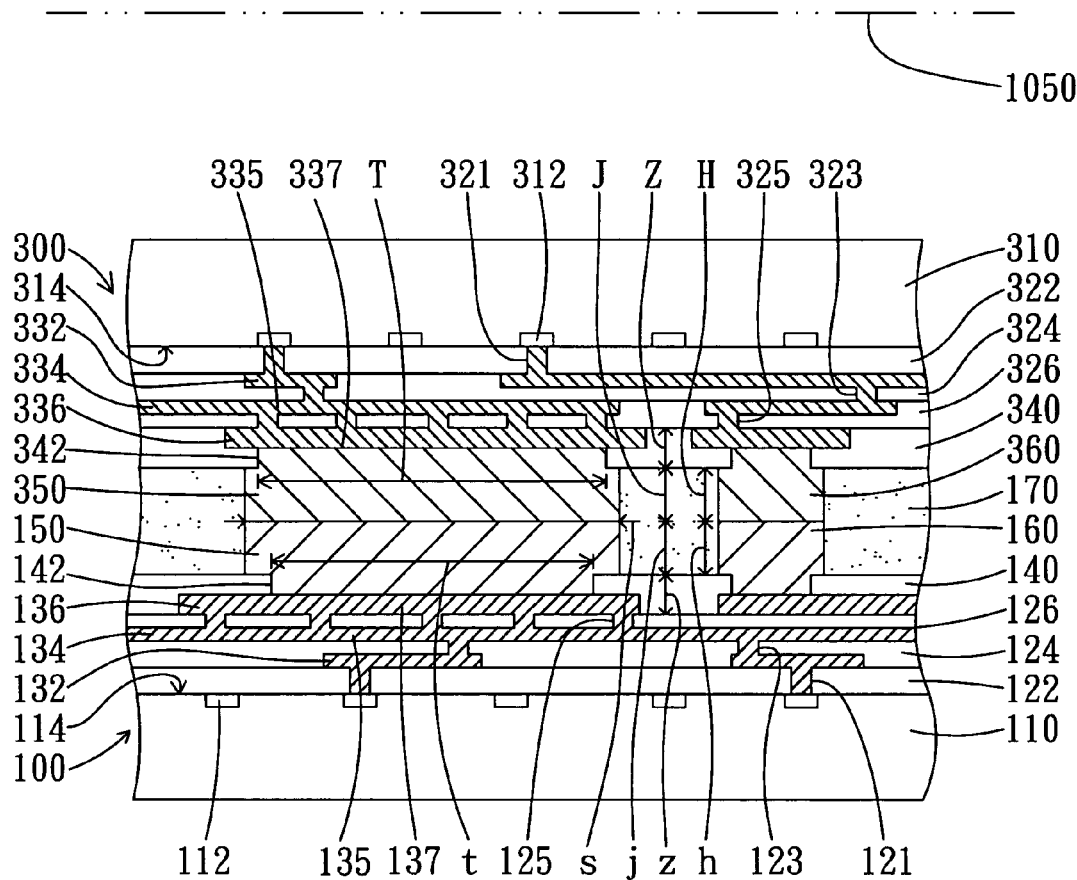
Figure 39:
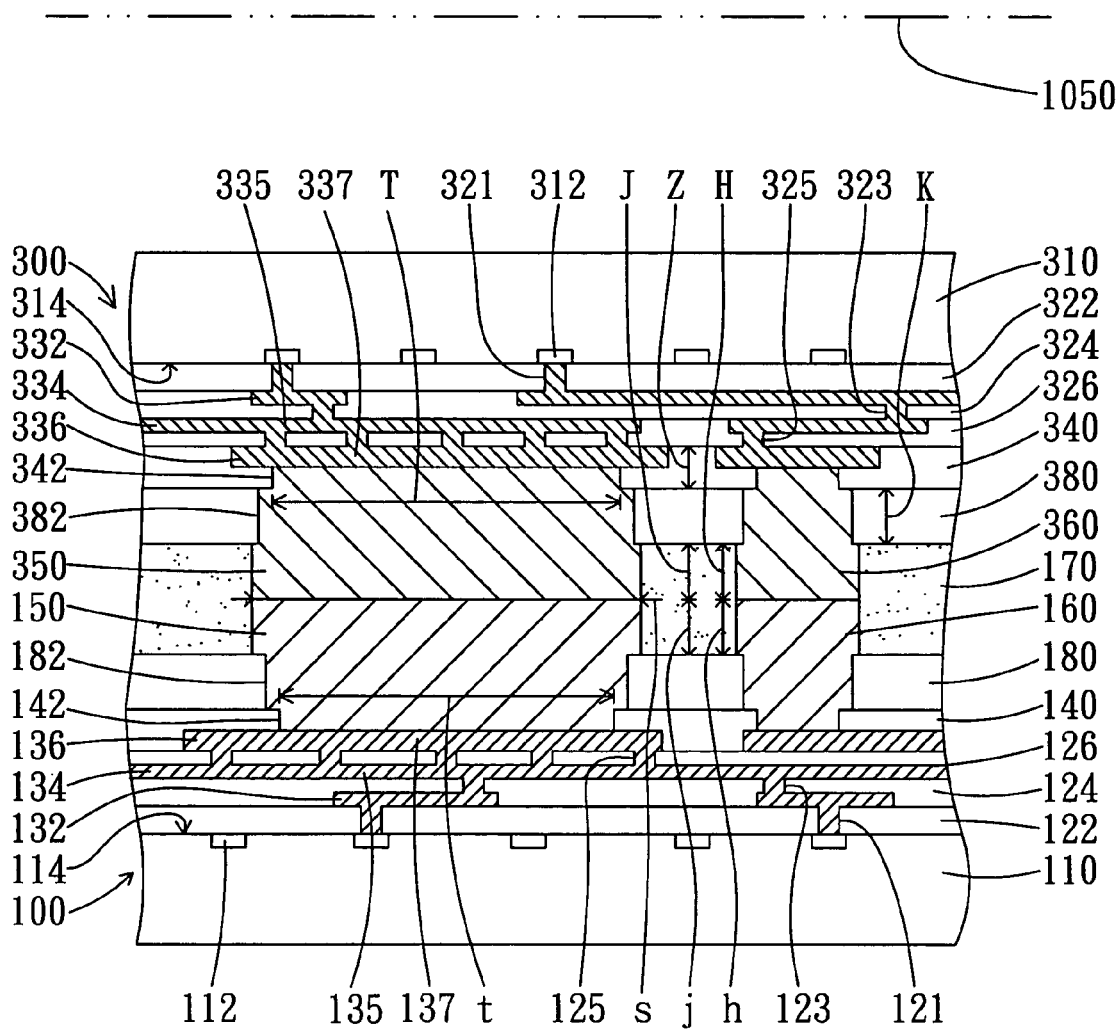
Figure 40:
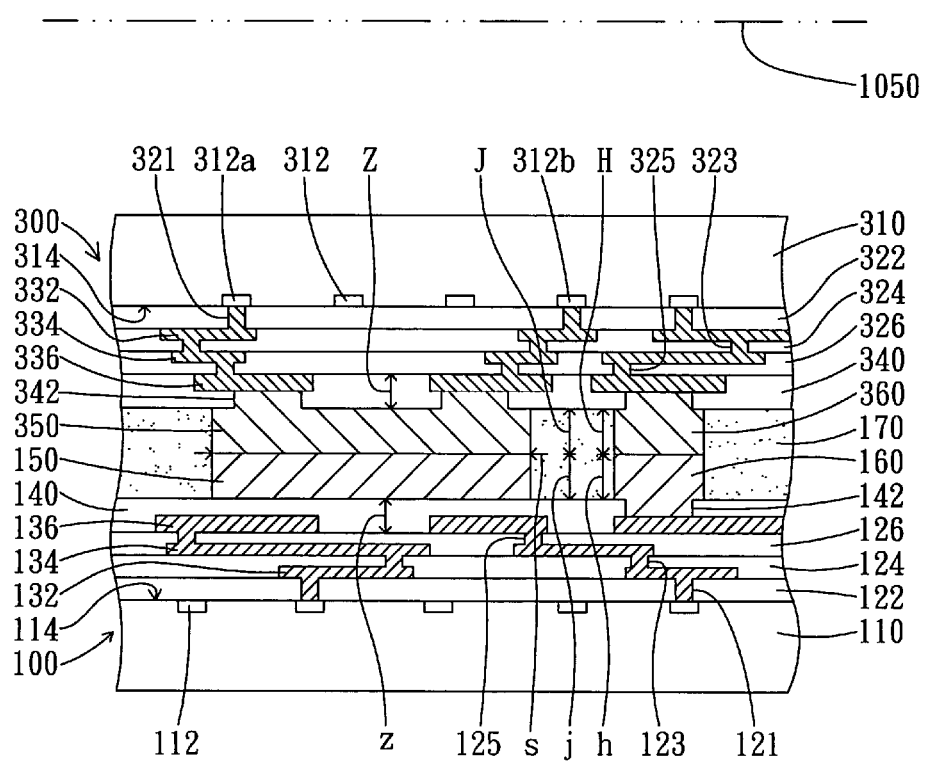
Figure 41:
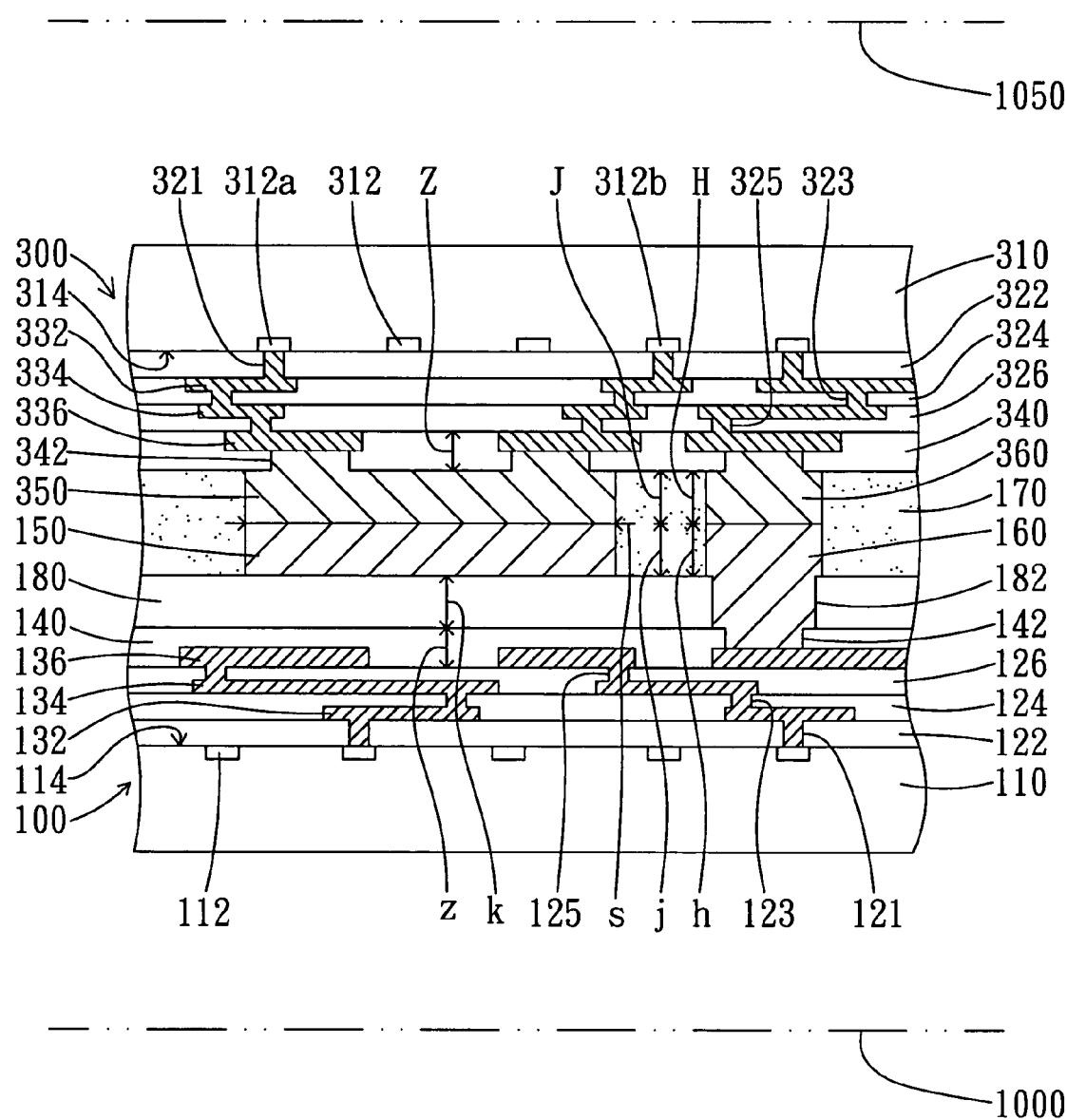

Referring to FIGS. 34-39, in the case of the thick metal circuit lines 150 and 350 of the semiconductor chips 100 and 300 serving as a power bus or plane, they can be electrically connected to a power buses or planes 135 and 335 of the thin film metal layer 134 and 334. The thick metal circuit line 150 of the semiconductor chip 100 may have a large area connected to a large area of the thick metal circuit line 350 of the semiconductor chip 300, as shown in FIGS. 34-39. Optionally, the thin film fine line 137 may have a large area connected to a large area of the thick metal circuit line 150, as shown in FIGS. 36-39. Optionally, the thin film fine line 337 may have a large area connected to a large area of the thick metal circuit line 350, as shown in FIGS. 38 and 39. Therefore, the above-mentioned chip package can provide a stable power voltage.

Referring to FIGS. 34-39, in the case of the thick metal circuit lines 150 and 350 of the semiconductor chips 100 and 300 serving as a ground bus or plane, they can be electrically connected to a ground buses or planes 135 of the thin film metal layer 134. The thick metal circuit line 150 of the semiconductor chip 100 may have a large area connected to a large area of the thick metal circuit line 350 of the semiconductor chip 300, as shown in FIGS. 34-39. Optionally, the thin film fine line 137 may have a large area connected to a large area of the thick metal circuit line 150, as shown in FIGS. 36-39. Optionally, the thin film fine line 337 may have a large area connected to a large area of the thick metal circuit line 350, as shown in FIGS. 38 and 39. Therefore, the above-mentioned chip package can provide a stable ground voltage.

4. Used for Signal Transmission for Only One of Two Bonded Semiconductor Chips

FIGS. 40-43 are schematic cross-section representation showing another type of chip packages according to a second embodiment. The semiconductor chips 100 and 300 in FIGS. 40-43 is similar to and can refer to the semiconductor chips 100 and 300 in FIGS. 21-27. The difference is that the thick metal circuit line 150 formed on a passivation layer or polymer layer of the semiconductor chip 100 is disconnected from the thin film fine line metal layers 132, 134, and 136 of the semiconductor chip 100. The thick metal circuit lines 150 and 350 are used for the signal transmission only for the semiconductor chip 300.

Figure 42:
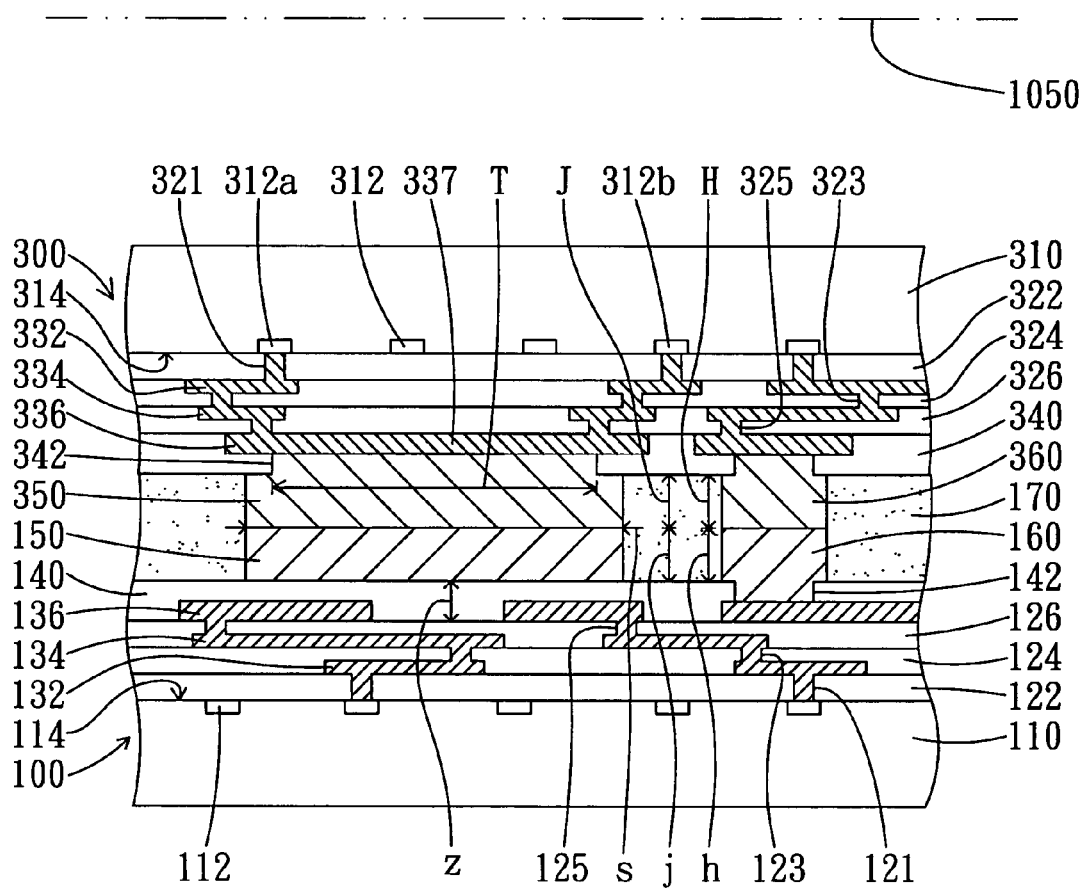
Figure 43:
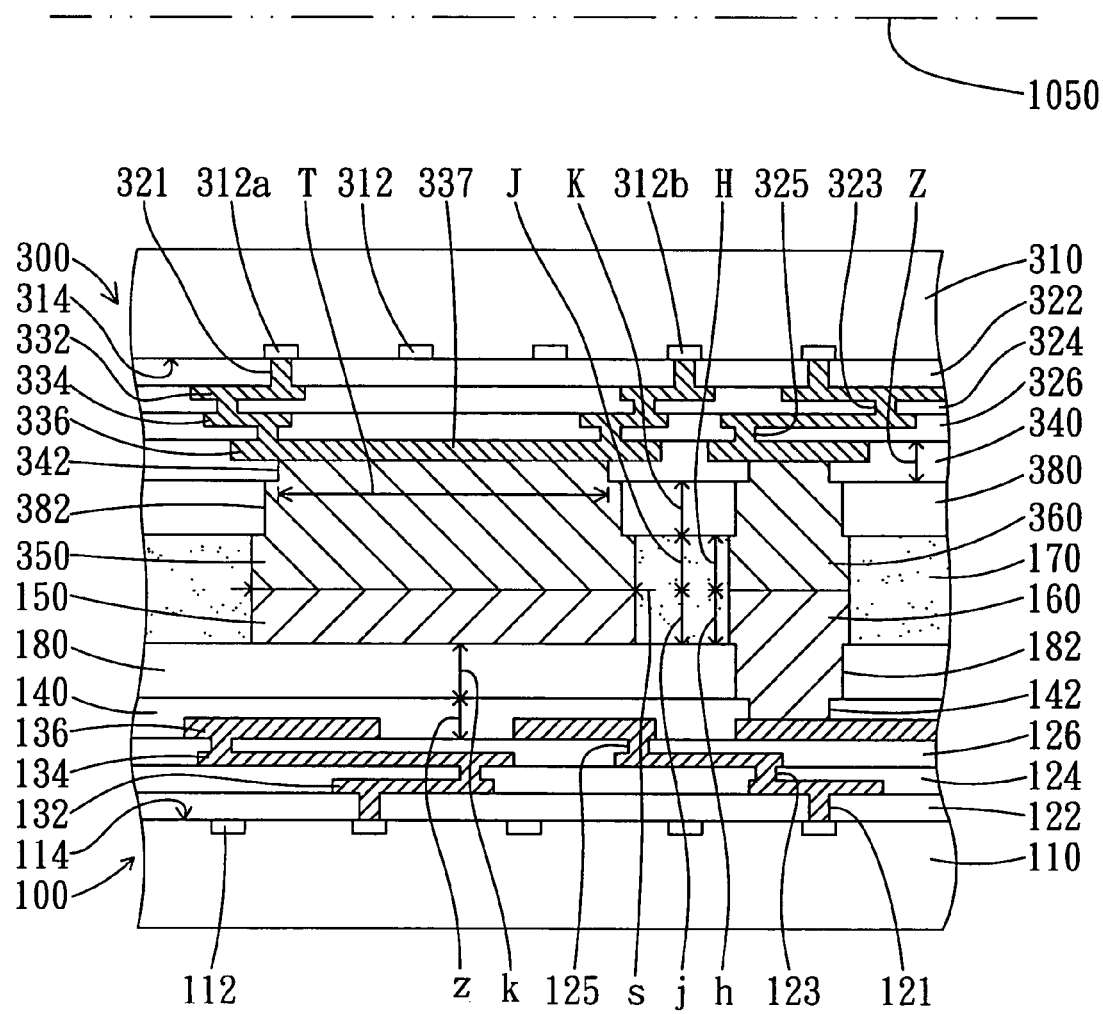
Figure 44:
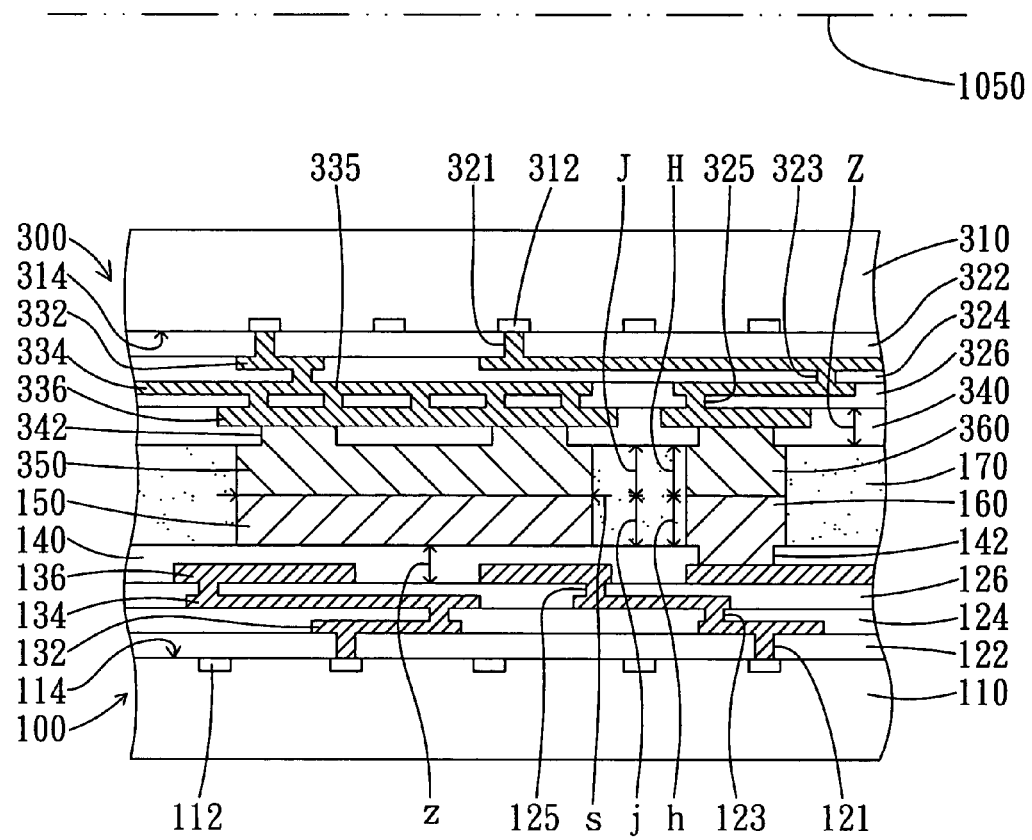
Figure 45:
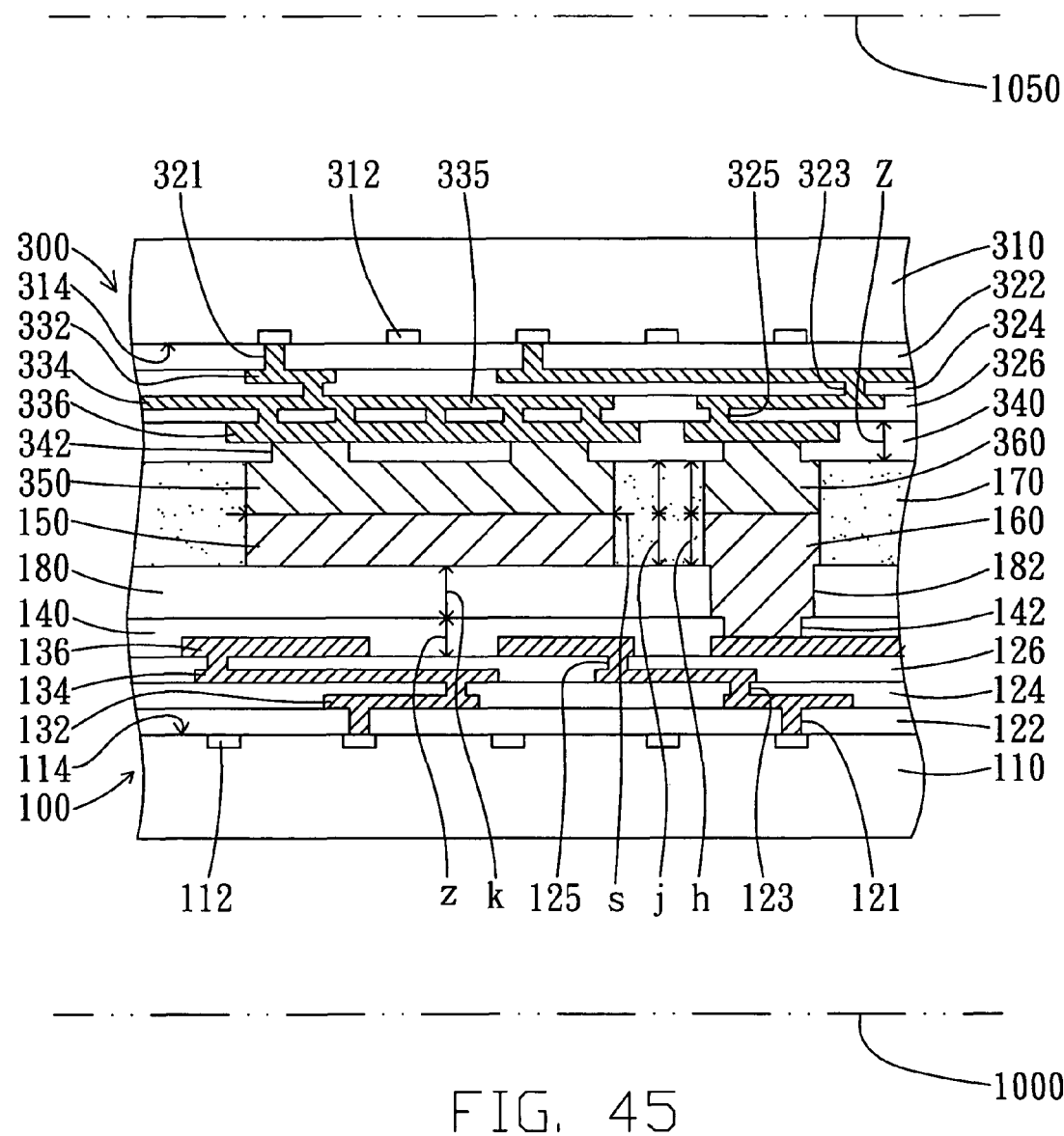

Referring to FIG. 40-43, a signal may be transmitted from one of the electronic devices, such as 312a, to the thick metal circuit lines 150 and 350 sequentially through the thin film fine line metal layers 332, 334 and 336, and then through the opening 342 in the passivation layer 340. Next, the signal may be transmitted from the thick metal circuit lines 150 and 350 to the other one of the electronic devices, such as 312b, through the opening 342 in the passivation layer 340 and then sequentially through the thin film fine line metal layers 336, 334 and 332. The signal does not be transmitted to the inside of the semiconductor chip 100. The thick metal circuit lines 150 and 350 can be used for intra-chip signal transmission only for the semiconductor chip 300, but not for signal transmission between the semiconductor chips 100 and 300. The thick metal circuit line 150 of the semiconductor chip 100 may have a large area connected to a large area of the thick metal circuit line 350 of the semiconductor chip 300, as shown in FIGS. 40-43. Optionally, the thin film fine line 337 may have a large area connected to the thick metal circuit line 350, as shown in FIGS. 42 and 43. Therefore, the above-mentioned chip package can improve its electrical performance and can reduce its noise occurrence.

5. Used for Power Bus or Plane or Ground Bus or Plane for Only One of Two Bonded Semiconductor Chips.

FIGS. 44-47 are schematic cross-section representations showing another type of chip packages according to a second embodiment. The semiconductor chips 100 and 300 in FIGS. 44-47 is similar to and can refer to the semiconductor chips 100 and 300 in FIGS. 21-27. The difference is that the thick metal circuit line 150 formed on a passivation layer or polymer layer of the semiconductor chip 100 is disconnected from the thin film fine line metal layers 132, 134, and 136 of the semiconductor chip 100. The thick metal circuit lines 150 and 350 are used for a power bus or plane or a ground bus or plane only for the semiconductor chip 300. The thick metal circuit lines 150 and 350 can provide a stable power voltage or a stable ground voltage for the semiconductor chip 300.

Figure 46:
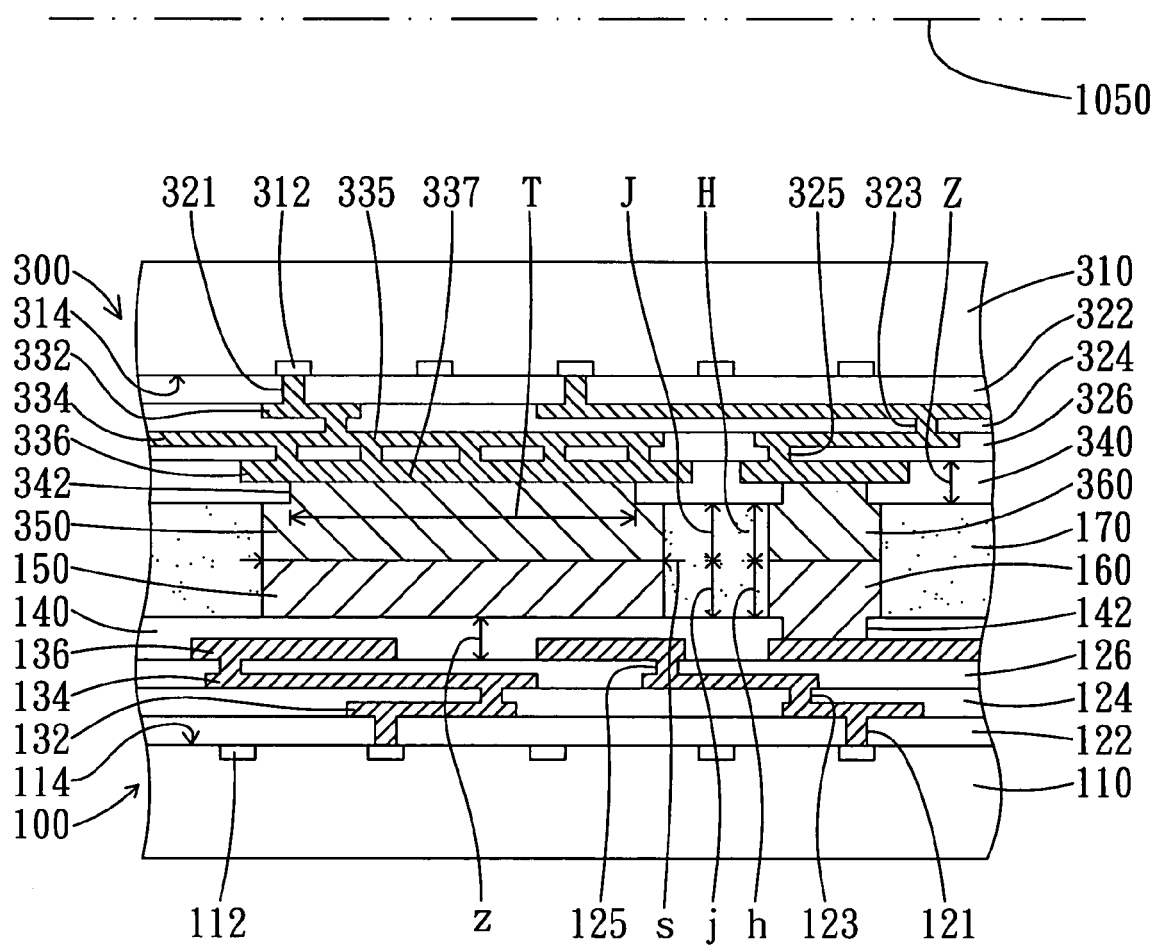
Figure 47:
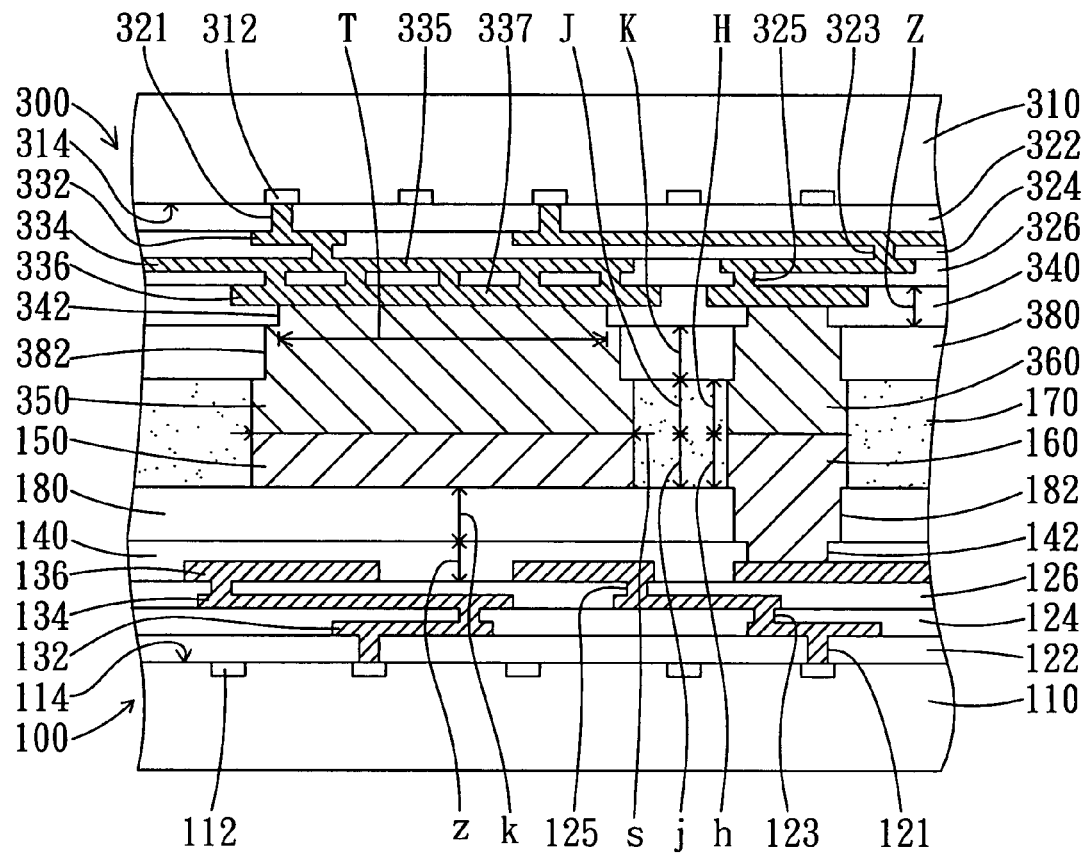

Referring to FIGS. 44-47, in the case of the thick metal circuit lines 150 and 350 of the semiconductor chips 100 and 300 serving as a power bus or plane, they can be electrically connected to a power bus or plane 335 of the thin film metal layer 334. The thick metal circuit line 150 of the semiconductor chip 100 may have a large area connected to a large area of the thick metal circuit line 350 of the semiconductor chip 300, as shown in FIGS. 44-47. Optionally, the thin film fine line 337 may have a large area connected to a large area of the thick metal circuit line 350, as shown in FIGS. 46 and 47. Therefore, the above-mentioned chip package can provide a stable power voltage.

Referring to FIGS. 44-47, in the case of the thick metal circuit lines 150 and 350 of the semiconductor chips 100 and 300 serving as a ground bus or plane, they can be electrically connected to a ground bus or plane 335 of the thin film metal layer 334. The thick metal circuit line 150 of the semiconductor chip 100 may have a large area connected to a large area of the thick metal circuit line 350 of the semiconductor chip 300, as shown in FIGS. 44-47. Optionally, the thin film fine line 337 may have a large area connected to a large area of the thick metal circuit line 350, as shown in FIGS. 46 and 47. Therefore, the above-mentioned chip package can provide a stable ground voltage.

6. Metal Layers of Thick Metal Circuit Lines.

In the embodiment, the thick metal circuit line 150 of the semiconductor chip 100 may have the same metal layers as illustrated in FIGS. 16 and 17.

Figure 48:
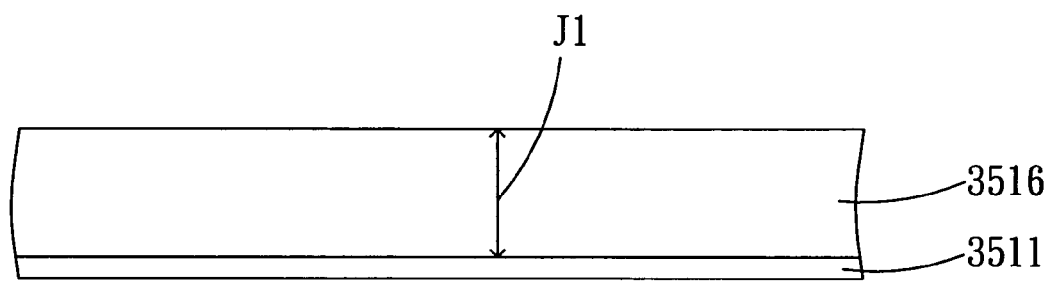
FIGS. 48-49 are schematic cross-section representations showing metal layers of the thick circuit line 350 of the semiconductor chip 300 in the second embodiment of the present invention.

FIG. 48 is a schematic cross-section representation showing one type of the metal layers of the thick metal circuit line 350 of the semiconductor chip 300 according to a second embodiment. The thick metal circuit line 350 of the semiconductor chip 300, for example, comprises a bottom metal layer 3511 and a top metal layer 3516. The above-mentioned thick metal circuit line 350 of the semiconductor chip may comprise an adhesion/barrier layer 3511 and a bulk metal layer 3516, for example. The adhesion/barrier metal layer 3511 and the bulk metal layer 3516 may be formed on the passivation layer 340, as shown in FIGS. 21-25, 28-31, 34-37, 40, 41, 44 and 45, or on the polymer layer 380, or on the thin film fine line 337, as shown in FIGS. 26, 27, 32, 33, 38, 39, 42, 43, 46 and 47. The bulk metal layer 3516 is formed upon the adhesion/barrier layer 3511. The bump 360 of the semiconductor chip 300 can have the same deposited metal layers of the thick metal circuit line 350 as shown in FIG. 48.

In a case, the adhesion/barrier layer 3511 may comprise chromium, a chromium-copper alloy, titanium, a titanium-tungsten alloy, titanium nitride, tantalum or tantalum nitride, for example. The bulk metal layer 3516 may be a single metal layer and may have a thickness a 1 thicker than 1 μm (1 micrometer), and preferably between 2 μm (2 micrometers) and 30 μm (30 micrometers), wherein the bulk metal layer 312*b* may comprise gold with greater than 90 weight percent, and, preferably, greater than 97 weight percent. Alternatively, a seed layer (unshown), such as gold, can be sputtered on the adhesion/barrier layer 3511, preferably comprising a titanium-tungsten alloy, and then the bulk metal layer 3516 is electroplated on the seed layer.

In another case, the adhesion/barrier layer 3511 may comprise chromium, a chromium-copper alloy, titanium, a titanium-tungsten alloy, titanium nitride, tantalum or tantalum nitride, for example. The bulk metal layer 3516 may be a single metal layer and may have a thickness a 1 thicker than 1 μm (1 micrometer), and preferably between 2 μm (2 micrometers) and 30 μm (30 micrometers), wherein the bulk metal layer 312*b* may comprise silver with greater than 90 weight percent, and, preferably, greater than 97 weight percent. Alternatively, a seed layer (unshown), such as silver, can be sputtered on the adhesion/barrier layer 3511, preferably comprising a titanium-tungsten alloy, and then the bulk metal layer 3516 is electroplated on the seed layer.

In another case, the adhesion/barrier layer 3511 may comprise chromium, a chromium-copper alloy, titanium, a titanium-tungsten alloy, titanium nitride, tantalum or tantalum nitride, for example. Alternatively, the adhesion/barrier layer 312*a* may be formed by sputtering a chromium layer and then sputtering a chromium-copper layer on the chromium layer. The bulk metal layer 3516 may be a single metal layer and may have a thickness a1 thicker than 1 μm (1 micrometer), and preferably between 2 μm (2 micrometers) and 30 μm (30 micrometers), wherein the bulk metal layer 312*b* may comprise copper with greater than 90 weight percent, and, preferably, greater than 97 weight percent. Alternatively, a seed layer (unshown), such as copper, can be sputtered on the adhesion/barrier layer 3511, preferably comprising a titanium-tungsten alloy, and then the bulk metal layer 3516 is electroplated on the seed layer.

In another case, the adhesion/barrier layer 3511 may comprise chromium, a chromium-copper alloy, titanium, a titanium-tungsten alloy, titanium nitride, tantalum or tantalum nitride, for example. The bulk metal layer 3516 may be a single metal layer and may have a thickness a 1 thicker than 1 μm (1 micrometer), and preferably between 2 μm (2 micrometers) and 30 μm (30 micrometers), wherein the bulk metal layer 312*b* may comprise platinum with greater than 90 weight percent, and, preferably, greater than 97 weight percent. Alternatively, a seed layer (unshown), such as platinum, can be sputtered on the adhesion/barrier layer 3511, preferably comprising a titanium-tungsten alloy, and then the bulk metal layer 3516 is electroplated on the seed layer.

In another case, the adhesion/barrier layer 3511 may comprise chromium, a chromium-copper alloy, titanium, a titanium-tungsten alloy, titanium nitride, tantalum or tantalum nitride, for example. The bulk metal layer 3516 may be a single metal layer and may have a thickness a 1 thicker than 1 μm (1 micrometer), and preferably between 2 μm (2 micrometers) and 30 μm (30 micrometers), wherein the bulk metal layer 312*b* may comprise palladium with greater than 90 weight percent, and, preferably, greater than 97 weight percent. Alternatively, a seed layer (unshown), such as palladium, can be sputtered on the adhesion/barrier layer 3511, preferably comprising a titanium-tungsten alloy, and then the bulk metal layer 3516 is electroplated on the seed layer.

In another case, the adhesion/barrier layer 3511 may comprise chromium, a chromium-copper alloy, titanium, a titanium-tungsten alloy, titanium nitride, tantalum or tantalum nitride, for example. The bulk metal layer 3516 may be a single metal layer and may have a thickness a 1 thicker than 1 μm (1 micrometer), and preferably between 2 μm (2 micrometers) and 30 μm (30 micrometers), wherein the bulk metal layer 312*b* may comprise rhodium with greater than 90 weight percent, and, preferably, greater than 97 weight percent. Alternatively, a seed layer (unshown), such as rhodium, can be sputtered on the adhesion/barrier layer 3511, preferably comprising a titanium-tungsten alloy, and then the bulk metal layer 3516 is electroplated on the seed layer.

In another case, the adhesion/barrier layer 3511 may comprise chromium, a chromium-copper alloy, titanium, a titanium-tungsten alloy, titanium nitride, tantalum or tantalum nitride, for example. The bulk metal layer 3516 may be a single metal layer and may have a thickness a1 thicker than 1 μm (1 micrometer), and preferably between 2 μm (2 micrometers) and 30 μm (30 micrometers), wherein the bulk metal layer 312*b* may comprise ruthenium with greater than 90 weight percent, and, preferably, greater than 97 weight percent. Alternatively, a seed layer (unshown), such as ruthenium, can be sputtered on the adhesion/barrier layer 3511, preferably comprising a titanium-tungsten alloy, and then the bulk metal layer 3516 is electroplated on the seed layer. In another case, the adhesion/barrier layer 3511 may comprise titanium, a titanium-tungsten alloy, titanium nitride, tantalum or tantalum nitride, for example. Alternatively, the adhesion/barrier layer 3511 may be formed by sputtering a chromium layer and then sputtering a chromium-copper layer on the chromium layer. The bulk metal layer 3516 may be multiple metal layers, such as first and second metal layers, the second metal layer being on the first metal layer. The first metal layer may have a thickness a2 thicker than 1 μm (1 micrometer), and preferably between 2 μm (2 micrometers) and 30 μm (30 micrometers), wherein the first metal layer may comprise copper with greater than 90 weight percent, and, preferably, greater than 97 weight percent. The second metal layer may comprise nickel, for example, and may have a thickness thicker than 1 μm (1 micrometer), and preferably between 1 μm (1 micrometer) and 5 μm (5 micrometers). Alternatively, a seed layer (unshown), such as copper, can be sputtered on the addhesion/barrier layer 3511, then the first metal layer is electroplated on the seed layer, and then the second metal layer is electroplated on the first metal layer.

In another case, the adhesion/barrier layer 3511 may comprise titanium, a titanium-tungsten alloy, titanium nitride, tantalum or tantalum nitride, for example. Alternatively, the adhesion/barrier layer 3511 may be formed by sputtering a chromium layer and then sputtering a chromium-copper layer on the chromium layer. The bulk metal layer 3516 may include multiple metal layers, such as a first metal layer, a second metal layer and a third metal layer, the first metal layer being over the adhesion/barrier layer, the second metal layer being on the first metal layer, and the third metal layer being on the second metal layer. The first metal layer may have a thickness thicker than 1 μm, and preferably between 2 μm and 30 μm, wherein the first metal layer may comprise copper with greater than 90 weight percent, and, preferably, greater than 97 weight percent. The second metal layer may have a thickness thicker than 1 μm, and preferably between 2 μm and 5 μm, and may comprise nickel with greater than 90 weight percent, and, preferably, greater than 97 weight percent. The third metal layer may have a thickness thicker than 100 angstroms, and preferably between 1000 angstroms and 1 μm, and may comprise gold with greater than 90 weight percent, and, preferably, greater than 97 weight percent. Alternatively, the third metal layer may have a thickness thicker than 100 angstroms, and preferably between 1000 angstroms and 1 μm, and may comprise silver with greater than 90 weight percent, and, preferably, greater than 97 weight percent. Alternatively, the third metal layer may have a thickness thicker than 100 angstroms, and preferably between 1000 angstroms and 1 μm, and may comprise copper with greater than 90 weight percent, and, preferably, greater than 97 weight percent. Alternatively, the third metal layer may have a thickness thicker than 100 angstroms, and preferably between 1000 angstroms and 1 μm, and may comprise platinum with greater than 90 weight percent, and, preferably, greater than 97 weight percent. Alternatively, the third metal layer may have a thickness thicker than 100 angstroms, and preferably between 1000 angstroms and 1 μm, and may comprise palladium with greater than 90 weight percent, and, preferably, greater than 97 weight percent. Alternatively, the third metal layer may have a thickness thicker than 100 angstroms, and preferably between 1000 angstroms and 1 μm, and may comprise rhodium with greater than 90 weight percent, and, preferably, greater than 97 weight percent. Alternatively, the third metal layer may have a thickness thicker than 100 angstroms, and preferably between 1000 angstroms and 1 μm, and may comprise ruthenium with greater than 90 weight percent, and, preferably, greater than 97 weight percent. Alternatively, a seed layer (unshown), such as copper, can be sputtered on the addhesion/barrier layer 3511, then the first metal layer is electroplated on the seed layer, then the second metal layer is electroplated on the first metal layer, and then the third metal layer is electroplated on the second metal layer.

Figure 49:
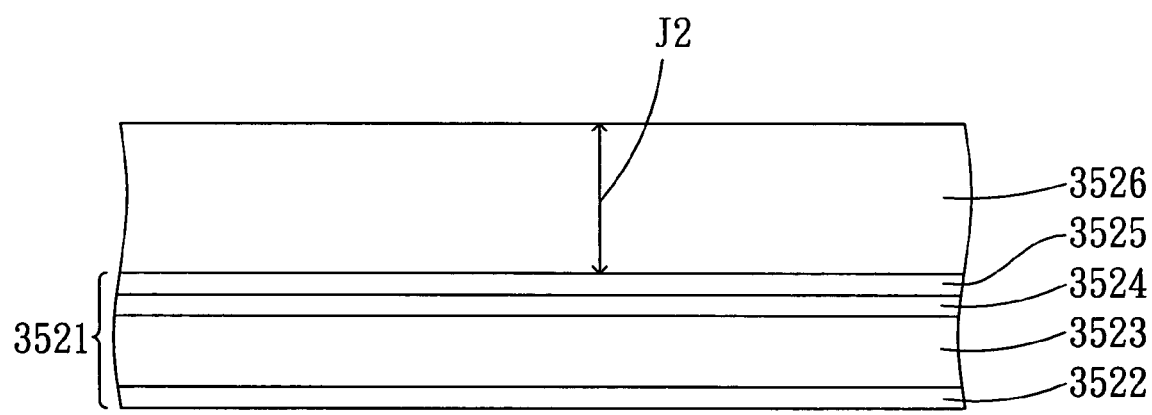

FIG. 49 is a schematic cross-section representation showing one type of the metal layers of the thick metal circuit line 350 of the semiconductor chip 300 according to a second embodiment. The above-mentioned thick metal circuit line 350 of the semiconductor chip may comprise a UBM metal layer 3521 and a bulk metal layer 3526. The bulk metal layer 3526 is placed upon the UBM metal layer 3521. The UBM layer 3521 may be formed on the passivation layer, as shown in FIGS. 21-25, 28-31, 34-37, 40, 41, 44 and 45, or on the polymer layer 380 or on the thin film fine line 337, as shown in FIGS. 26, 27, 32, 33, 38, 39, 42, 43, 46 and 47. The UBM metal layer 3521 may be multiple metal layers, such as a first metal layer 3522, a second metal layer 3523, a third metal layer 3524 and a fourth metal layer 3525, the second metal layer 3523 being on the first metal layer 3522, the third metal layer 3524 being on the second metal layer 3523, and the fourth metal layer 3525 being on the third metal layer 3524. The first metal layer 3522 may comprise titanium, a titanium-tungsten alloy, titanium nitride, tantalum or tantalum nitride, for example. Alternatively, the first layer 3522 may be formed by sputtering a chromium layer and then sputtering a chromium-copper layer on the chromium layer. The second metal layer 3523 may have a thickness thicker than 1 μm (1 micrometer), and preferably between 2 μm (2 micrometers) and 10 μm (10 micrometers), wherein the second metal layer 3523 may comprise copper with greater than 90 weight percent, and, preferably, greater than 97 weight percent. The third metal layer 3524 may comprise nickel, for example, and may have a thickness thicker than 1 μm (1 micrometer), and preferably between 1 μm (1 micrometer) and 5 μm (5 micrometers). The fourth metal layer 3525 may have a thickness thicker than 100 angstroms, and preferably between 1000 angstroms and 1 μm, and may comprise gold with greater than 90 weight percent, and, preferably, greater than 97 weight percent. Alternatively, the fourth metal layer 3525 may have a thickness thicker than 100 angstroms, and preferably between 1000 angstroms and 1 μm, and may comprise silver with greater than 90 weight percent, and, preferably, greater than 97 weight percent. Alternatively, the fourth metal layer 3525 may have a thickness thicker than 100 angstroms, and preferably between 1000 angstroms and 1 μm, and may comprise copper with greater than 90 weight percent, and, preferably, greater than 97 weight percent. Alternatively, the fourth metal layer 3525 may have a thickness thicker than 100 angstroms, and preferably between 1000 angstroms and 1 μm, and may comprise platinum with greater than 90 weight percent, and, preferably, greater than 97 weight percent. Alternatively, the fourth metal layer 3525 may have a thickness thicker than 100 angstroms, and preferably between 1000 angstroms and 1 μm, and may comprise palladium with greater than 90 weight percent, and, preferably, greater than 97 weight percent. Alternatively, the fourth metal layer 3525 may have a thickness thicker than 100 angstroms, and preferably between 1000 angstroms and 1 μm, and may comprise rhodium with greater than 90 weight percent, and, preferably, greater than 97 weight percent. Alternatively, the fourth metal layer 3525 may have a thickness thicker than 100 angstroms, and preferably between 1000 angstroms and 1 μm, and may comprise ruthenium with greater than 90 weight percent, and, preferably, greater than 97 weight percent. Alternatively, a seed layer (unshown), such as copper, can be sputtered on the first layer 3522, then the second metal layer 3523 is electroplated on the seed layer, then the third metal layer 3524 is electroplated on the second metal layer 3523, and then the fourth metal layer 3525 is electroplated on the third metal layer 3524. The bulk metal layer 3526 electroplated on the fourth metal layer 3525 may be a reflowabler or solderable material that is usually reflowed with a certain reflow temperature profile, typically ramping up from a starting temperature to a peak temperature, and then cooled down to a final temperature. The peak temperature is roughly set at the melting temperature of solder, or metals or metal alloys used for reflow or bonding purpose. The bulk metal layer 3526 starts to reflow when temperature reaches the melting temperature of solder, or reflowable metal, or reflowable metal alloys (i.e. is roughly the peak temperature) for over 20 seconds. The peak-temperature period of the whole temperature profile takes over 2 minutes and typically 5 to 45 minutes. In summary, the bulk metal layer 3526 is reflowed at the temperature of between 150 and 350 centigrade degrees for more than 20 seconds or for more than 2 minutes. The bulk metal layer 3526 comprises solder or other metals or alloys with melting point between 150 and 350 centigrade degrees. The bulk metal layer 3526 comprises a lead-containing solder material, such as tin-lead alloy, or a lead-free solder material, such as tin-silver alloy or tin-silver-copper alloy at the topmost of the reflowable bump. Typically, the lead-free material may have a melting point greater than 185 centigrade degrees, or greater than 200 centigrade degrees, or greater than 250 centigrade degrees. Alternatively, the process of depositing the fourth metal layer 3525 can be omitted, and the bulk metal layer 3526 can be formed on the third metal layer 3524 comprising nickel. The bump 360 of the semiconductor chip 300 can also have the same deposited metal layers of the thick metal circuit line 350 as shown in FIG. 49.

In this present innovation, the bonding between the thick metal circuit lines 150 and 350 can be make by two mechanisms. The first mechanism is the metal-to-metal euectic bonding process, such as a gold-to-gold euectic bonding process, gold-to-silver euectic bonding process, gold-to-copper euectic bonding process, gold-to-platinum euectic bonding process, gold-to-palladium euectic bonding process, gold-to-rhodium euectic bonding process, gold-to-ruthenium euectic bonding process, silver-to-silver euectic bonding process, silver-to-copper euectic bonding process, silver-to-platinum euectic bonding process, silver-to-palladium euectic bonding process, silver-to-rhodium euectic bonding process, silver-to-ruthenium euectic bonding process, copper-to-copper euectic bonding process, copper-to-platinum euectic bonding process, copper-to-palladium euectic bonding process, copper-to-rhodium euectic bonding process, copper-to-ruthenium euectic bonding process, platinum-to-platinum euectic bonding process, platinum-to-palladium euectic bonding process, platinum-to-rhodium euectic bonding process, platinum-to-ruthenium euectic bonding process, palladium-to-palladium euectic bonding process, palladium-to-rhodium euectic bonding process, palladium-to-ruthenium euectic bonding process, rhodium-to-rhodium euectic bonding process, rhodium-to-ruthenium euectic bonding process, or ruthenium-to-ruthenium euectic bonding process. The top metal layer of the thick metal circuit line 150 and the bump 160 of the semiconductor chip 100 made of gold, silver, copper, platinum, palladium, rhodium, or ruthenium with high purity, as illustrated in FIG. 16 can be bonded to the top metal layer of the thick metal circuit line 350 and the bump 360 of the semiconductor chip 300 made of gold, silver, copper, platinum, palladium, rhodium, or ruthenium with high purity, as illustrated in FIG. 48 based on the above-mentioned first mechanism.

The second mechanism is the solder bonding process. The top metal layer of the thick metal circuit line 150 and bump 160 of the semiconductor chip 100 can be a solder material, such as tin, a tin-lead alloy, a tin-silver alloy or a tin-silver-copper alloy, as above illustrated in FIG. 17 and can be bonded to various kinds of the thick metal circuit line 350 and bump 360 of the semiconductor chip 300 as above illustrated in FIGS. 48 and 49 using a reflow or heating process. The top metal layer of the thick metal circuit line 350 and bump 360 of the semiconductor chip 300 can be a solder material, such as tin, a tin-lead alloy, a tin-silver alloy or a tin-silver-copper alloy, as above illustrated in FIG. 49 and can be bonded to various kinds of the thick metal circuit line 150 and bump 160 of the semiconductor chip 100 as above illustrated in FIGS. 16 and 17 using a reflow or heating process.

Third Embodiment

The thick metal circuit line 150 of the semiconductor chip 100 is connected to and in touch with the circuit line 212 of the substrate 200 as mentioned in the first embodiment, or connected to the thick metal circuit line 350 of the semiconductor chip 300 as mentioned in the second embodiment. The application for the present invention is not limited to the above disclosure. The thick metal circuit line 150 of the semiconductor chip 100 can also be connected to the circuit line 412 of an circuitry component 400, such as a glass substrate, flexible substrate, hard substrate or semiconductor chip, through a conductor polymer, such as ACF or ACP, that is through metal particles 454 distributed in a polymer layer, as shown in FIGS. 50-64. Generally, the circuit layer 410 is comprised of transparent indium tin oxide (ITO) when the circuitry component 400 is a glass substrate. The circuit layer 410 comprises a circuit line 412 and a bonding pad 414. To match up the drawings, several possible cases are illustrate as follow:

1. Used for the Intra-Chip Signal Transmission

Figure 50:
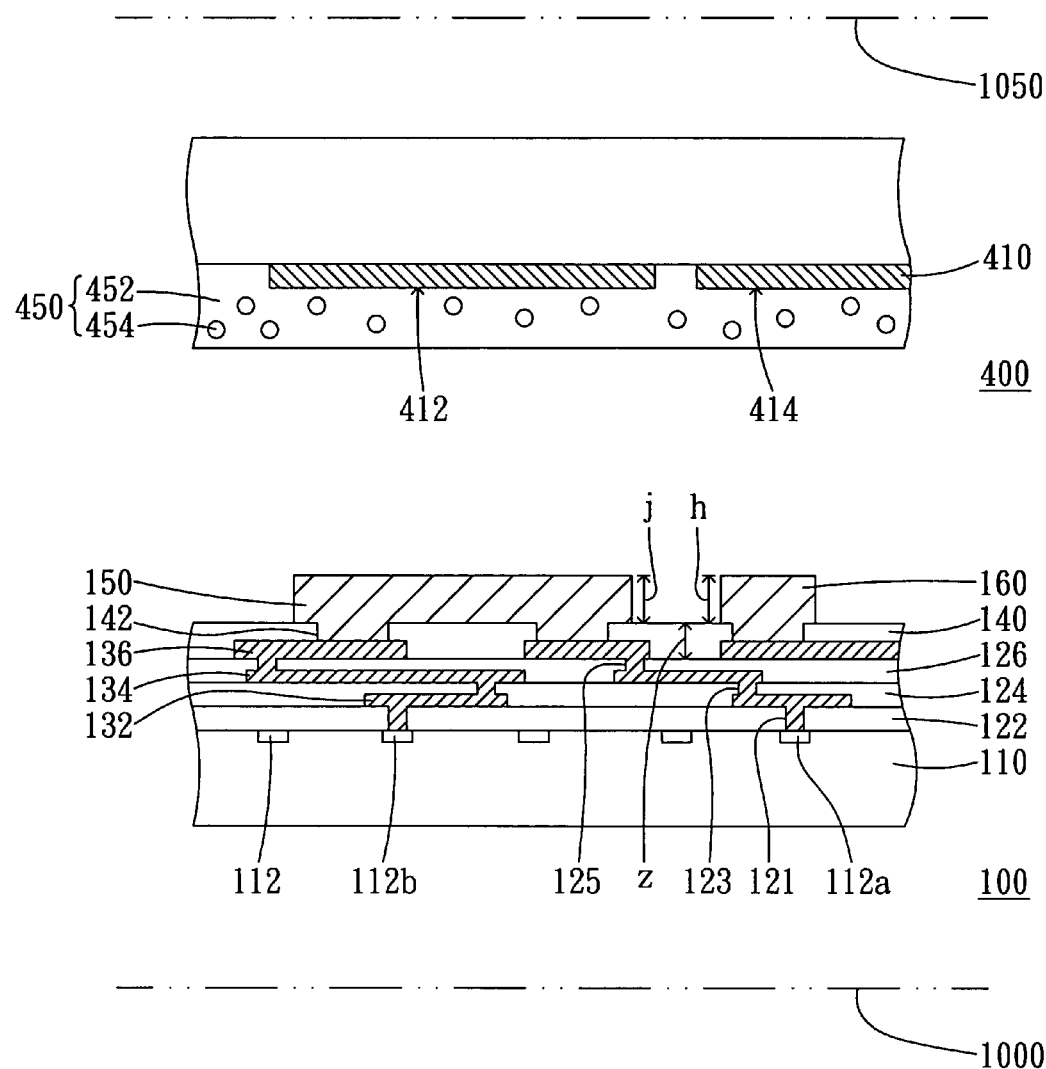
FIG. 50 is a schematic cross-section representation showing a chip structure before connecting a semiconductor chip and a circuitry component in a third embodiment of the present invention.
Figure 51:
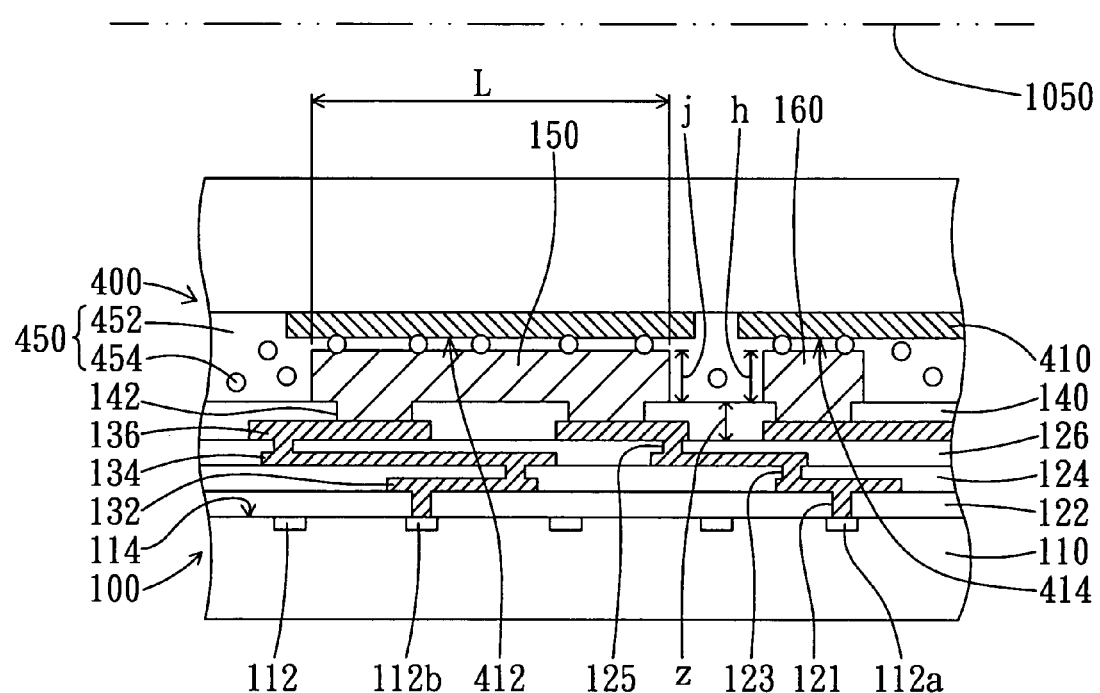
FIGS. 51-63 are schematic cross-section representations showing chip packages in the third embodiment.

FIG. 50 is a schematic cross-sectional drawing showing a chip package before connecting a semiconductor chip and a circuitry component according to a third embodiment. The cross-section representation of the thick metal circuit line 150 of the semiconductor chip 100 comes from perpendicularly cutting in the direction in which the thick metal circuit line 150 extends. The cross-section representation of the metal circuit line 412 of the circuitry component 400 comes from perpendicularly cutting in the direction in which the metal circuit line 412 extends. FIG. 51 is a schematic cross-sectional drawing showing a chip package after connecting a semiconductor chip and a circuitry component according to a third embodiment.

Referring to FIG. 50, a conductive polymer layer 450, such as anisotropic conductive paste (ACP) or the anisotropic conductive film (ACF), can be formed over a circuit line 412 and a bonding pad 414 of the circuitry component 400, such as glass substrate. The conductive polymer layer 450 comprises a polymer 452 and a plurality of the metal particles 454, wherein the metal particles are distributed in the polymer 452.

The circuit line 412 can extend in any direction or with various shapes at the top of the circuitry component 400, such as in a straight direction, or with a curve shape or a discontinuing crooked shape. The relationship between the thick metal circuit line 150 of the semiconductor chip 100 and the circuit line 412 of the circuitry component 400 is presented like a specular reflection. Therefore, the thick metal circuit line 150 of the semiconductor chip 100 can be aligned with the circuit line 412 of the circuitry component 400 in the process for bonding the semiconductor chip 100 and the circuitry component 400.

Figure 50A:
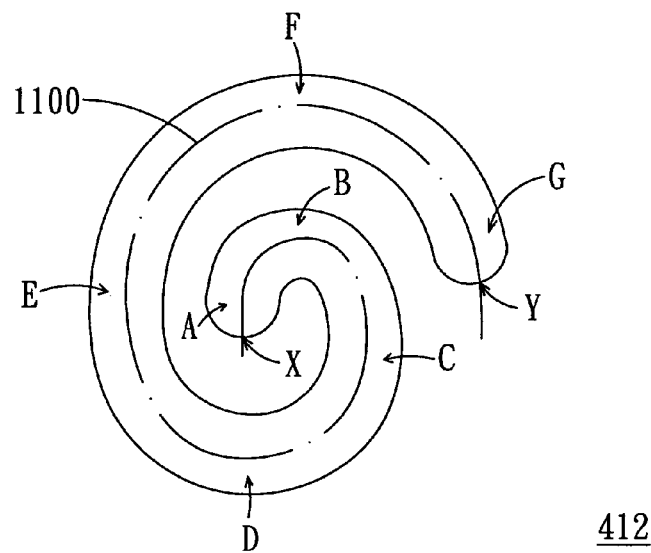
FIG. 50A is a schematic top view showing the projection profile of the circuit line 412 of the circuitry component 400 shown in FIG. 50 projecting to the plane 1050.
Figure 50B:
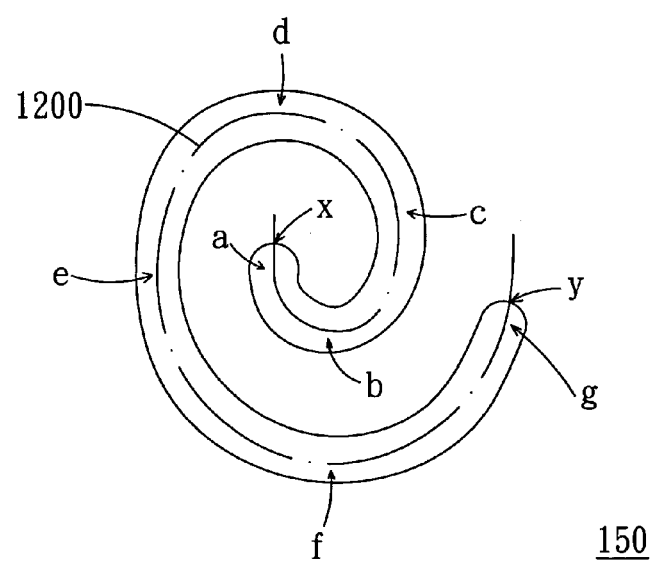
FIG. 50B is a schematic top view showing the projection profile of the thick metal circuit line 150 of the semiconductor chip 100 shown in FIG. 50 projecting to the plane 1000.

In one embodiment, the thick metal circuit line 150 of the semiconductor chip 100 and the circuit line 412, such as indium tin oxide (ITO), of the circuit line 412, such as a glass substrate, have a spiral shape, for example, as shown in FIGS. 50A and 50B. The thick metal circuit line 150 of the semiconductor chip 100 and the circuit line 412 of the circuitry component 400 can be inductor devices, for example. FIG. 1A is a top view showing the circuit line 412 of the circuitry component 400 projected to the plane 1050. FIG. 1B is a top view showing the thick metal circuit line 150 of the semiconductor chip 100 projected to the plane 1000. Referring to FIGS. 1A and 1B, the relationship between the thick spiral circuit line 150 of the semiconductor chip 100 and the spiral circuit line 412 of the circuitry component 400 is presented like a specular reflection. The spiral circuit line 212 of the substrate 200 can extend in a path 1100, for example, from the point X of the path 1100 to the point Y of the path 1100. The thick spiral circuit line 150 of the semiconductor chip 100 can extend in a path 1200, for example, from the point x of the path 1200 extended to the point y of the path 1200.

Referring to FIG. 51, the thick metal circuit line 150 and bump 160 of the semiconductor chip 100 can be connected to the circuit line 412 and bonding pad 414 of the circuitry component 400 with the thick metal circuit line 150 and bump 160 put into the conductive polymer layer 450, leading the metal particles 454 gathered between the thick metal circuit line 150 and the circuit line 412 and between the bump 160 and the bonding pad 414. The thick metal circuit line 150 can be connected to the circuit line 412 via the gathered metal particles 454. The bump 160 can be connected to the bonding pad 414 via the gathered metal particles 454. The conductive polymer layer 450 encloses the thick metal circuit line 150 and the bump 160. The plane 1000 is substantially parallel to an active surface 114 of the semiconductor substrate 110. The projection profiles of the thick metal circuit line 150 and the circuit line 412 projecting to the plane 1000 have an overlap region having an extension length L of larger than 500 µm, 800 µm, or 1200 µm, for example. The projection profiles of the thick metal circuit layer 150 and the circuit line 412 projecting to the plane 1000 have an overlap region having an area of larger than 30,000 µm$^2$, 80,000 µm$^2$, or 150,000 µm$^2$, for example.

Figure 51A:
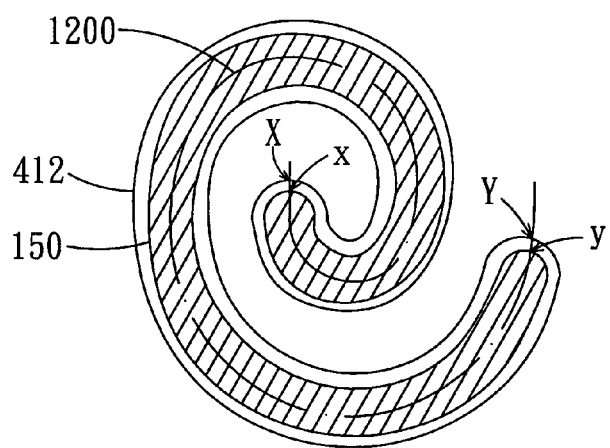
FIG. 51A is a schematic top view showing the projection profiles of the thick spiral metal circuit line 150 and the spiral circuit line 412 shown in FIGS. 50A and 50B projecting to the plane 1000.

Referring to FIGS. 50A and 50B, the regions A, B, C, D, E, F and G of the spiral circuit line 412 of the circuitry component 400 can be respectively connected to and in touch with the regions a, b, c, d, e, f and g of the thick spiral metal circuit line 150 of the semiconductor chip 100 during bonding the semiconductor chip 100 and the substrate 200. FIG. 51A is a top view showing the projection profiles of the thick spiral metal circuit line 150 and the spiral circuit line 412 projecting to the plane 1000. Shown the enclosure with oblique lines in FIG. 51A, the projection profiles of the thick spiral metal circuit line 150 and the spiral circuit line 412 projecting to the plane 1000 may have an overlap region having an extension length, which is the length of the path 1200 from point x to point y, and may be larger than 500 µm, 800 µm, or 1200 µm, for example. Shown the enclosure with oblique lines in FIG. 51A, the projection profiles of the thick spiral metal circuit layer 150 and the spiral circuit line 212 projecting to the plane 1000 may have an overlap region having an area of larger than 30,000 µm$^2$, 80,000 µm$^2$, or 150,000 µm$^2$, for example.

Referring to FIG. 51, a signal may be transmitted from one of the electronic devices, such as 112a, to the thick metal circuit layer 150 and the circuit line 412, sequentially through the thin film fine line metal layers 132, 134 and 136 and then through the opening 142 in the passivation layer 140. Next, the signal may be transmitted from the metal circuit layer 150 and the circuit line 412 to the other one of the electronic devices, such as 112b, through the opening 142 in the passivation layer 140 and then sequentially through the thin film fine line metal layers 136, 134 and 132. The thick metal circuit line 150 of the semiconductor chip 100 and the circuit line 412 of the circuitry component 400 can be used for intra-chip signal transmission. The signal transmitted from the electrical device 112a to the thick metal circuit line 150 and the circuit line 412 can also be transmitted to the inside of the circuitry component 400. The thick metal circuit line 150 of the semiconductor chip 100 and the circuit line 412 of the circuitry component 400 can be used for signal transmission between the semiconductor chip 100 and the circuitry component 400.

Considering the electrical transmission of the bump 160, the semiconductor chip 100 can also transmit or receive a signal to or from the circuitry component 400 via the bump 160.

As mentioned above, the thick metal circuit line 150 of the semiconductor chip 100 and the circuit line 412 of the glass substrate 400 can be used to transmit the signal in a lateral direction and also in a vertical direction between the semiconductor chip 100 and the circuitry component 400. The thick metal circuit line 150 of the semiconductor chip 100 may have a large area connected to a large area of the circuit line 412 of the substrate 400. Therefore, the chip package can significantly improve its electrical performance and can reduce its noise occurrence.

As for the above-mentioned transmission of the signal, the thick metal circuit line 150 of the semiconductor chip 100 and the circuit line 412 of the circuitry component 400 are used for intra-chip signal transmission for the semiconductor chip 100 and for signal transmission between the semiconductor chip 100 and the circuitry component 400. Alternatively, the thick metal circuit line 150 of the semiconductor chip 100 and the circuit line 412 of the glass substrate 400 can be used for intra-chip signal transmission for the semiconductor chip 100, but not for signal transmission between the semiconductor chip 100 and the circuitry component 400. In this situation, the circuit line 412 of the glass substrate 400 is disconnected from the circuitry in the circuitry component 400.

In other embodiment, the circuitry component 400 also can be used to transmit a signal to the circuit line 412 and the thick metal circuit line 150. Next, the signal can pass through the opening 142 in the passivation layer 140, and then transmitted to one or more electrical devices, such as 112a and 112b, via the thin film fine line metal layers 136, 134, and 132.

Figure 52:
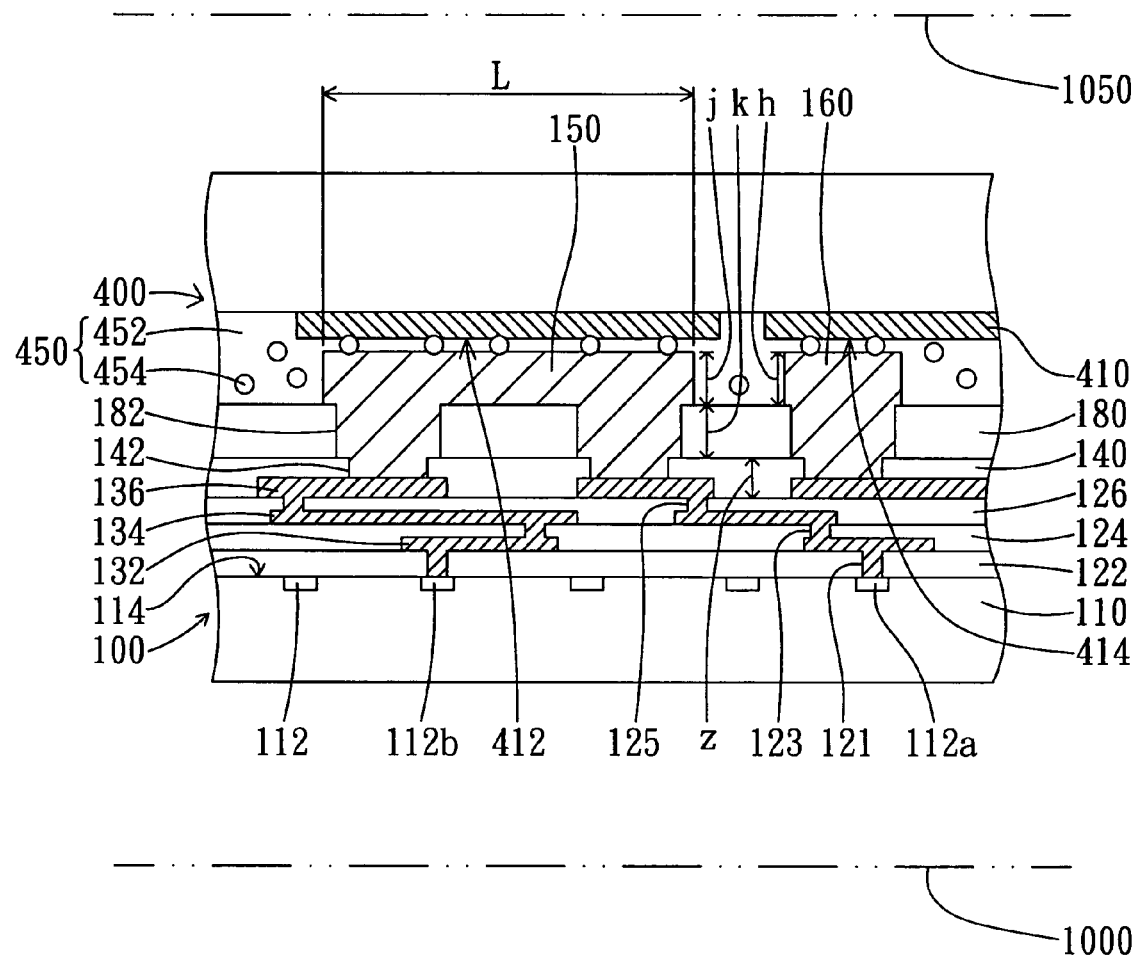

The thick metal circuit line 150 can be formed over and in touch with the passivation layer 140 in FIGS. 50, 51. Alternatively, the thick metal circuit line 150 can also be formed over the polymer layer 180 formed upon the passivation layer 140 as shown in FIG. 52. FIG. 52 is schematic cross-section representation showing another type of a chip package in a third embodiment.

Figure 53:
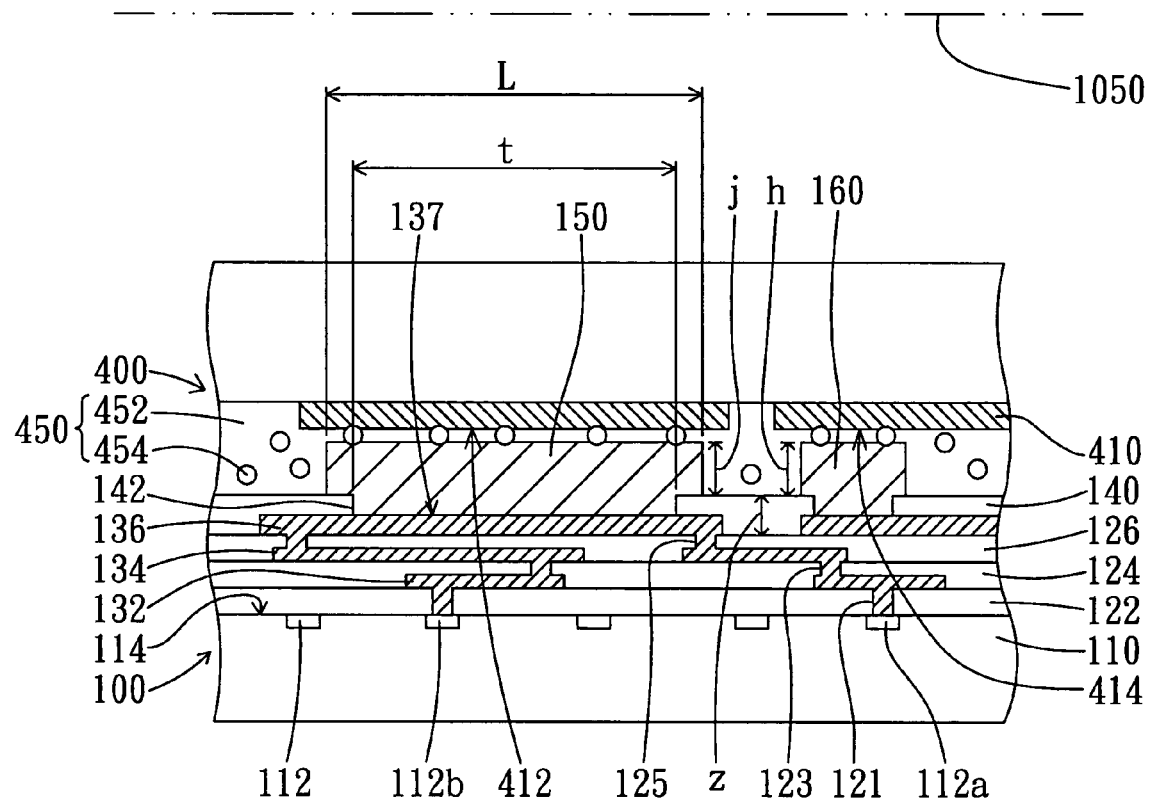
Figure 54:
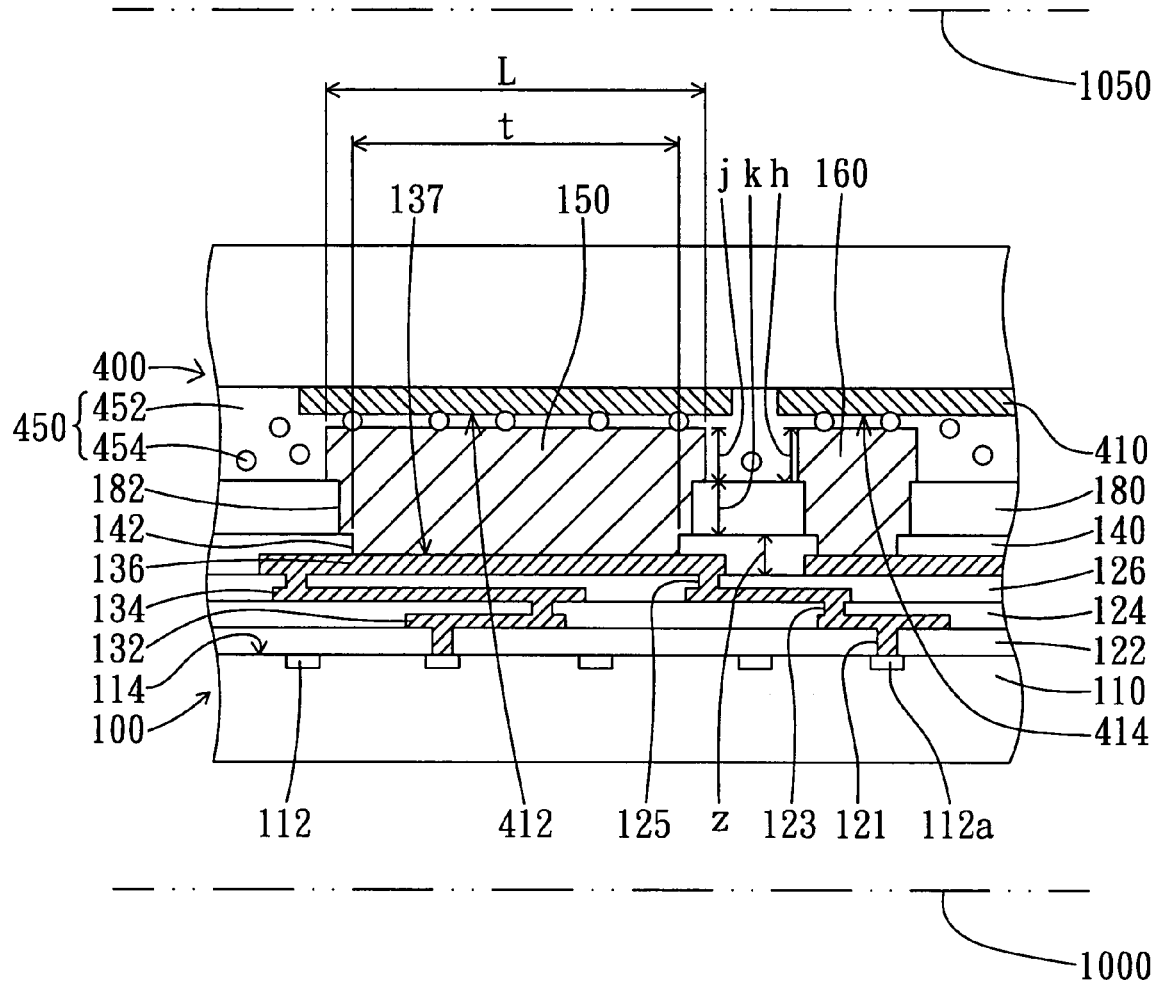

In FIGS. 50-52, the thick metal circuit line 150 is connected to multiple small areas of the topmost thin film fine line metal layer 136 via the small openings 142 in the passivation layer 140. Alternatively, the thick metal circuit line 150 can also be connected to a large area of the topmost thin film fine line metal layer 136 via a large opening 142 in the passivation layer 140, as shown in FIGS. 53 and 54. FIGS. 53 and 54 are schematic cross-section representations showing another kind of chip package according to a third embodiment. In the embodiment, the relation of the connection between the thick metal circuit line 150 and the thin film fine line 137 in FIGS. 53 and 54 is similar to that illustrated in FIGS. 4, 5 and 5A.

Referring to FIGS. 53 and 54, a signal may be transmitted from one of the electronic devices, such as 112a, to the thin film fine line metal 137, the thick metal circuit line 150 and the circuit line 412 sequentially through the thin film fine line metal layers 132, 134 and then through the opening 142 in the passivation layer 140. Next, the signal may be transmitted from the thin film fine line 137, the thick metal circuit line 150 and the circuit line 412 to the other one of the electronic devices, such as 112b, through the opening 142 in the passivation layer 140 and then sequentially through the thin film fine line metal layers 134 and 132. The thin film fine line metal 137, the thick metal circuit line 150 and the circuit line 412 can be used for intra-chip signal transmission for the semiconductor chip 100. In addition, the signal transmitted from the electrical device 112a to the thin film fine line metal 137, the thick metal circuit line 150 and the circuit line 412 can also be transmitted to the inside of the circuitry component 400. The thin film fine line metal 137, the thick metal circuit line 350 and the circuit line 412 can be used for signal transmission between the semiconductor chip 100 and the circuitry component 400, such as glass substrate.

Alternatively, a signal may be transmitted from the circuitry component 400, such as glass substrate, to the circuit line 412, the thick metal circuit line 150 and the thin film fine line 137. Next, the signal may be transmitted from the circuit line 412, the thick metal circuit line 150 and the thin film fine line 137 to other one or more of the electronic devices, such as 112a and 112b, through the opening 142 in the passivation layer 140 and then sequentially through the thin film fine line metal layers 134 and 132.

The semiconductor chip 100 can transmit or receive a signal to or from the circuitry component 400 via the bump 160.

As mentioned above, the thin film fine line metal 137 and the thick metal circuit line 150 of the semiconductor chip 100 and the circuit line 412 of the glass substrate 400 can be used to transmit the signal in a lateral direction and also in a vertical direction between the semiconductor chip 100 and the circuitry component 400. The thick metal circuit line 150 of the semiconductor chip 100 may have a large area connected to the circuit line 412 of the circuitry component 400. The thin film fine line 137 may have a large area connected to the thick metal circuit line 150. Therefore, the above-mentioned chip package can improve its electrical performance and can reduce its noise occurrence.

2. Used for Signal Transmission Between Semiconductor Chip and Circuitry Component.

FIGS. 55-58 are schematic cross-section representations showing another type of chip packages according to a third embodiment. The semiconductor chip 100 in FIGS. 55-58 is similar to the semiconductor chip 100 in FIGS. 2-5; the circuitry component 400 in FIGS. 55-58 is similar to the circuitry component 400 in FIGS. 50-54. The difference is that the thick metal circuit line 150 of the semiconductor chip 100 and the circuit line 412 of the circuitry component 400 are used for signal transmission between the semiconductor chip 100 and the circuitry component 400, such as glass substrate.

Figure 55:
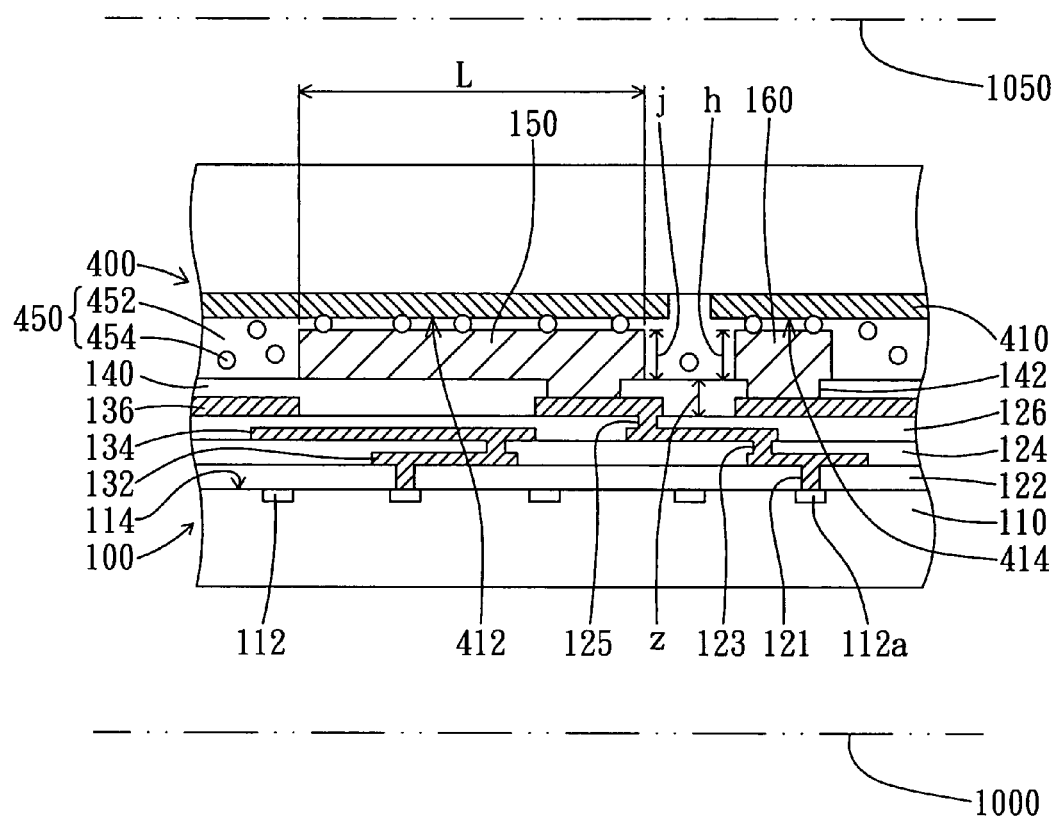
Figure 56:
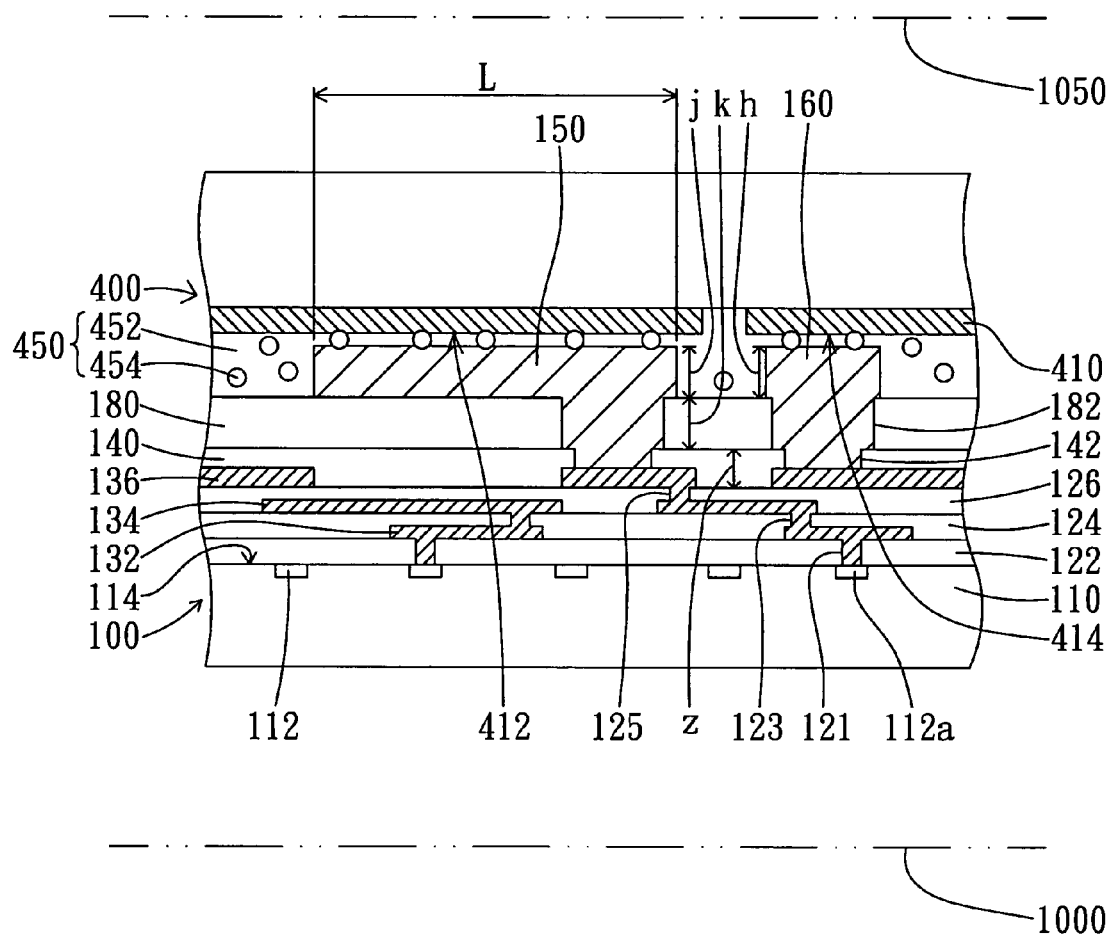

Referring to FIGS. 55-56, a signal may be transmitted from one of the electronic devices, such as 112a, to the thick metal circuit layer 150 and the circuit line 412 sequentially through the thin film fine line metal layers 132, 134 and 136 and then through the opening 142 in the passivation layer 140. Next, the signal may be transmitted from the thick metal circuit layer 150 and the circuit line 412 to the internal circuitry of the circuitry component 400, such as glass substrate. The thick metal circuit line 150 of the semiconductor chip 100 and the circuit line 412 of the circuitry component 400 can be used for signal transmission between the semiconductor chip 100 and the circuitry component 400.

Considering other application conditions, the circuitry component 400, such as glass substrate, can also transmit a signal to the circuit line 412 of the glass substrate 400 and the thick metal circuit line 150 of the semiconductor chip 100. Next, the signal can be transmitted to one of the electrical device, such as 112a, through the opening 142 in the passivation layer 140, and then sequentially through the thin film fine line metal layers 136, 134, and 132.

Figure 57:
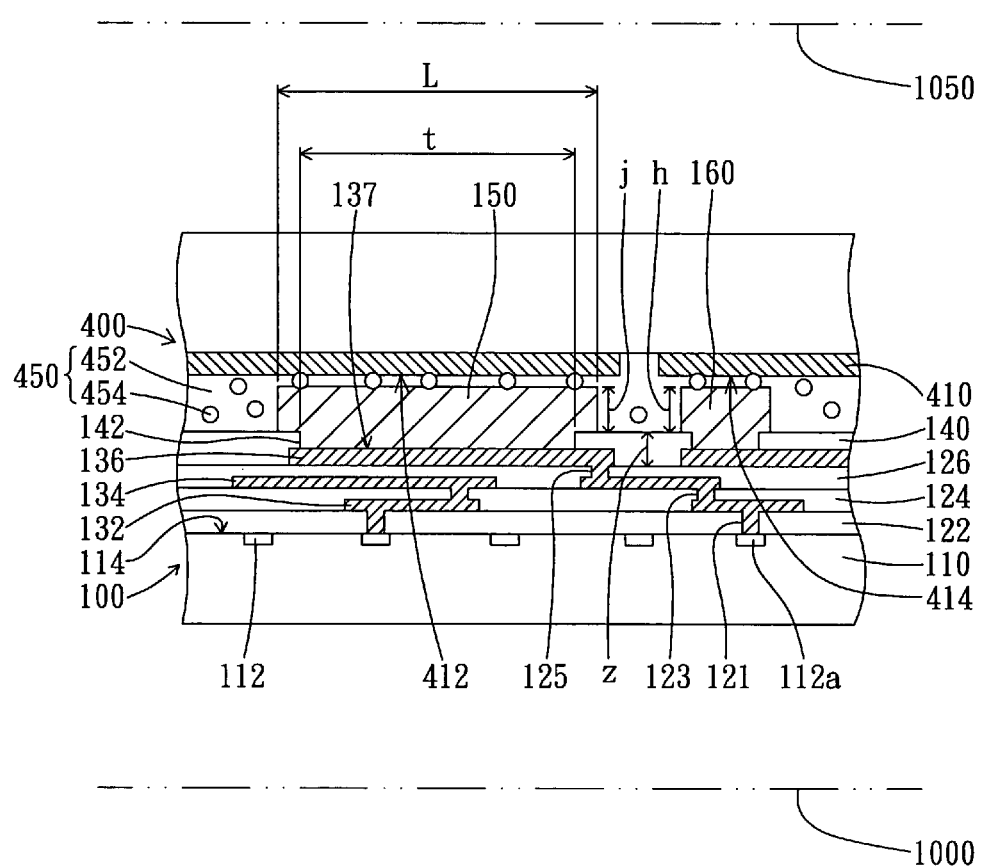
Figure 58:
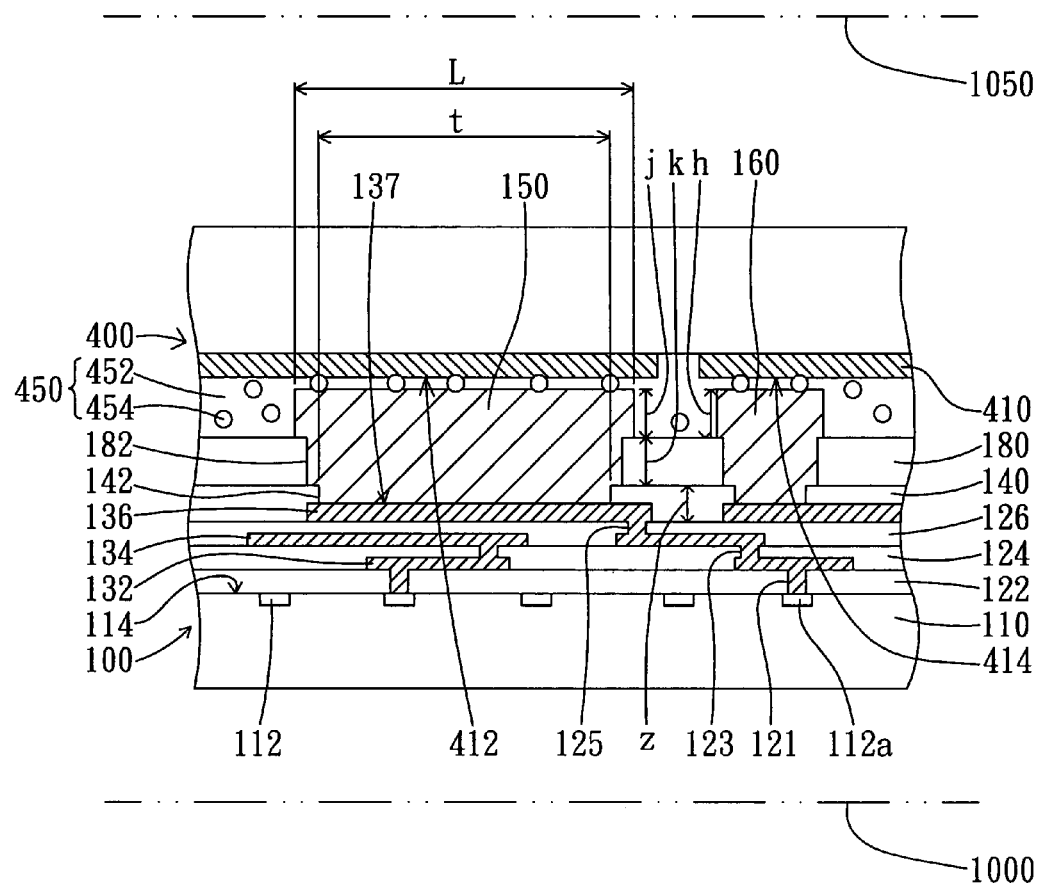
Figure 59:
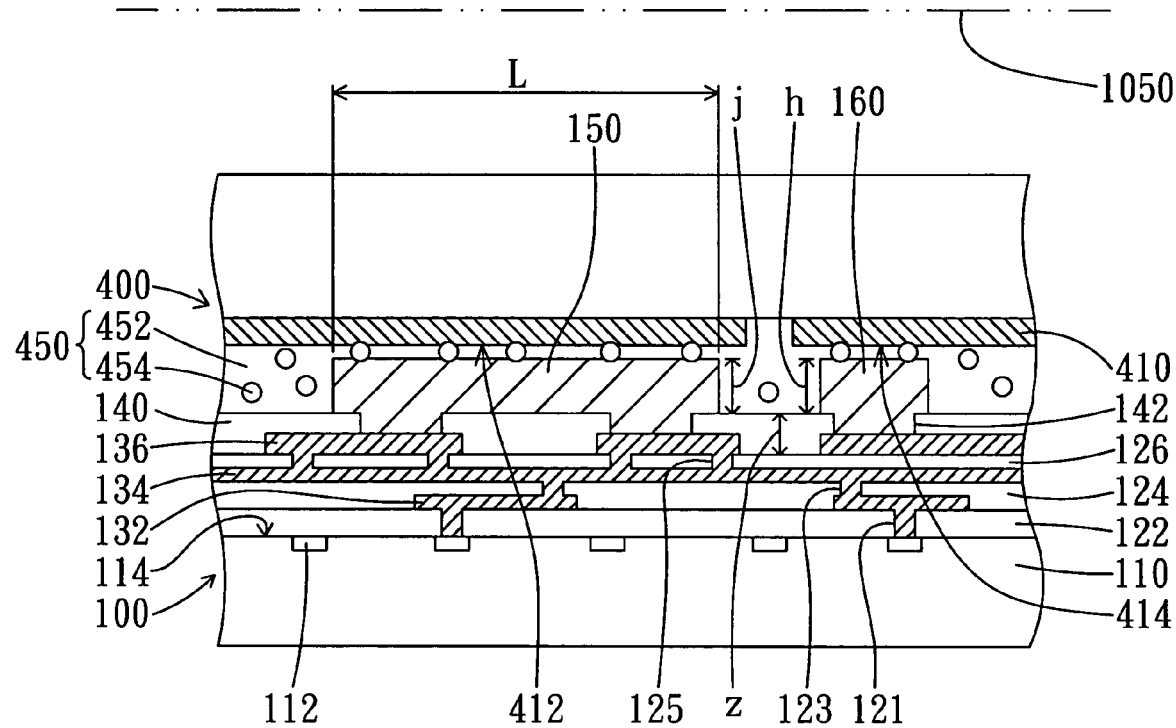
Figure 60:
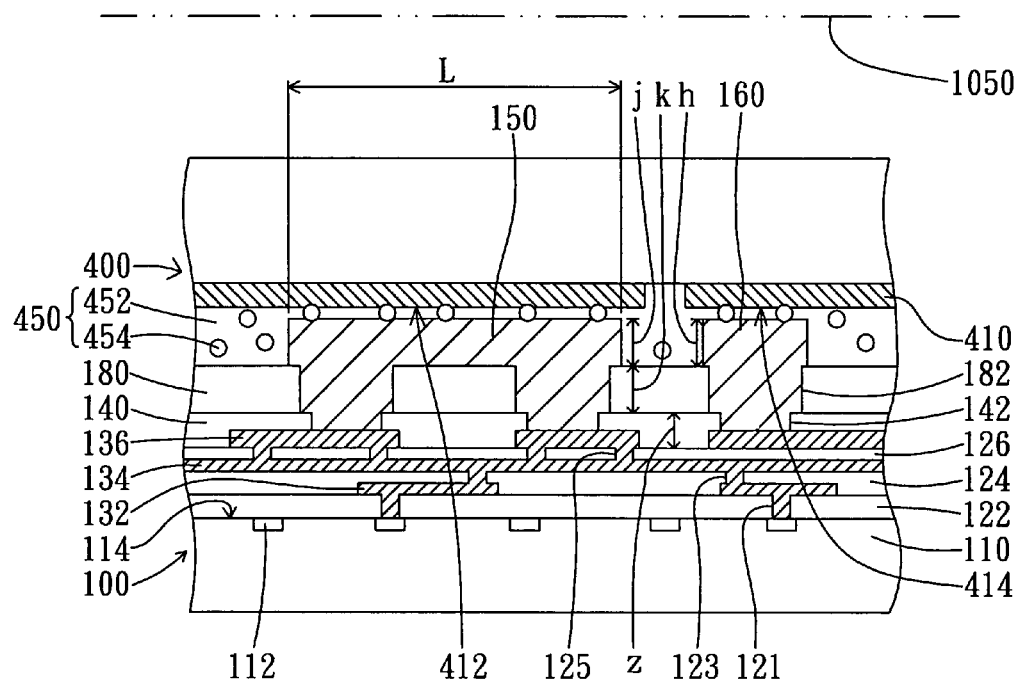

Referring to FIGS. 57 and 58, a signal may be transmitted from one of the electronic devices, such as 112a, to the thin film fine line 137, the thick metal circuit layer 150 and the circuit line 412 sequentially through the thin film fine line metal layers 132 and 134. Next, the signal may be transmitted from the thin film fine line 137, the thick metal circuit layer 150 and the circuit line 412 to the internal circuitry of the circuitry component 400. The thin film fine line 137, the thick metal circuit line 150 of the semiconductor chip 100 and the circuit line 412 of the circuitry component 400 can be used for signal transmission between the semiconductor chip 100 and the circuitry component 400.

In other application conditions, the circuitry component 400 also can transmit a signal to the circuit line 412, the thick metal circuit line 150 and the thin film fine line 137. Next, the signal can be transmitted to at least one electrical device, such as 112a, sequentially through the thin film fine line metal layers 134 and 132.

Referring to FIGS. 55-58, considering the electrical transmission of the bump 160, the semiconductor chip 100 can also transmit or receive a signal to or from the circuitry component 400 via the bump 160.

As mentioned above, the thick metal circuit line 150 of the semiconductor chip 100 and the circuit line 412 of the circuitry component 400 can be used to transmit the signal in a lateral direction and also in a vertical direction between the semiconductor chip 100 and the circuitry component 200. The thick metal circuit line 150 of the semiconductor chip 100 may have a large area connected to a large area of the circuit line 412 of the circuitry component 400, as shown in FIGS. 55-58. Optionally, the thin film fine line 137 may have a large area connected to the thick metal circuit line 150, as shown in FIGS. 57 and 58. Therefore, the above-mentioned chip package can improve its electrical performance and can reduce its noise occurrence.

3. Used for Power Bus or Plane or Ground Bus or Plane.

FIGS. 59-62 are schematic cross-section representations showing another type of chip packages according to a third embodiment. The semiconductor chip 100 in FIGS. 59-62 is similar to the semiconductor chip 100 in FIGS. 2-5; the circuitry component 400 in FIGS. 59-62 is similar to the circuitry component 400 in FIGS. 50-54. The difference is that the thick metal circuit line 150 of the semiconductor chip 100 and the circuit line 412 of the circuitry component 400 are used for power bus or plane or ground bus or plane that can provide a stable power voltage or a stable ground voltage for the semiconductor chip 100 and the circuitry component 400, such as glass substrate.

Figure 61:
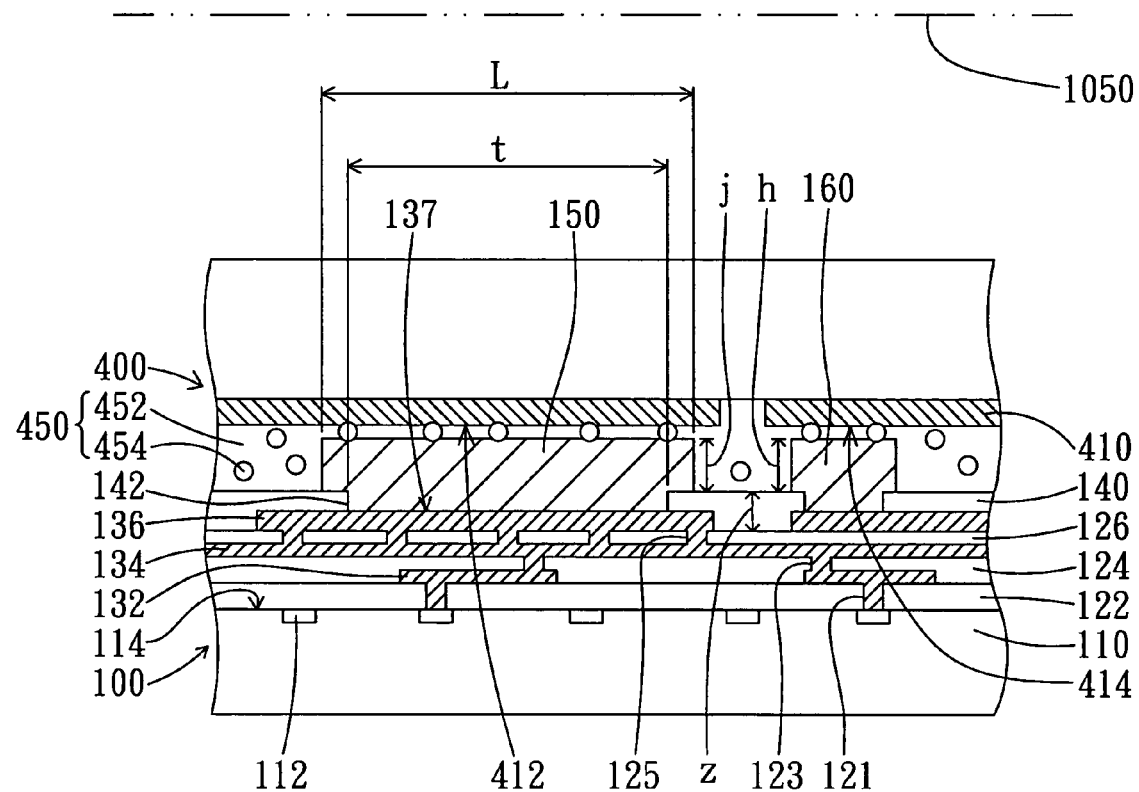
Figure 62:
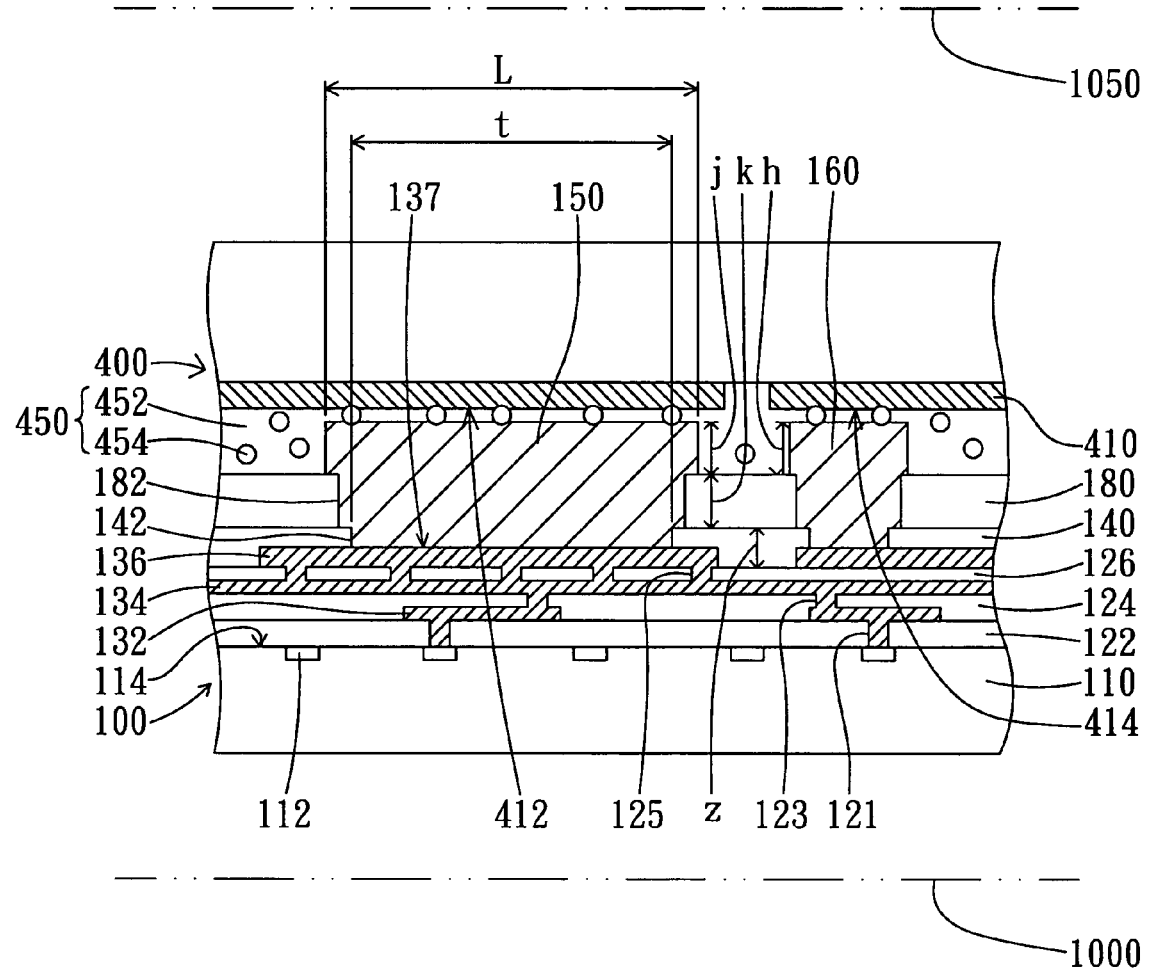

Referring to FIGS. 59-62, in the case of the thick metal circuit line 150 of the semiconductor chip 100 and the circuit line 412, such as indium tin oxide (ITO), of the circuitry component 400, such as glass substrate, serving as a power bus or plane, they can be electrically connected to a power bus or plane 135 of the thin film metal layer 134 and to a power bus or plane of the circuitry component 400. The thick metal circuit line 150 of the semiconductor chip 100 may have a large area connected to a large area of the circuit line 412 of the circuitry component 400, as shown in FIGS. 59-62. Optionally, the thin film fine line 137 may have a large area connected to the thick metal circuit line 150, as shown in FIGS. 61 and 62. Therefore, the above-mentioned chip package can provide a stable power voltage.

In another condition, the thick metal circuit line 150 of the semiconductor chip 100 and the circuit line 412 of the circuitry component 400 can be electrically connected to the power bus or plane 135 of the thin film metal layer 134, but can be disconnected from other circuitry of the circuitry component 400.

Referring to FIGS. 59-62, in the case of the thick metal circuit line 150 of the semiconductor chip 100 and the circuit line 412, such as indium tin oxide (ITO), of the circuitry component 400, such as glass substrate, serving as a ground bus or plane, they can be electrically connected to a ground bus or plane 135 of the thin film metal layer 134 and to a ground bus or plane of the circuitry component 400. The thick metal circuit line 150 of the semiconductor chip 100 may have a large area connected to a large area of the circuit line 412 of the circuitry component 400, as shown in FIGS. 59-62. Optionally, the thin film fine line 137 may have a large area connected to the thick metal circuit line 150, as shown in FIGS. 61 and 62. Therefore, the above-mentioned chip package can provide a stable ground voltage.

In another condition, the thick metal circuit line 150 of the semiconductor chip 100 and the circuit line 412 of the circuitry component 400 can be electrically connected to the ground bus or plane 135 of the thin film metal layer 134, but can be disconnected from other circuitry of the circuitry component 400.

Figure 63:
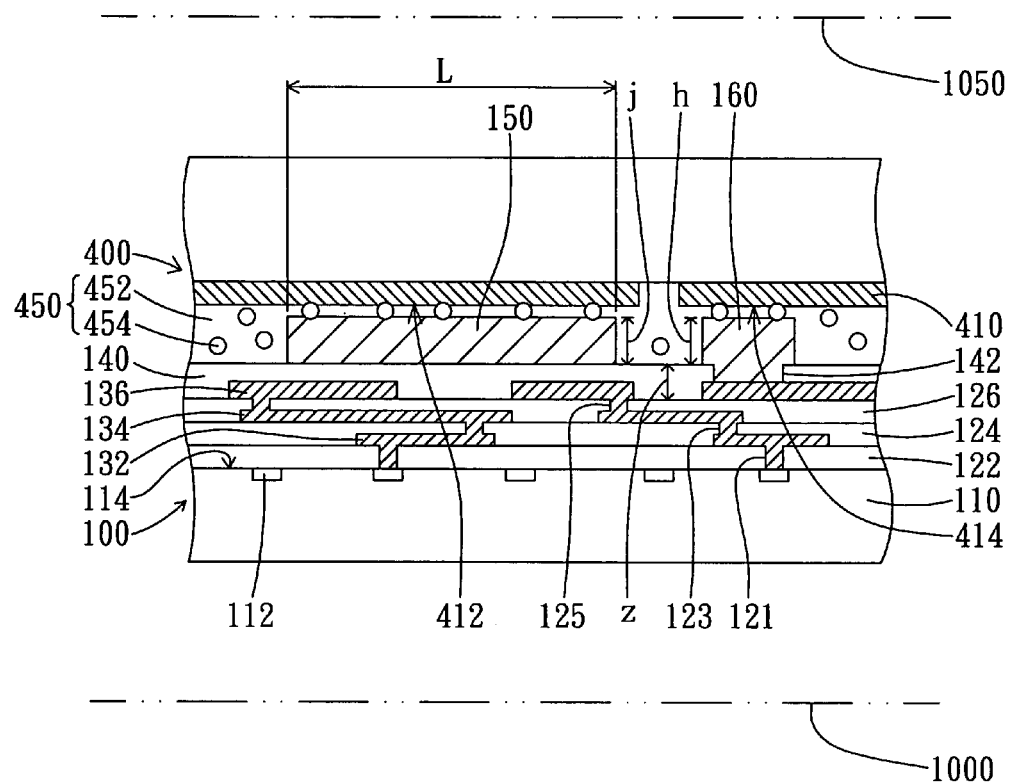
Figure 64:
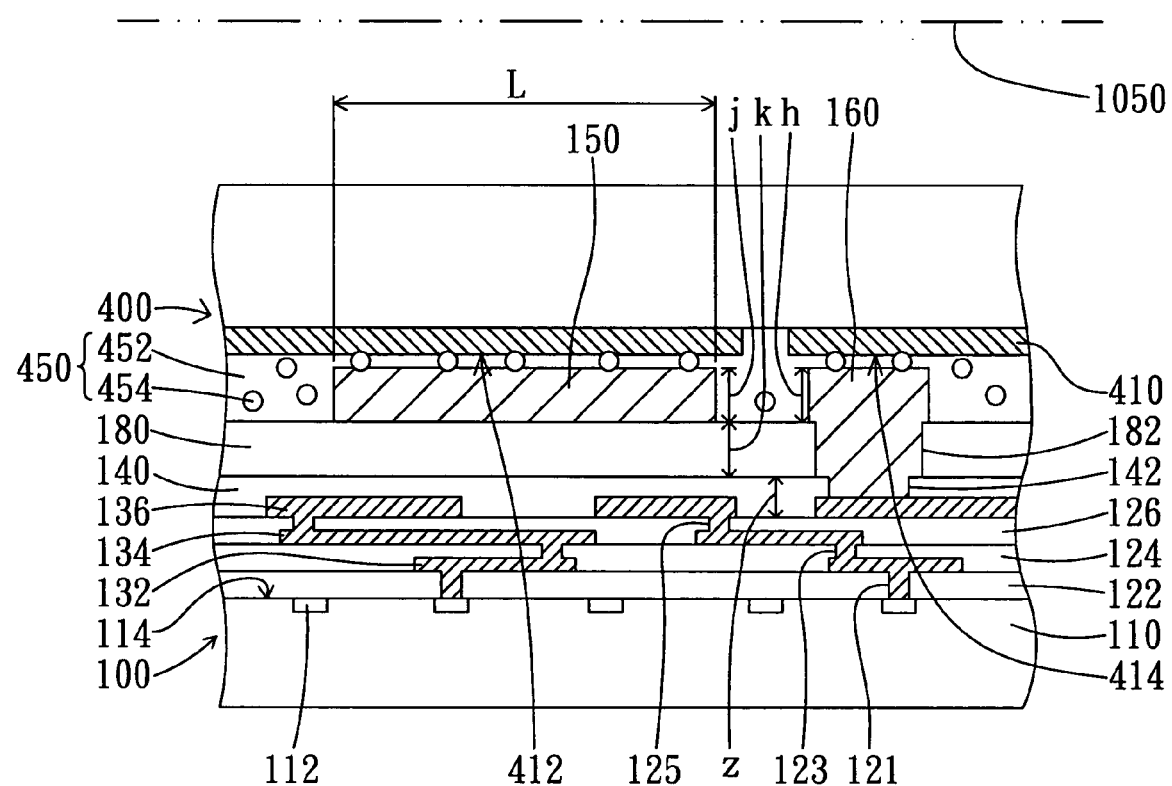

4. Used for Signal Transmission, Power Bus or Plane or Ground Bus or Plane Only for Circuitry Component FIGS. 63-64 are schematic cross-section representations showing another type of chip packages according to a third embodiment. The semiconductor chip 100 in FIGS. 63-64 is similar to the semiconductor chip 100 in FIGS. 2-3; the circuitry component 400 in FIGS. 63-64 is similar to the circuitry component 400 mentioned above. The difference is that the thick metal circuit line 150 of the semiconductor chip 100 is disconnected from the thin film fine line metal layers 132, 134, and 136. The thick metal circuit line 150 of the semiconductor chip 100 and the circuit line 412 of the circuitry component 400 are used for signal transmission, or power bus or plane or ground bus or plane only for the circuitry component 400.

Referring to FIGS. 63-64, a signal can be transmitted from a circuitry of the circuitry component 400 to the circuit line 412 and the thick metal circuit line 150 formed on the passivation layer 140. Next, the signal can be transmitted from the circuit line 412 and the thick metal circuit line 150 back to the circuitry component 400. The signal is not transmitted to the inside of the semiconductor chip 100 through the circuit line 412 of the circuitry component 400 and the thick metal circuit line 150 of the semiconductor chip 100. The thick metal circuit line 150 formed on the passivation layer 140 is disconnected from other circuitry of the semiconductor chip 100.

As mentioned above, the thick metal circuit line 150 of the semiconductor chip 100 and the circuit line 412 of the circuitry component 400 can be used for the signal transmission only for the circuitry component 400, such as glass substrate, not for the intra-chip signal transmission for the semiconductor chip 100 or for the signal transmission between the semiconductor chip 100 and the circuitry component 400. The thick metal circuit line 150 of the semiconductor chip 100 may have a large area connected to the circuit line 212 of the substrate 200, as shown in FIGS. 63 and 64. Therefore, the above-mentioned chip package can improve the electric properties of the chip package.

Alternatively, referring to FIGS. 63-64, the thick metal circuit line 150 of the semiconductor chip 100 and the circuit line 412 of the circuitry component 400 may be used for a power bus or plane that can provide a stable power voltage only for the circuitry component 400. The thick metal circuit line 150 of the semiconductor chip 100 and the circuit line 412 of the circuitry component 400 may be electrically connected to a power bus or plane of the circuitry component 400. The thick metal circuit line 150 of the semiconductor chip 100 is disconnected from the power bus or plane under the passivation layer 140. The thick metal circuit line 150 of the semiconductor chip 100 may have a large area connected to the circuit line 412 of the circuitry component 400, as shown in FIGS. 63 and 64. Therefore, the circuitry component 400, such as glass substrate, can supply more stable power voltage.

Referring to FIGS. 63-64, the thick metal circuit line 150 of the semiconductor chip 100 and the circuit line 412 of the circuitry component 400 may be used for a ground bus or plane that can provide a stable ground voltage only for the circuitry component 400. The thick metal circuit line 150 of the semiconductor chip 100 and the circuit line 412 of the circuitry component 400 may be electrically connected to a ground bus or plane of the circuitry component 400. The thick metal circuit line 150 of the semiconductor chip 100 is disconnected from the ground bus or plane under the passivation layer 140. The thick metal circuit line 150 of the semiconductor chip 100 may have a large area connected to the circuit line 412 of the circuitry component 400, as shown in FIGS. 63 and 64. Therefore, the circuitry component 400, such as glass substrate, can supply more stable ground voltage.

Conclusion

The thick metal circuit line of the semiconductor chip may have a large area connected to a large area of the circuit line of the circuitry component, such as hard substrate, flexible substrate, ceramic substrate, glass substrate, or semiconductor chip. Therefore, the electrical resistance between the thick metal circuit line of the semiconductor chip and the circuit line of the electrical circuit component can be reduced. The thick metal circuit line of the semiconductor chip and the circuit line of the circuitry component can supply more stable signal transmission, power voltage or ground voltage.

It will be apparent to those skilled in the art that various modifications and variations can be made to the structure of the present invention without departing from the scope or spirit of the invention.

What is claimed is:

1. A chip package comprising:
   a semiconductor chip comprising a silicon substrate, a transistor in or on said silicon substrate, a metallization structure over said silicon substrate, wherein said metallization structure comprises a first metal layer and a second metal layer over said first metal layer, a first dielectric layer between said first and second metal layers, and a separating layer over said silicon substrate, said metallization structure and said first dielectric layer, wherein said separating layer comprises a nitride layer having a thickness between 0.2 and 1.2 micrometers, wherein a first opening in said separating layer is over a first contact point of said metallization structure, and said first contact point is at a bottom of said first opening, and wherein a second opening in said separating layer is over a second contact point of said metallization structure, and said second contact point is at a bottom of said second opening;
   a ground interconnect on said first and second contact points and said separating layer, wherein no polymer layer is between said separating layer and said ground interconnect and under said ground interconnect, wherein said first contact point is connected to said second contact point through said ground interconnect, wherein said ground interconnect comprises a third metal layer, a copper-containing seed layer on said third metal layer, an electroplated copper layer on said copper-containing seed layer, wherein said electroplated copper layer has a thickness greater than 1 micrometer, and a tin-containing joint over said electroplated copper layer, wherein said tin-containing joint has a thickness greater than 10 micrometers; and
   a circuit component over said semiconductor chip and in contact with said ground interconnect, wherein said circuit component comprises a fourth metal layer, a fifth metal layer and a second dielectric layer between said fourth and fifth metal layers, wherein said circuit component is connected to said semiconductor chip through said ground interconnect, wherein a contact area between said circuit component and said ground interconnect is vertically over said first and second contact points.

2. The chip package of claim 1, wherein said ground interconnect further comprises a nickel-containing layer on said electroplated copper layer, wherein said tin-containing joint is further on said nickel-containing layer.

3. The chip package of claim 1, wherein said third metal layer comprises a titanium-containing layer, wherein said copper-containing seed layer is on said titanium-containing layer.

4. The chip package of claim 1, wherein said tin-containing joint comprises silver.

5. The chip package of claim 1, wherein said second metal layer comprises a layer of copper.

6. A chip package comprising:
a semiconductor chip comprising a silicon substrate, a transistor in or on said silicon substrate, a first metallization structure over said silicon substrate, wherein said first metallization structure comprises a first metal layer and a second metal layer over said first metal layer, a first dielectric layer between said first and second metal layers, and a separating layer over said silicon substrate, said first metallization structure and said first dielectric layer, wherein said separating layer comprises a nitride layer having a thickness between 0.2 and 1.2 micrometers, wherein a first opening in said separating layer is over a first contact point of said first metallization structure, and said first contact point is at a bottom of said first opening, and wherein a second opening in said separating layer is over a second contact point of said first metallization structure, and said second contact point is at a bottom of said second opening;
a second metallization structure on said first and second contact points and said separating layer, wherein no polymer layer is between said separating layer and said second metallization structure and under said second metallization structure, wherein said first contact point is connected to said second contact point through said second metallization structure, wherein said second metallization structure comprises a third metal layer, a copper-containing seed layer on said third metal layer, an electroplated copper layer on said copper-containing seed layer, wherein said electroplated copper layer has a thickness greater than 1 micrometer, and a tin-containing joint over said electroplated copper layer; and
a circuit component over said semiconductor chip and in contact with said second metallization structure, wherein said circuit component comprises a fourth metal layer, a fifth metal layer and a second dielectric layer between said fourth and fifth metal layers, wherein said circuit component is connected to said semiconductor chip through said second metallization structure, wherein a contact area between said circuit component and said second metallization structure is vertically over said first and second contact points.

7. The chip package of claim 6, wherein said third metal layer comprises a titanium-containing layer, wherein said copper-containing seed layer is on said titanium-containing layer.

8. The chip package of claim 6, wherein said tin-containing joint comprises silver.

9. The chip package of claim 6, wherein said second metal layer comprises a layer of copper.

10. The chip package of claim 6, wherein said tin-containing joint has a thickness greater than 10 micrometers.

11. The chip package of claim 6, where said second metallization structure further comprises a nickel-containing layer on said electroplated copper layer, wherein said tin-containing joint is further on said nickel-containing layer.

12. A chip package comprising:
a first semiconductor chip comprising a silicon substrate, a transistor in or on said silicon substrate, a metallization structure over said silicon substrate, wherein said metallization structure comprises a first metal layer and a second metal layer over said first metal layer, a first dielectric layer between said first and second metal layers, and a passivation layer over said silicon substrate, said metallization structure and said first dielectric layer, wherein said passivation layer comprises a nitride layer having a thickness between 0.2 and 1.2 micrometers, wherein a first opening in said passivation layer is over a first contact point of said metallization structure, and said first contact point is at a bottom of said first opening, and wherein a second opening in said passivation layer is over a second contact point of said first metallization structure, and said second contact point is at a bottom of said second opening;
a ground interconnect on said first and second contact points and said passivation layer, wherein no polymer layer is between said passivation layer and said ground interconnect and under said ground interconnect, wherein said first contact point is connected to said second contact point through said ground interconnect, wherein said ground interconnect comprises a third metal layer, a copper-containing seed layer on said third metal layer, an electroplated copper layer on said copper-containing seed layer, wherein said electroplated copper layer has a thickness greater than 1 micrometer, and a tin-containing joint over said electroplated copper layer, wherein said tin-containing joint has a thickness greater than 10 micrometers; and
a second semiconductor chip over said first semiconductor chip and in contact with said ground interconnect, wherein said second semiconductor chip comprises a fourth metal layer, a fifth metal layer and a second dielectric layer between said fourth and fifth metal layers, wherein said second semiconductor chip is connected to said first semiconductor chip through said ground interconnect, wherein a contact area between said second semiconductor chip and said ground interconnect is vertically over said first and second contact points.

13. The chip package of claim 12, wherein said ground interconnect further comprises a nickel-containing layer on said electroplated copper layer, wherein said tin- containing joint is further on said nickel-containing layer.

14. The chip package of claim 12, wherein said third metal layer comprises a titanium-containing layer, wherein said copper-containing seed layer is on said titanium-containing layer.

15. The chip package of claim 12, wherein said tin-containing joint comprises silver.

16. The chip package of claim 12, wherein said second metal layer comprises a layer of copper.

17. A chip package comprising:
a first semiconductor chip comprising a silicon substrate, a transistor in or on said silicon substrate, a first metallization structure over said silicon substrate, wherein said first metallization structure comprises a first metal layer and a second metal layer over said first metal layer, a first dielectric layer between said first and second metal layers, and a passivation layer over said silicon substrate, said first metallization structure and said first dielectric layer, wherein said passivation layer comprises a nitride layer having a thickness between 0.2 and 1.2 micrometers, wherein a first opening in said passivation layer is over a first contact point of said first metallization structure, and said first contact point is at a bottom of said first opening, and wherein a second opening in said passivation layer is over a second contact point of said first metallization structure, and said second contact point is at a bottom of said second opening;
a second metallization structure on said first and second contact points and said passivation layer, wherein no polymer layer is between said passivation layer and said second metallization structure and under said second metallization structure, wherein said first contact point is connected to said second contact point through said second metallization structure, wherein said second metallization structure comprises a third metal layer, a copper-containing seed layer on said third metal layer, an electroplated copper layer on said copper-containing seed layer, wherein said electroplated copper layer has a thickness greater than 1 micrometer, a nickel-containing layer over said electroplated copper layer, and a tin-containing joint on said nickel-containing layer, wherein said tin-containing joint has a thickness greater than 10 micrometers; and a second semiconductor chip over said first semiconductor chip and in contact with said second metallization structure, wherein said second semiconductor chip comprises a fourth metal layer, a fifth metal layer and a second dielectric layer between said fourth and fifth metal layers, wherein said second semiconductor chip is connected to said first semiconductor chip through said second metallization structure, wherein a contact area between said second semiconductor chip and said second metallization structure is vertically over said first and second contact points.

18. The chip package of claim 17, wherein said third metal layer comprises a titanium-containing layer, wherein said copper-containing seed layer is on said titanium-containing layer.

19. The chip package of claim 17, wherein said tin-containing joint comprises silver.

20. The chip package of claim 17, wherein said second metal layer comprises a layer of copper.

21. A chip package comprising:
a semiconductor chip comprising a silicon substrate, a transistor in or on said silicon substrate, a first metallization structure over said silicon substrate, wherein said first metallization structure comprises a first copper layer and a second copper layer over said first copper layer, a first dielectric layer between said first and second copper layers, wherein said first dielectric layer comprises an oxide, and a separating layer over said silicon substrate, said first metallization structure and said first dielectric layer, wherein said separating layer comprises a nitride layer, wherein a first opening in said separating layer is over a first contact point of said first metallization structure, and said first contact point is at a bottom of said first opening, and wherein a second opening in said separating layer is over a second contact point of said first metallization structure, and said second contact point is at a bottom of said second opening, wherein said first opening is between a left portion of said separating layer and a middle portion of said separating layer, and said second opening is between said middle portion and a right portion of said separating layer;

a second metallization structure on said first and second contact points and said separating layer, wherein said first contact point is connected to said second contact point through said second metallization structure, wherein said second metallization structure comprises a third metal layer over said separating layer and a third copper layer over said third metal layer, a nickel-containing layer on said third copper layer and a tin-containing joint over said nickel-containing layer; and a circuit component over said semiconductor chip and on said second metallization structure, wherein said circuit component comprises a fourth metal layer, a fifth metal layer and a second dielectric layer between said fourth and fifth metal layers, wherein said circuit component is connected to said semiconductor chip through said second metallization structure, wherein a contact area between said circuit component and said second metallization structure is vertically over said first and second contact points and said left, middle and right portions.

22. The chip package of claim 21, wherein said tin-containing joint comprises silver.

23. The chip package of claim 21, wherein said second metallization structure further comprises a copper-containing seed layer on said third metal layer, where said third copper layer is further on said copper-containing seed layer.

24. The chip package of claim 21, wherein said tin-containing joint has a thickness greater than 10 micrometers.

25. The chip package of claim 21, wherein no polymer layer is between said separating layer and said second metallization structure and under said second metallization structure.

26. The chip package of claim 21, wherein said nitride layer has a thickness between 0.2 and 1.2 micrometers.

27. The chip package of claim 21, wherein said third metal layer comprises a titanium-containing layer.

28. The chip package of claim 21, wherein said third copper layer has a thickness between 2 and 10 micrometers.

29. The chip package of claim 21, wherein said nickel-containing layer has a thickness between 1 and 5 micrometers.

* * * * *